United States Patent
Martin

(10) Patent No.: US 7,755,360 B1
(45) Date of Patent: Jul. 13, 2010

(54) PORTABLE LOCATOR SYSTEM WITH JAMMING REDUCTION

(75) Inventor: Michael J. Martin, San Diego, CA (US)

(73) Assignee: Seektech, Inc., San Diego, CA (US)

( * ) Notice: Subject to any disclaimer, the term of this patent is extended or adjusted under 35 U.S.C. 154(b) by 263 days.

(21) Appl. No.: 12/106,976

(22) Filed: Apr. 21, 2008

Related U.S. Application Data

(63) Continuation of application No. 11/551,651, filed on Oct. 20, 2006, now abandoned.

(60) Provisional application No. 60/730,124, filed on Oct. 24, 2005.

(51) Int. Cl.
*G01R 19/00* (2006.01)
*G01V 3/08* (2006.01)
*G01V 3/10* (2006.01)

(52) U.S. Cl. .......................... 324/326; 324/67; 324/329

(58) Field of Classification Search .................. 324/67, 324/326–329; 702/75, 109, 191; 342/22, 342/459
See application file for complete search history.

(56) References Cited

U.S. PATENT DOCUMENTS

| | | |
|---|---|---|
| 3,299,351 A | 1/1967 | Williams |
| 3,991,363 A | 11/1976 | Lathrop .................... 324/52 |
| 4,039,938 A | 8/1977 | Link ........................ 324/52 |
| 4,118,662 A | 10/1978 | Weber ........................ 324/3 |
| 4,438,389 A | 3/1984 | De Sa ........................ 324/52 |
| 4,686,454 A | 8/1987 | Pecukonis .................. 324/67 |
| 4,896,117 A | 1/1990 | Flowerdew et al. ......... 324/520 |
| 4,967,199 A | 10/1990 | Gunton et al. .............. 342/22 |
| 5,210,497 A | 5/1993 | Regini ...................... 324/521 |
| 5,352,984 A | 10/1994 | Piesinger .................. 324/532 |
| 5,369,366 A | 11/1994 | Piesinger .................. 324/533 |
| 5,430,379 A | 7/1995 | Parkinson et al. .......... 324/329 |
| 5,714,885 A | 2/1998 | Lulham ..................... 524/529 |
| 5,844,405 A | 12/1998 | Eslambolchi et al. ........ 324/67 |
| 6,388,575 B1 | 5/2002 | Galloway ................. 340/572.1 |
| 6,388,629 B1 | 5/2002 | Albats, Jr. et al. .......... 343/757 |
| 6,559,651 B1 | 5/2003 | Crick ....................... 324/522 |
| 7,042,223 B2 | 5/2006 | Cull ........................ 324/326 |
| 7,042,385 B1 | 5/2006 | Wichmann .................. 342/22 |

*Primary Examiner*—Kenneth J Whittington
(74) *Attorney, Agent, or Firm*—Michael H. Jester

(57) ABSTRACT

A portable self-standing electromagnetic (EM) field sensing locator system with attachments for finding and mapping buried objects such as utilities and with intuitive graphical user interface (GUI) displays. Accessories include a ground penetrating radar (GPR) system with a rotating Tx/Rx antenna assembly, a leak detection system, a multi-probe voltage mapping system, a man-portable laser-range finder system with embedded dipole beacon and other detachable accessory sensor systems are accepted for attachment to the locator system for simultaneous operation in cooperation with the basic locator system. The integration of the locator system with one or more additional devices, such as fault-finding, geophones and conductance sensors, facilitates the rapid detection and localization of many different types of buried objects.

4 Claims, 70 Drawing Sheets

1020 = 17th Harmonic of 60Hz

■ Initialization

Unmodulated, sampled waveforms

```
unmodulated = Block[{ϕrandom = Random[Real, {-π, π}]}, Table[{t, Exp[i (2π 32768/73245 t - ϕrandom)]}, {t, 2^10}]];
Dimensions[unmodulated]
{1024, 2}

MultipleListPlot[{Re[Last[#]], Im[Last[#]]} & /@ unmodulated, PlotJoined → True, AspectRatio → 1];
```

Basic modulation functions

■ An interesting series of functions

{# of cycles total, # of cycles positive phase, # of cycles negative phase}; half a phase blank between sub-sequences Table[{2, 1, 0}+n {4, 3, 1}, {n, 10}]

{{6, 4, 1}, {10, 7, 2}, {14, 10, 3}, {18, 13, 4}, {22, 16, 5}, {26, 19, 6}, {30, 22, 7}, {34, 25, 8}, {38, 28, 9}, {42, 31, 10}} modseq = Function[{seq}, Piecewise[{{Last[#], (First[#] < Mod[t, First[seq]] < Last[#]) &[First[#]]} &/@Rest[seq]]]
Function[{seq}, Piecewise[{{Last[#], (First[#] < Mod[t, First[seq]] < Last[#]) &[First[#]]} &) /@Rest[seq]]]

pwseq = Function[{seq}, Piecewise[{{Last[#] Sin[2 π t], (First[#] < Mod[t, First[seq]] < Last[#]) &[First[#]]} &/@Rest[seq]]]
Function[{seq}, Piecewise[{{Last[#] Sin[2 π t], (First[#] < Mod[t, First[seq]] < Last[#]) &[First[#]]} &) /@Rest[seq]]]

pwexpseq = Function[{seq}, Piecewise[{{Last[#] Exp[2 π i t], (First[#] < Mod[t, First[seq]] < Last[#]) &[First[#]]} &/@Rest[seq]]]
Function[{seq}, Piecewise[{{Last[#] $e^{2\pi i t}$, (First[#] < Mod[t, First[seq]] < Last[#]) &[First[#]]} &) /@Rest[seq]]]

{#[[1,-1]]Exp[
$2\pi i$ Mod[#[[1,-1]].#[[1,
1,-1]].First[seq]].#[[1,
1,-1]]≤
Mod[t,First[seq]]≤#[[-1,1,
1]],&/@
Transpose[{Rest[seq],Append[Rest[seq]],{{First[seq],0},0}]}]

*FIG. 18C*

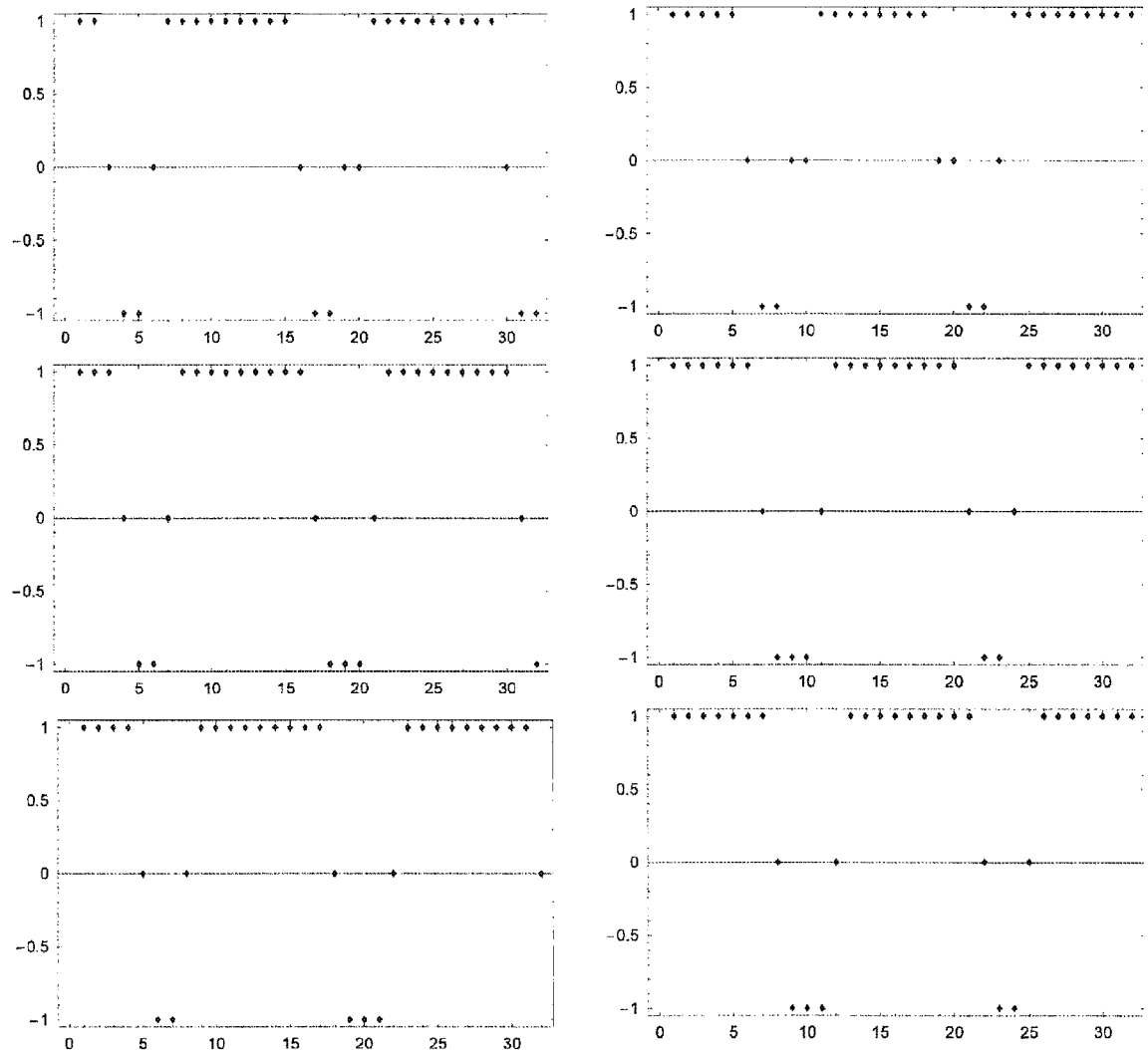
FIG. 18D (Con't)

```
modulatedseqs = MapThread[{First[#1], Last[#1] Last[#2]} &, {unmodulated, #}] & /@ modulations;
Dimensions[modulatedseqs]
```

{12, 1024, 2}

```
MultipleListPlot[{{First[#], Re[Last[#]]} & /@ #, {First[#], Im[Last[#]]} & /@ #} &[Take[#, 32]],
    PlotJoined → True, PlotStyle → {{}, {Hue[0]}}, SymbolStyle → {{}, {Hue[0]}}] & /@ modulatedseqs;
```

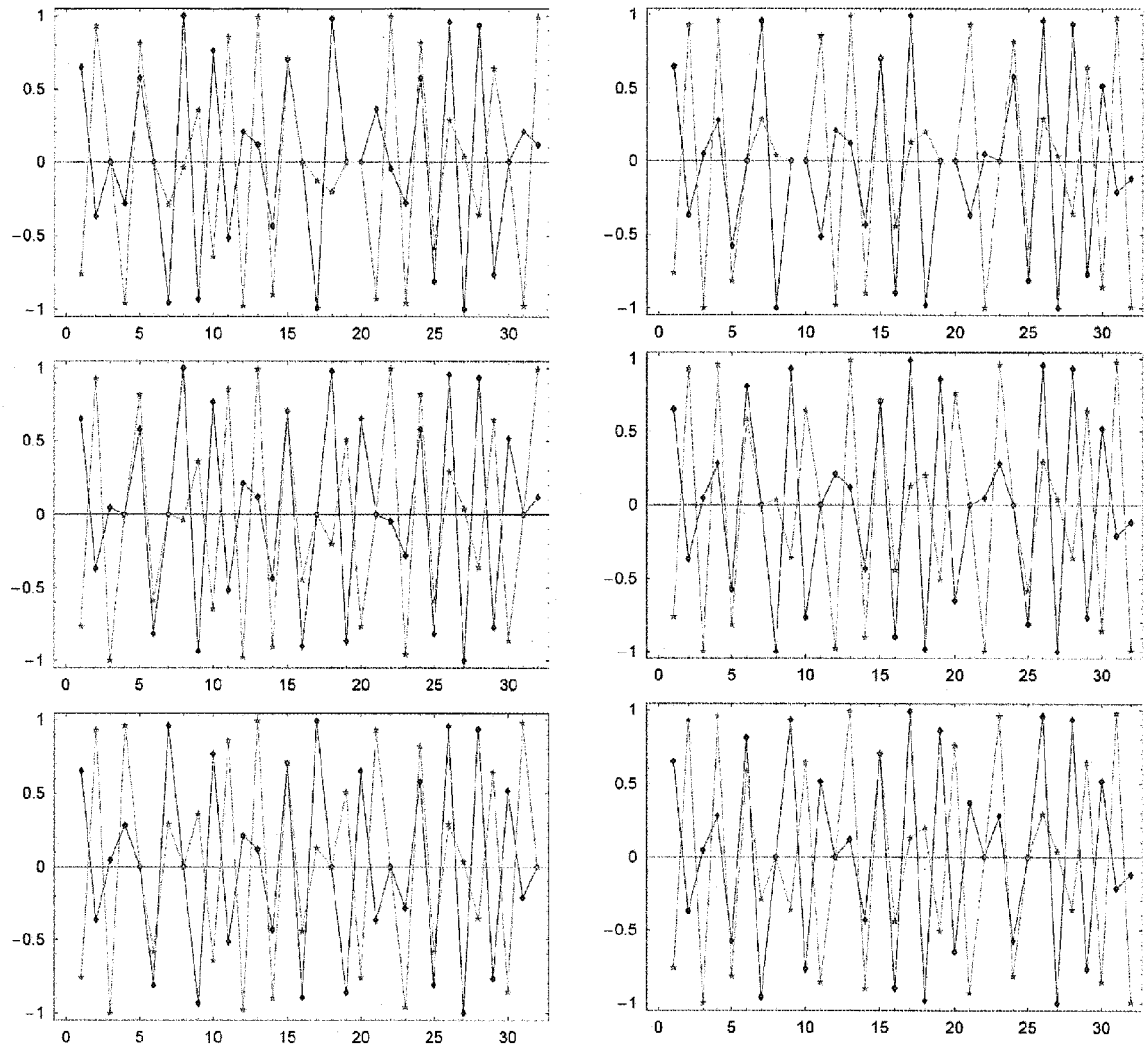
FIG. 18E (Con't)

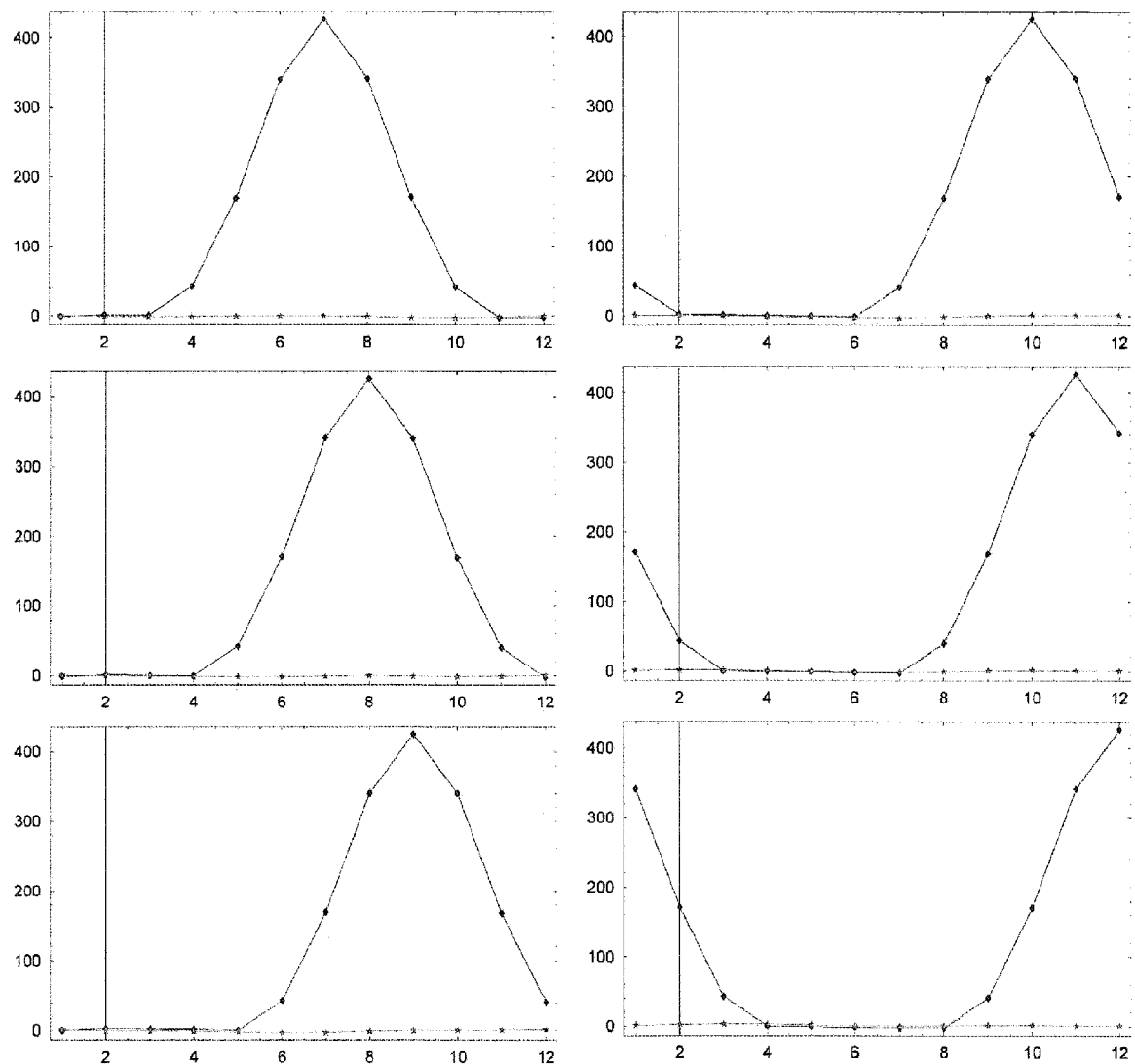
FIG. 18F (Con't)

1020 = 17th Harmonic of 60Hz $$\text{Distortion} \equiv \frac{(|\Phi top - \Phi bottom|)}{\alpha} + \frac{(|\theta top - \theta bottom|)}{\beta} + (\text{threshold} - \text{distance})\text{x}\lambda$$

```
For(i = 1: density)
    Xpoint[i] = Randomnumbers[i]%(radius/i) + Xcenter
    Ypoint[i] = Randomnumbers[i]%(radius/i) + Ycenter
End
```

PORTABLE LOCATOR SYSTEM WITH JAMMING REDUCTION

CROSS-REFERENCES TO RELATED APPLICATIONS

This application is a continuation of U.S. patent application Ser. No. 11/551,651, which was filed Oct. 20, 2006, and which is pending as of the filing of this application.

This application claims priority benefit under 35 U.S.C. §119(e) and §120 of the filing date of provisional Patent Application No. 60/730,124 filed on Oct. 24, 2005 of Mark S. Olsson et al. entitled "Self-Standing Mapping Sonde and Line Locator Employing Improved Display Methods with Integral Ground-Penetrating Radar and Other Detachable Detection Apparatus." The entire disclosure of said provisional application is hereby incorporated by reference.

This application is related by common inventorship and subject matter to the commonly-assigned patent application Ser. No. 10/268,641, which was filed on Apr. 15, 2004 and published on Apr. 15, 2004 as U.S. Patent Application No. 2004/0070399A1 entitled "Omnidirectional sonde and line locator," and the commonly-assigned patent application Ser. No. 10/308,752, which was filed on Dec. 3, 2002 and published on Apr. 15, 2004 as U.S. Patent Application No. 2004/0070525 A1 entitled "Single and Multi-Trace Omnidirectional sonde and Line Locators and Transmitter Used Therewith," both of which are entirely incorporated herein by this reference.

This application is also related by common inventorship and subject matter to the commonly-assigned patent application Ser. No. 10/956,328 filed on Oct. 1, 2004, the commonly-assigned patent application Ser. No. 11/054,776 filed on Feb. 9, 2005, the commonly-assigned patent application Ser. No. 11/106,894 filed on Apr. 15, 2005, the commonly-assigned patent application Ser. No. 11/184,456 filed on Jul. 19, 2005 entitled "A Compact Self-Tuned Electrical Resonator for Buried Object Locator Applications," and the commonly-assigned patent application Ser. No. 11/248,539 filed on Oct. 13, 2005 entitled "A Reconfigurable Portable Locator Employing Multiple Sensor Arrays Having Flexible Nested Orthogonal Antennas," all of which are entirely incorporated herein by this reference.

BACKGROUND

1. Field of the Invention

This invention relates generally to electronic systems and methods for locating buried or otherwise inaccessible pipes and other conduits, cables, conductors and inserted transmitters, and more specifically to sonde and line locators for detecting an electromagnetic signal emissions.

2. Description of the Related Art

There are many situations where is it desirable to locate buried utilities such as pipes and cables. For example, prior to starting any new construction that involves excavation, it is important to locate existing underground utilities such as underground power lines, gas lines, phone lines, fiber optic cable conduits, CATV cables, sprinkler control wiring, water pipes, sewer pipes, etc., collectively and individually referred to hereinafter as "utilities" or "objects." As used herein the term "buried" refers not only to objects below the surface of the ground, but in addition, to objects located inside walls, between floors in multi-story buildings or cast into concrete slabs, etc. If a backhoe or other excavation equipment hits a high voltage line or a gas line, serious injury and property damage may result. Severing water mains and sewer lines leads to messy cleanups. The destruction of power and data cables can seriously disrupt the comfort and convenience of residents and cost businesses huge financial losses.

Buried objects can be located by sensing an electromagnetic signal emitted by the same. Some cables such as power lines are already energized and emit their own long cylindrical electromagnetic field. Location of other conductive lines necessitates their energizing with an outside electrical source having a frequency typically in a range of approximately 50 Hz to 500 kHz. Location of buried long conductors is often referred to as "line tracing."

A sonde (also called a transmitter, beacon or duct probe) typically includes a coil of wire wrapped around a ferromagnetic core. The coil is energized with a standard electrical source at a desired frequency, typically in a range of approximately 50 Hz to 500 kHz. The sonde may be attached to a push cable or line or it may be self-contained so that it can be flushed through a conduit. A sonde generates a more complex electromagnetic field than that produced by an energized line. However, a sonde can be localized to a single point. A typical low frequency sonde does not strongly couple to other objects and is thereby unlikely to produce complex interfering fields that may occur during the tracing. The term "buried objects" as used herein also includes sondes and buried locatable markers such as marker balls.

Besides locating buried objects before excavation, it is further desirable to determine the depth of the objects. This is generally done by measuring the difference in field strength at two locations.

Ground penetrating radar (GPR) may be used to locate non-conductive object underground. Using GPR in association with accurate positional information provided by a mapping locating instrument can provide additional functionality as measurements from multiple known positions may be compared and analyzed to form an image of underground structures.

As may be appreciated from the above discussion, both arts are replete with suggested methods and systems for improving buried object and utility locator operation. In fact, there are several different fundamental physical approaches to the problems, each of which has strengths and weaknesses in different situations. The introduction of inexpensive processing power and complex software systems has made it possible for the first time to improve locator performance using a graphical user interface (GUI) to present data obtained from a plurality of sensors, as disclosed in the above-cited patent applications incorporated herein by reference. Portable locators that heretofore have been developed offer limited functionality insufficient for quickly and accurately locating buried utilities. There is still a clearly-felt need in the art for a portable locator system that can operate in any of several different operatorselectable realms, such as the acoustic, electromagnetic and optical realms, to permit effective buried object location under a wide range of circumstances without obliging the operator to maintain and transport numbers of different systems and apparatus. These unresolved problems and deficiencies are clearly felt in the art and are solved by this invention in the manner described below.

SUMMARY

Many of the above problems are resolved by this invention, which introduces a portable locator having at least three support structures that allow the portable locator to be selfsupporting and free standing. Each support structure includes a near ground antenna array enclosure that includes a plurality of antenna elements together capable of sensing three orthogonal magnetic field components. The self-standing locator embodiment includes a number of advantageous features and aspects.

The portable locator embodiment also preferably includes an electro-mechanical accessory mounting interface adapted to electromechanically accept any of a plurality of various accessories for removable fixation to the portable locator at or above the ground surface proximate the supporting structures. According to one embodiment, a three-axis accelerometer is included. In another embodiment, an electronic compass is included.

The attached accessories include a described Ground Penetrating Radar (GPR) device disclosed herein that may include a spinning antenna whose axis of spin is approximately vertical, where each transmit pulse can be associated with a particular angular position of the rotating antenna. In one embodiment, a GPR device is revealed where the round trip travel time of reflected pulses from any targets away from the spinning antenna axis varies as a function of rotational position of the spinning antenna. The frequency of the reflected pulses from any targets away from the spinning antenna axis varies as a function of rotational position of the spinning antenna due to Doppler shift.

According to another embodiment, the attached accessory is a Buried Electronic Marker exciter, which transmits a signal to which buried markers may respond, which response is read by the locator to identify the marker and any information embedded in it. Where reference is made herein to a dipole transmitter used as a beacon for location mapping, such a transmitter may be a simple dipole coil such as is commonly found in battery-operated sondes, which emits a dipole field sensible to the appropriately equipped locator at some known frequency such as 512 Hz. When used as a beacon, such a dipole transmitter is typically embedded in a stand, or in the structure of some device, placed in a fixed position and used to navigate or measure distances and bearings thereto. Such a beacon serves as a reference point in computing locations, relative coordinates, distances and similar mapping calculations and may be powered by a battery or other useful means.

According to another embodiment, the attached accessory includes electrical connections to two or more electrodes that can be placed into the ground for sensing earth voltages due to electrical cable faults. In another aspect, such electrodes may be used for measuring soil conductance between the electrodes and for mapping where the soil conductance over a region can be mapped.

According to another embodiment, the attached accessory includes one or more acoustic sensors that can be coupled to the ground, and, in one configuration, a separately moveable acoustic transmitter that has an attached magnetic dipole transmitter, the position of which can be tracked by the portable mapping locator.

In another embodiment, a method of acoustically mapping a subsurface region is provided, where the mapping locator tracks a dipole transmitter attached to an acoustic transmitter while employing acoustic sensors in a known positional relationship to the acoustic transmitter.

According to another embodiment, the aforementioned method is applied while employing acoustic sensors in a known positional relationship to the acoustic transmitter; and where a transmitted sound pulse can be timed from modulation of the dipole transmitter signal to establish an acoustic pulse starting time at the portable locator.

In another configuration a transmitted sound pulse can be timed with wireless communication means to establish an acoustic pulse starting time at the portable locator. Similarly, a transmitted sound pulse can be timed with one or more microphones on the mapping locator to detect the air-coupled transmitted sound pulse; such means to establish an acoustic pulse starting time at the portable locator.

According to another embodiment, the attached accessory includes one or more capacitive sensors that can be coupled to the ground. Because capacitance is a function inversely proportional to distance between two capacitive plates, the accessory enables high resolution distance detection to near objects underground where precision depth may be of interest. In such an application, the object of interest acts as the second plate of a capacitive circuit.

According to another embodiment, the attached accessory includes a laser rangefinder to measure the distance to some point in a fixed relationship to the portable locator or, in another aspect, to measure distances over a region adjacent to the portable locator.

According to another embodiment, laser target devices may be used in combination with one or more laser rangefinders and one or more locators to measure distances directly or indirectly over terrain.

Alternatively, the attached accessory may include a plurality of any of the accessory sensor systems herein described.

According to another aspect, a laser range finder can be operated separately from the locator and can be identified and mapped by the locator through means of at least one dipole transmitter, which may be phase-encoded, embedded into the laser range finder or attached to either side of the laser range finder.

According to another embodiment the laser range finder dipole axis is concentric with the laser beam axis of the range finder and the dipole center is coincident with the point of exit of the laser beam from the range finder.

According to another embodiment, any of the features or functionality of an attached accessory may be fixedly built into the portable locate and not be an accessory item.

According to another embodiment, the relative phase of an alternating magnetic signal is determined by removing full or fractional (e.g., one-half) cycles from the transmitted signal in a predetermined manner.

According to another embodiment, the relative phase of an alternating magnetic signal is displayed on the screen of a portable locator by showing motion on the display in one direction or the opposite direction.

According to another embodiment, the portable locator may be left in a free standing unmoving fixed position, to process signal data for a long period of time to narrow the bandpass of the employed digital filters to improve maximum detection range or signal to noise ratio.

According to another embodiment, the method is disclosed of shifting the center frequency of a digital filter away from a near interfering frequency or harmonic, either measured or based on prediction, to reduce interference.

According to another embodiment, a locator using some function based upon the differences between the respective azimuthal and polar angles of a detected field measured at two locations can modify a displayed line(indicating the buried utility orientation) such as by dithering or blurring the displayed line to indicate hidden utility location uncertainty due to field distortion causing an imperfect cylindrical field.

According to another embodiment, a method is disclosed of using the motion of a small hand held dipole transmitter as a means to sketch information onto the display screen of the mapping locator.

According to another embodiment, based upon available information, a locator is capable of providing the operator with information posted to the locator screen if the accuracy of the locate falls within or outside of acceptable confidence limits.

According to another embodiment, the locator and its accessories are linked by wireless data links.

According to another embodiment, a display device with independent computational capability such as a laptop receives information from one of more locators or auxiliary devices and is capable of assembling a display in layers in which maps of different kinds of detections (for example, sonic detections, laser ranging, and EMF field measurements) can be geo-coordinated, displayed as separate layers of an integrated display, selectively displayed and otherwise manipulated to enhance operator understanding of the relationships between detected objects.

According to another embodiment a sonde or dipole antenna is used in combination with a laser range finder to enable a mapping locator to detect the location of the range finder.

According to another embodiment a separate laser range finder is combined with a dipole beacon so that a locator can track a position relative to a coordinate system of the locator.

The foregoing, together with other objects, features and advantages of this invention, can be better appreciated with reference to the following specification, claims and the accompanying drawing.

BRIEF DESCRIPTION OF THE DRAWINGS

For a more complete understanding of this invention, reference is now made to the following detailed description of the embodiments as illustrated in the accompanying drawing, in which like reference designations represent like features throughout the several views and wherein:

FIGS. 18A-18F are schematic diagrams illustrating a cycle-skipping method embodiment for encoding and transmitting relative phase information;

DETAILED DESCRIPTION OF THE EMBODIMENTS

The Accessory Mounting Interface (AMI)

Figure 1:
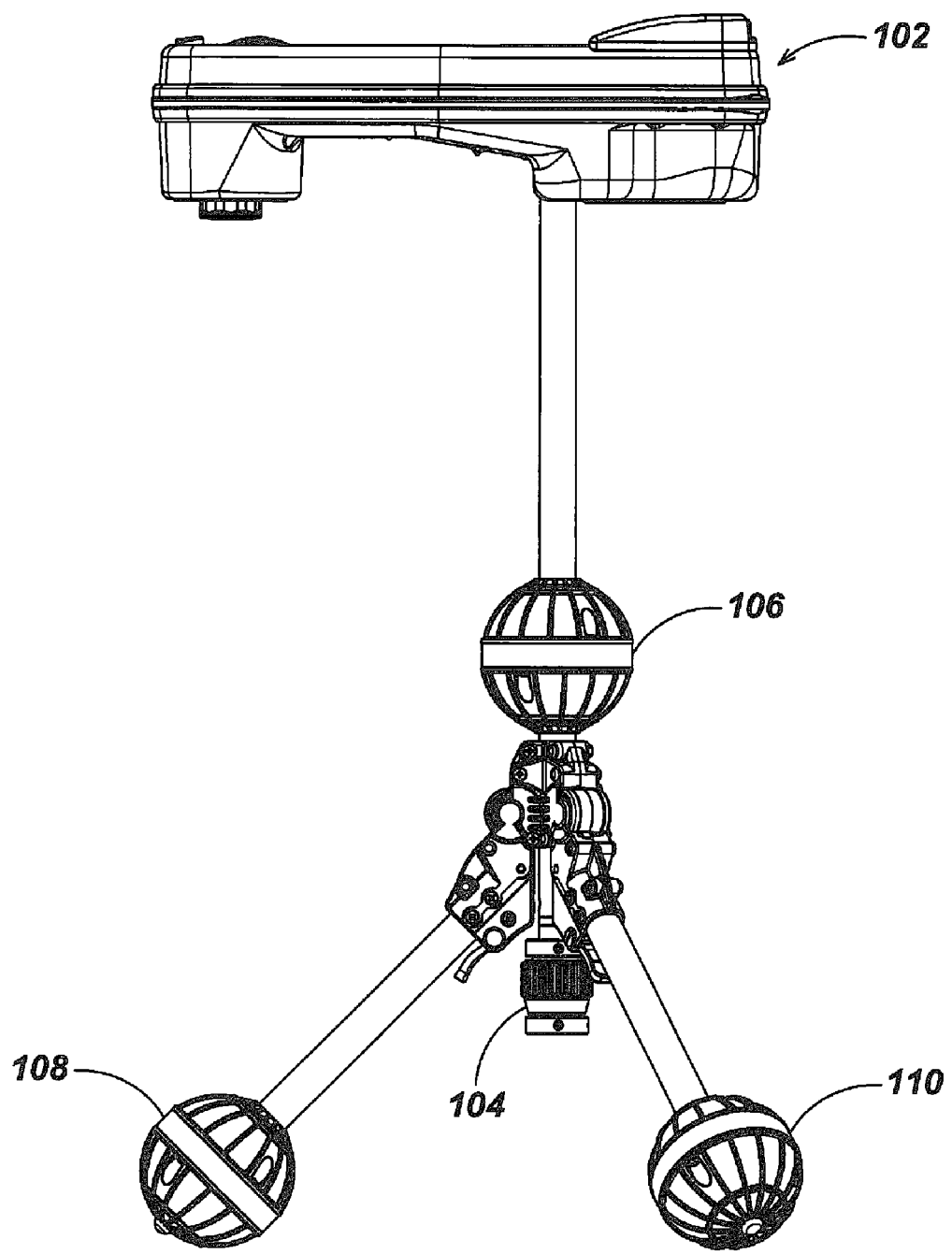
FIG. 1 is a side view of an exemplary self-standing tripod locator system embodiment in an open disposition for operation.

FIG. 1 illustrates a side view of an exemplary embodiment of the self-standing tripod locator. According to an embodiment, arrays of magnetic sensors responsive to DC magnetic fields and capable of sensing three orthogonal magnetic field components are included inside one or more antenna enclosures. According to another embodiment, a three-axis accelerometer is included, or according to another embodiment, an electronic compass in included. In one configuration, a compass and accelerometer on a single integrated circuit such as the AMI-601 available from the Aichi Micro Intelligent Corporation, may be embedded within one of the antenna nodes 106, for example. According to one embodiment, a portable locator includes at least three support structures (see FIG. 3) that allow the portable locator to be self supporting and free standing. Each support structure includes a near ground antenna array that includes an enclosure with a plurality of antenna elements (not shown) capable of sensing three orthogonal magnetic field components. An electro-mechanical accessory mounting interface is provided to allow various accessory attachments to be mounted to the portable locator at or above the grounds surface near the supporting structures. In particular, FIG. 1 shows the accessory mounting interface 104 beneath the tripod junction of locator embodiment. An omnidirectional antenna node (also herein denominated antenna array) within a casing 106 is located above the accessory mounting interface 104, and similar antenna nodes of which two (108, 110) are shown are located at the end of the support structures. In one embodiment, a DC magnetometer array of at least one axis sensitivity is provided in one lower node, e.g., 110. In another embodiment, a magnetometer array is situated within each antenna node (106, 108, 110). The magnetometers may include 3-axis DC sensors. In an alternate embodiment, at least one of the magnetometer arrays is combined with a 3-axis accelerometer and compass capability such as, for example, is provided by any suitable complementary-metal-oxide-semiconductor (CMOS) integrated circuit (IC) device, such as the AMI-601 available from the Aichi Micro Intelligent Corporation. In this embodiment, the locator is provided with compass bearing, accelerometer motion and attitude track information, and magnetometric data from the composite device. Such a device may be mounted centrally, or within one or more of the antenna nodes or elsewhere within the structure of the locator. As described in one or more of the commonly-assigned patent references cited above and fully incorporated herein, one or more of the antenna nodes 106, 108, 110, 112 preferably includes an electromagnetic (EM) sensor array having three substantially-identical EM field sensors each having at least one conductive coil coupled between two terminals disposed on a flexible annular wall having a radial centroid defining a sensing axis, and a structure for supporting the three substantially-identical EM field sensors such that the corresponding sensing axes are disposed in substantial mutual orthogonality and the corresponding conductive coils are disposed in substantial concentricity.

Accessory mounting interface 104 provides a rotationally-indexed physical mounting point and an electrical interface to physically accept any of several attachable accessories and to electrically couple thereto for supplying power and exchanging data and control signals. An accessory may be simply passive to provide, for example, a variable resistance to the electronic circuits within the locator housing or a sophisticated stand-alone system with integral data gathering and processing subsystems. When the accessory interface is not in use, a protective cover is preferably installed. Suitable data interfaces include USB 2.0 or IEEE 1394.

Figure 2:
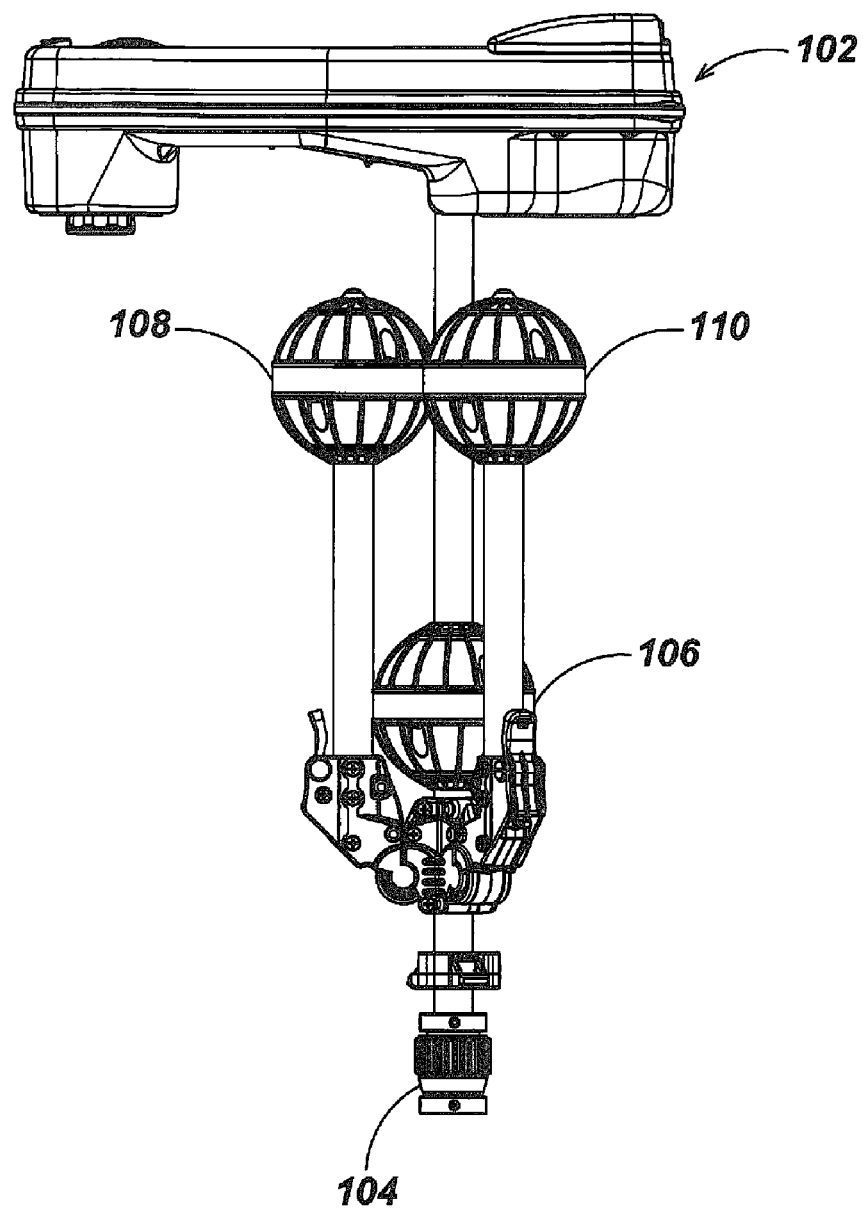
FIG. 2 is a side view of the locator from FIG. 1 in a folded storage disposition for storage.

FIG. 2 illustrates a side view of the locator 102 from FIG. 1 in a folded storage disposition for storage or transport, showing the accessory mounting interface 104 and antenna nodes 106, 108, 110.

Figure 3:
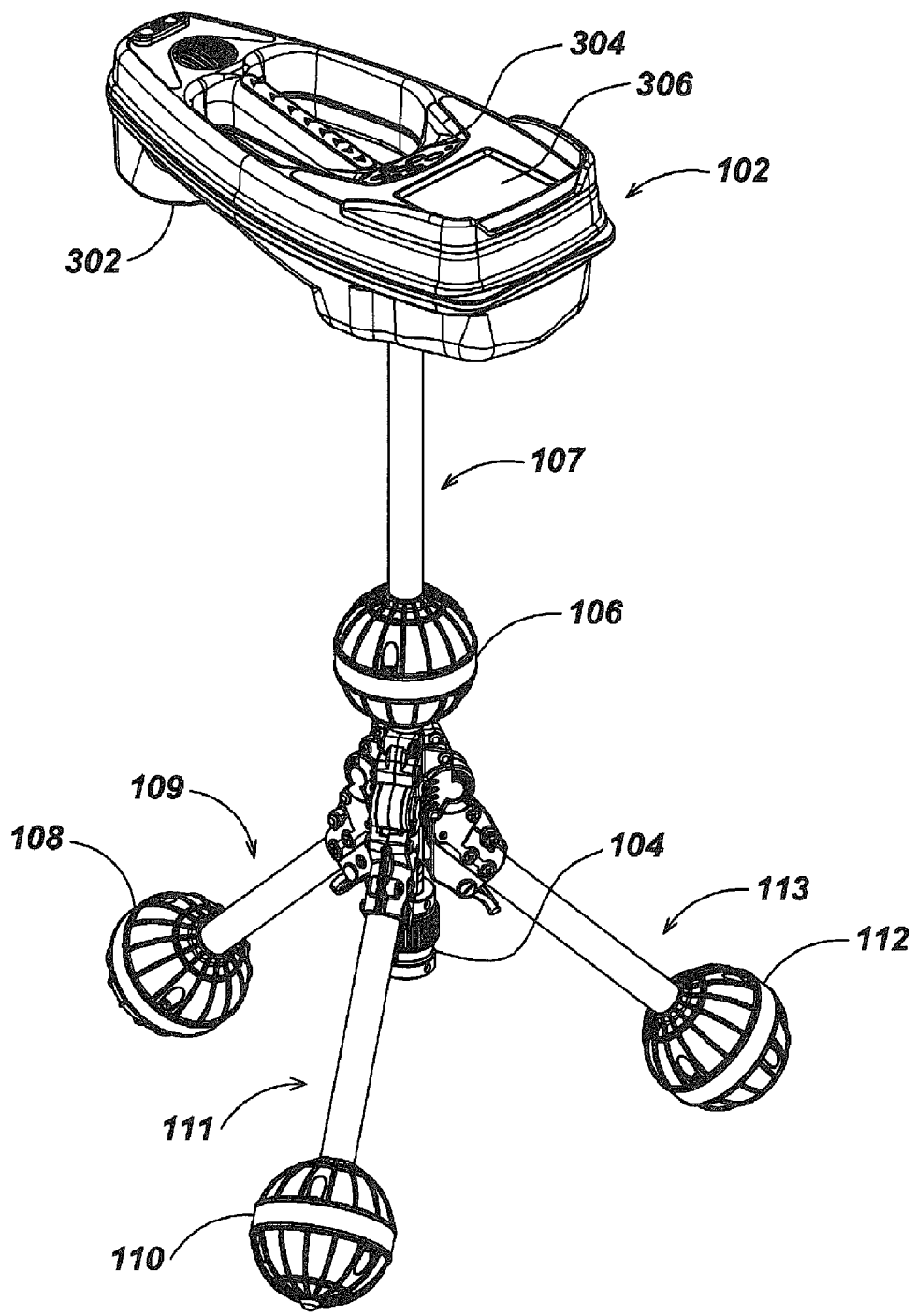
FIG. 3 is a top isometric view of the locator from FIG. 1 in an open disposition for operation.

FIG. 3 illustrates a top isometric view of the locator 102 from FIG. 1, showing the user display 306, keypad 304 and battery compartment 302, as well as the four antenna nodes (106, 108, 110, 112). As described in one or more of the commonly-assigned patent references cited above and fully incorporated herein, the antenna nodes 108, 110 and 112 are each preferably disposed at the end of a corresponding foldable support element (109, 111 and 113), each of which includes a hinge structure adapted to fold the corresponding support elements 109, 111 and 113 with antenna nodes 108, 110 and 112 against the main locator system support 107 for storage (FIG. 2) and to fold the corresponding support elements 109, 111 and 113 with antenna nodes 108, 110 and 112 into a level tripod arrangement illustrated in FIGS. 1 and 3, for example.

Figure 4:
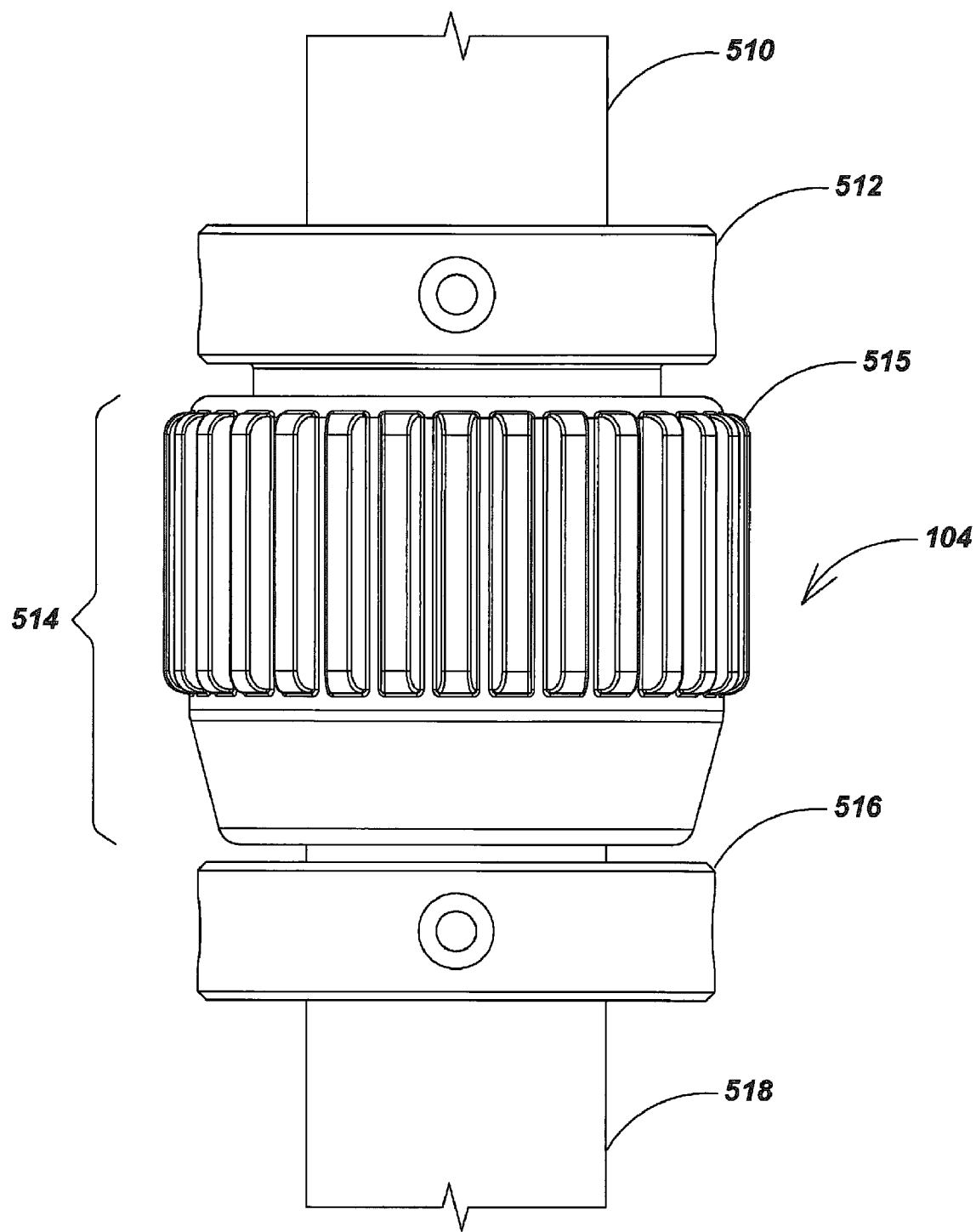
FIG. 4 is a front detailed exterior view of the accessory mounting interface.

FIG. 4 illustrates an exterior front view of the accessory mounting interface 104 showing the upper threaded assembly 512 around the central shaft 510, a threaded collar 514 covered by an external gripping surface 515, a lower collar 516 and a lower shaft section 518 that is accepted by accessory mounting interface 104 from an attachment (not shown).

Figure 5A:
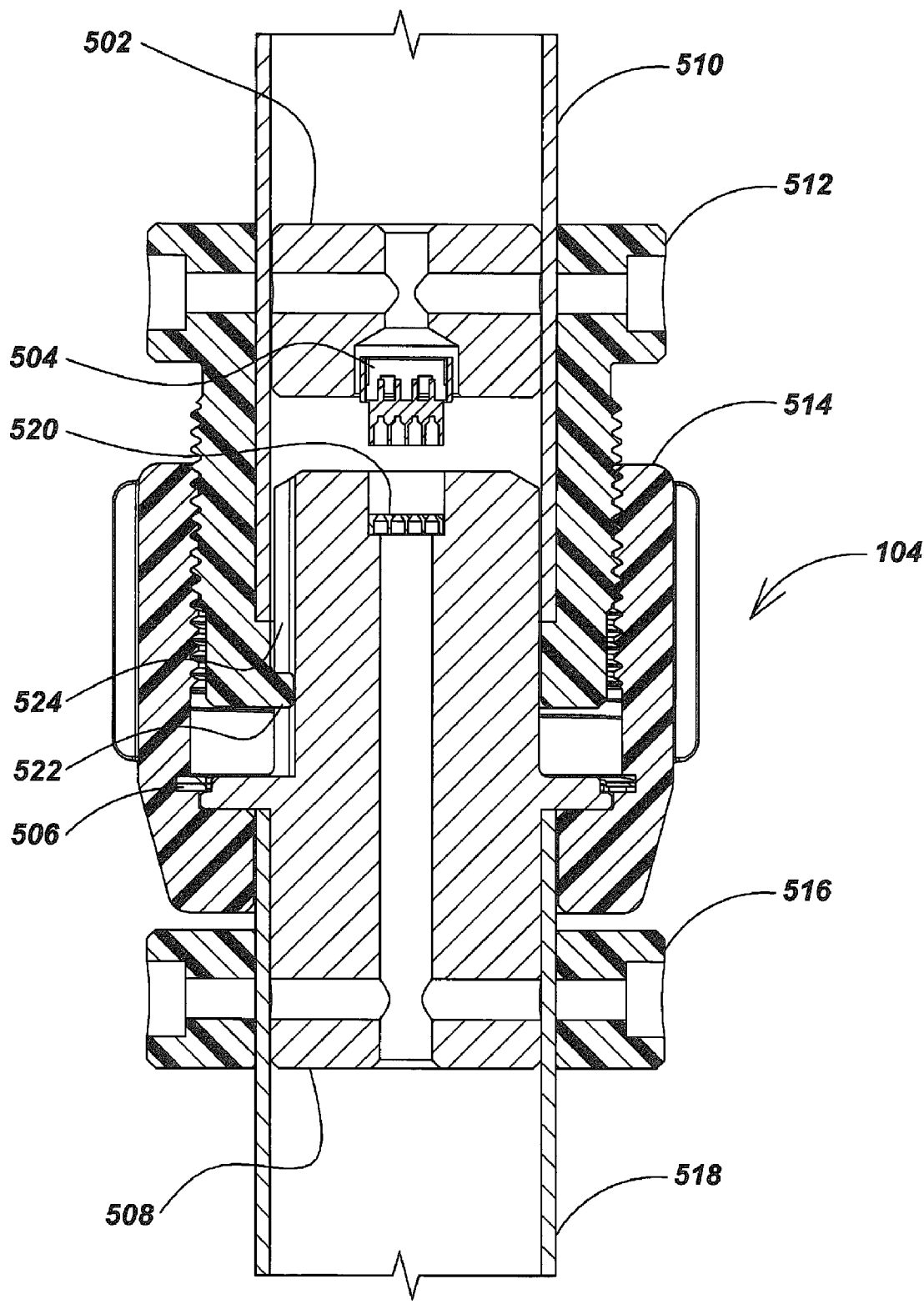
FIG. 5A is a cross-sectional diagram illustrating an exemplary accessory mounting interface embodiment suitable for use in the locator from FIG. 1 with the locator portion of the accessory mounting interface and a typical attachment block shown slightly separated.

FIG. 5A is a detailed section view of the accessory mounting interface showing the locator portion and the attachment portion of the interface separated to illustrate alignment. As can be seen in FIG. 5A, the electrical connectors 504 of the locator 102 and the electrical connectors 520 of the accessory attachment are disengaged and the accessory is partly withdrawn from the locator.

Figure 5B:
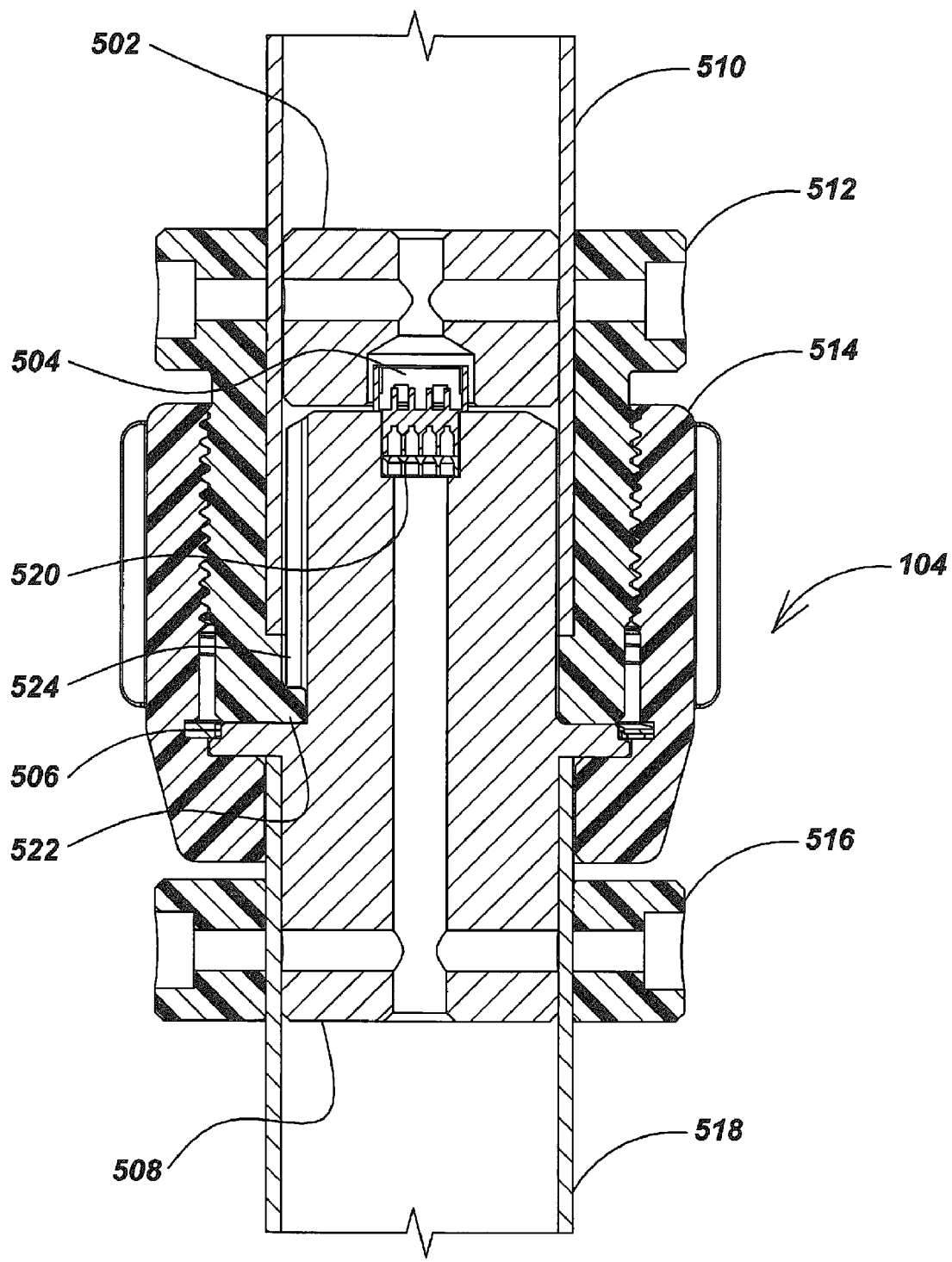
FIG. 5B shows the accessory mounting interface of FIG. 5A and the attachment block of a typical accessory joined together as for operation.

FIG. 5B is a cross-sectional diagram illustrating an exemplary embodiment of accessory mounting interface 104 showing an accessory attachment (not shown) fully coupled to the locator accessory mounting interface. In FIGS. 5A and 5B, the threaded collar 514 couples the accessory mounting interface 104 to the mating threaded assembly 512 affixed to the locator 102. The central shaft 510 is slipped into receiving slots in the upper threaded assembly 512 and seated around a connector assembly 502. Electrical connectors 504 in the locator are embedded into the connector assembly 502 such that contact is made and maintained with electrical connectors 520 from an inserted accessory attachment 508 to provide both power and data signal connectivity thereby. The connector unit 520 from the accessory attachment (not shown) is supported by lower collar 516. The accessory mounting interface 104 provides a tubular receptacle in threaded assembly 512 for the insertion of accessory attachment 508. A retaining ring 506 retains the threaded collar 514 onto the inserted accessory attachment 508. Rotary indexing is provided by a key-and-slot arrangement 522, 524 between the receptacle and the inserted accessory attachment. The key-and-slot prevents rotation of the accessory once inserted. The lower threaded collar 514, when tightened, secures the accessory to the mounting interface 104 until released.

The Ground Penetrating Radar (GPR) Accessory

Figure 6A:
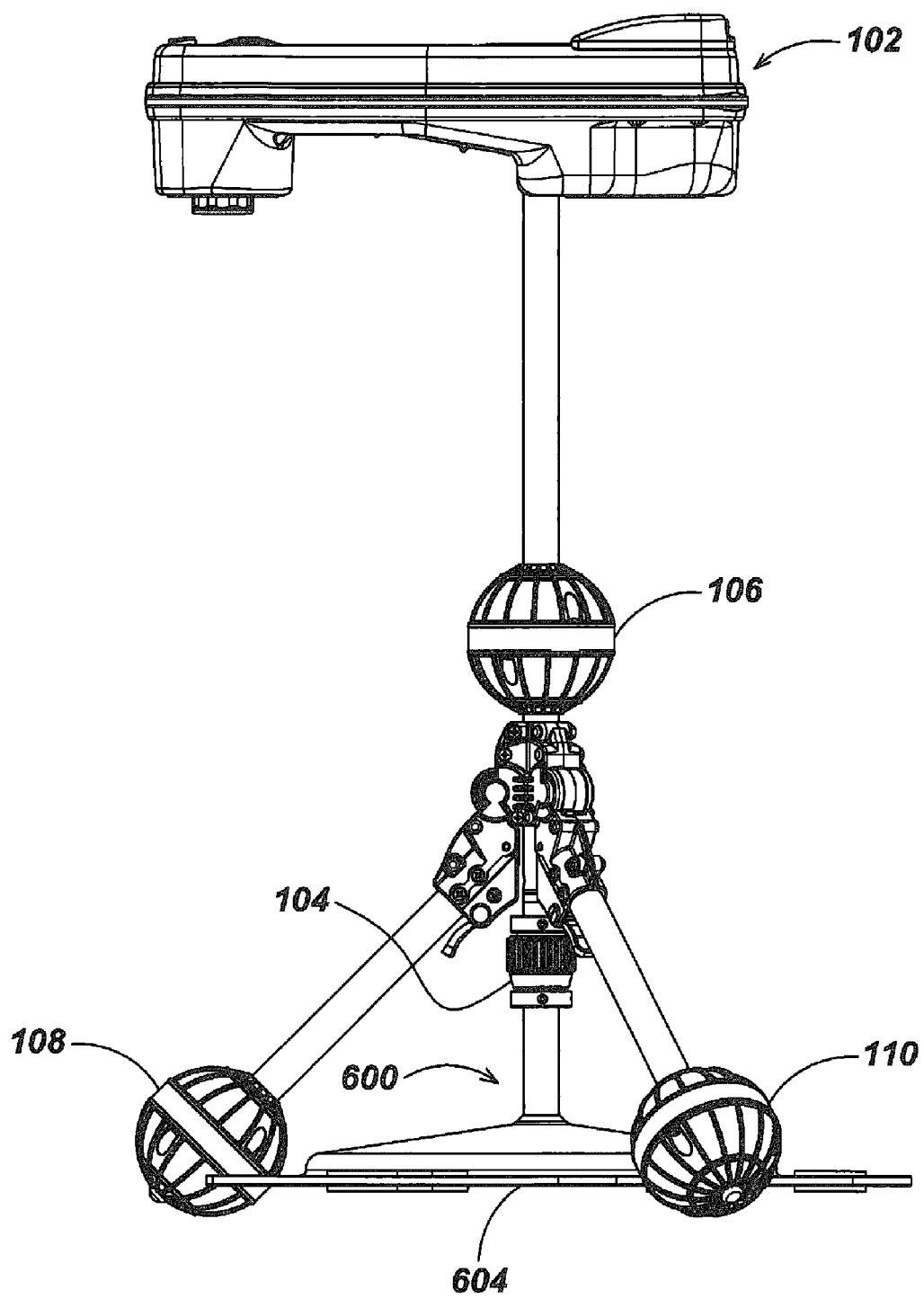
FIG. 6A is a side view of the locator from FIG. 1 in an open disposition for operation with the accessory mounting interface coupled to a preferred ground penetrating radar (GPR) accessory embodiment.

As shown in FIG. 6A, according to another embodiment, the attached accessory is a Ground Penetrating Radar (GPR) device 600. Conventional ships' radars use rotating antennas and very narrow beam transmit pulses to determine bearing to a target. Targets are generally assumed to be lying on a plane (ships on the surface of the sea for example) and hence the specific location of another ship can be determined. Using radar to locate buried hidden objects is however a very different type of problem and narrow beams cannot be practically formed. Soil penetration depths for GPR tend to be shallow, in many areas on the order of a meter or two in depth. For example, high clay, salty, water saturated soils absorbs radar signals in very short distances. Dry sandy soils may be significantly more transparent to radar signals. Typical frequencies used for GPR range from 250 MHZ to 1.6 GHz. Many buried targets of interest lie in the first 1-2 meters depth and so operation at very short distances is required. As a result, very short transmit pulses are needed. So-called monopulses are used, which are inherently very broadband. Antennas structures commonly employed produce broad beam patterns and thus very little useful directivity. Essentially, it is not possible to determine from which direction a reflected target pulse is received from a single transmit location without moving the antenna to gain the additional data needed to resolve the ambiguity.

The current practice in the locator art is to physically move the antenna across the surface of the ground and to observe the hyperbolic-shaped (assuming a constant antenna translation velocity) target returns to determine the point of closest approach. By repeatedly scanning (mowing the lawn) in a cross-hatch or raster pattern, an image or map of underground structures can emerge from sufficient processing and operator interpretation. Until now, GPR surveys required considerable time and effort to set up and the resulting data was often difficult to interpret.

The locator system described and claimed herein solves this problem by facilitating the determination of the azimuthal direction (compass bearing) to a hidden underground target from data obtained by placing the locator with accessory GPR device at a single location. This capability allows the operator to move the GPR from location to location by interacting with the displayed information to rapidly localize targets of interest.

A key feature of this embodiment is the use of a spinning antenna structure for a ground penetrating radar device (GPR). The antenna structure is rotated around an approximately vertical axis in such a manner that the round trip travel time from any target lying away from the axis of rotation varies as some function of the angle of rotation. This variation in range to any target is used to determine the direction to this target. Various antenna geometries are useful, but they all share the characteristic that the apparent ranges to at least some possible targets in the volume being surveyed vary with antenna rotation. In general it is desirable to offset at least one transmit or receive antenna element as far as practical from the axis of rotation as possible to maximize the amount of range variation as the antenna structure completes a revolution.

It is desirable to position a GPR antenna close to the surface of the ground to improve coupling of the transmitted signal into the ground. Placing the spinning antenna at a greater distance above the surface of the ground, results in a higher fraction of the transmitted energy being reflected. For this reason it is important that the axis of rotation of the spinning antenna structure be approximately normal to the average surface of the ground in the area to be surveyed, so that any rotating antenna element remains positioned as close to the surface of the ground as possible.

This embodiment is directed primarily towards collecting radar data while the device in is a fixed location while some antenna element rotates in such a manner that the bearing and range to an unknown buried target may be determined. The range resolution of the GPR must be less than the induced "wobble" in range caused by antenna rotation during each antenna revolution in order for the bearing to a target to be determined. Methods of calculating detection ranges and bearings from radar sensors are not discussed herein, as they are wellknown in the art.

Various combinations of antenna geometries can be employed. The simplest is to use a monostatic antenna (transmitter and receiver collocated) where the same antenna is used for both transmit and receive. Alternatively a bistatic antenna can be employed, where the transmitting and receiving antennas are generally not opposite each other from the axis of rotation. According to another embodiment, the attached GPR accessory includes a spinning antenna where the axis of spin is approximately vertical. According to another embodiment, the attached GPR accessory includes a spinning antenna where each transmit pulse can be associated with a particular angular position of the rotating antenna. According to another embodiment, the attachment to the accessory mounting interface consists of a Shell Casing within which different devices may be fitted or removed without removing the Shell Casing from the locator.

FIG. 6A illustrates a side view of the locator 102 from FIG. 3 in an open disposition for operation with the accessory mounting interface 104 coupled to a preferred ground penetrating radar (GPR) accessory embodiment 600 in a position deployed for use. Antenna nodes 106 108, and 110 are also shown.

Figure 6B:
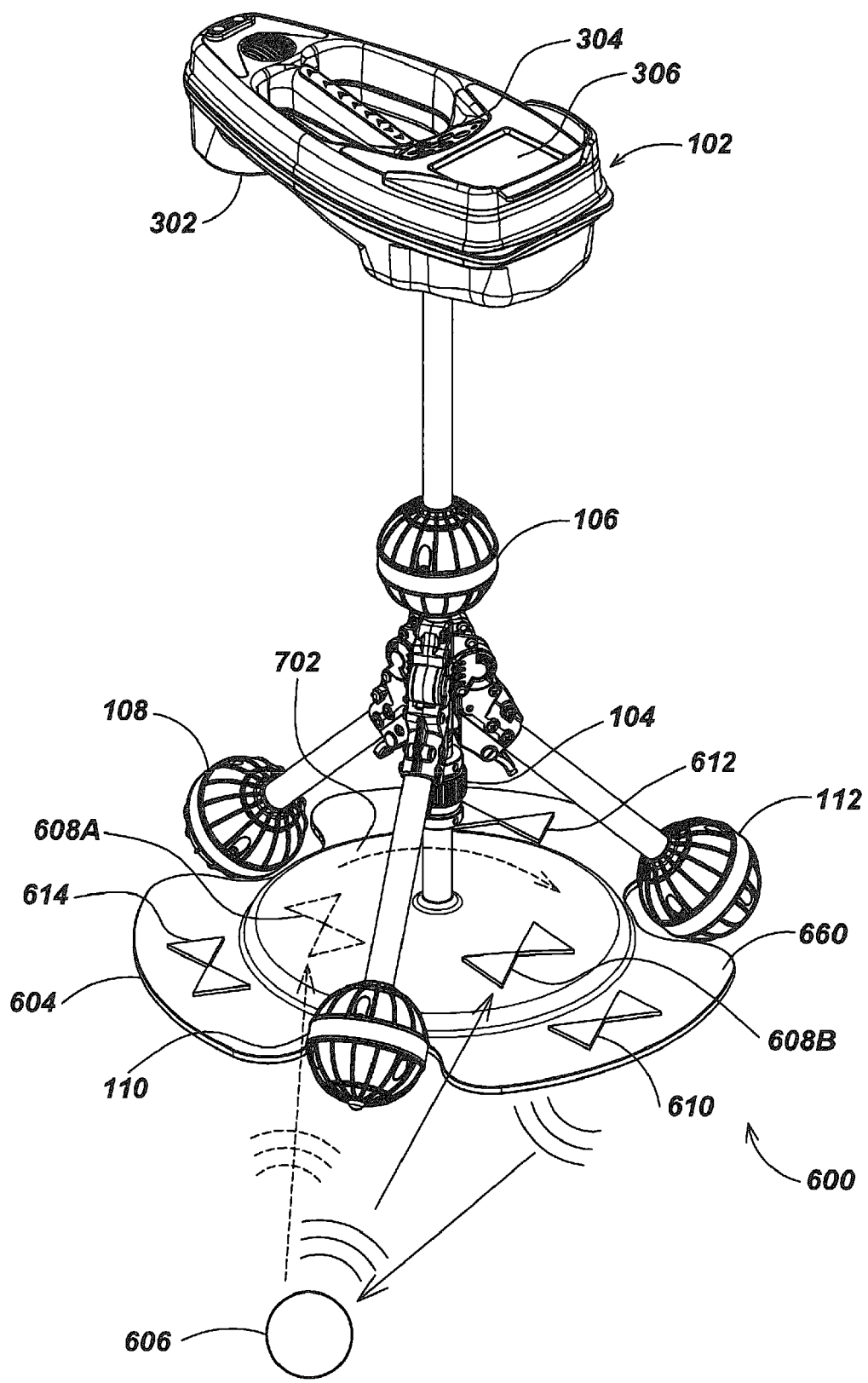
FIG. 6B is a top isometric view of the locator from FIG. 6A showing the spinning GPR antenna in more detail.

FIG. 6B illustrates a top isometric view of the locator 102 from FIG. 6A showing the spinning GPR antenna attachment 600 with transmitter bow-tie antennas exemplified by one transmit (Tx) antenna shown in two positions, 608A and 608B, and receiver bow-tie antennas exemplified by the receive (Rx) antennas 614, 610 and 612, for use in detecting the target 606. In FIG. 6B a clockwise-rotating disk 702 carrying a single transmit antenna (i.e., a bow-tie antenna configuration) sits centrally in a rigid structure 604 that supports three lobes which, in this example, support three non-spinning bow-tie receive antennas 614, 610 and 612. It should be noted that the function of the Tx and Rx antennas may be reversed, or optionally, both Rx and Tx antennas may be switched, for any advantageous combination of receive and transmit antennas that suit particular applications. The number of antennas shown is exemplary only.

Figure 6C:
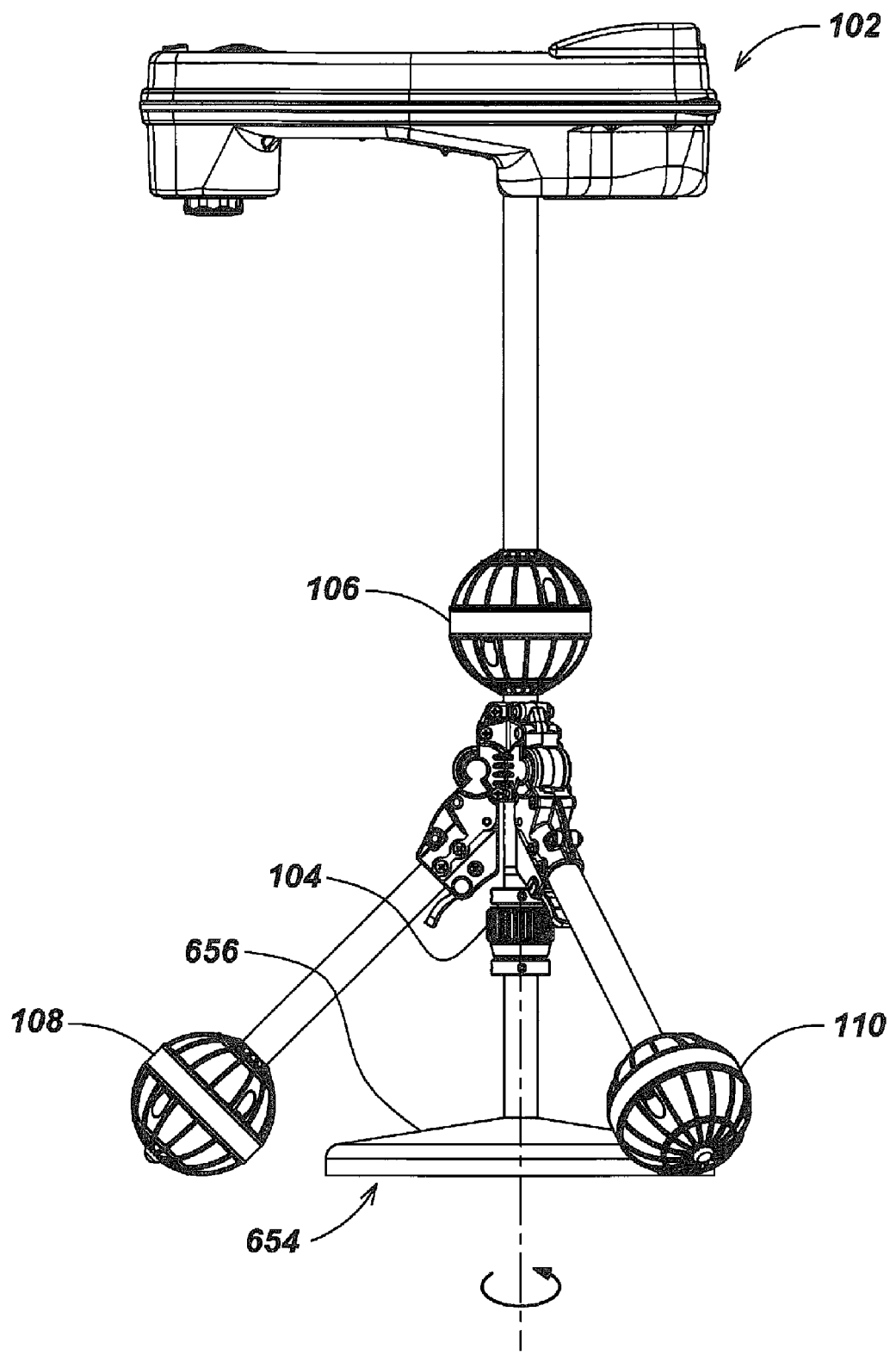
FIG. 6C is a side view of the locator from FIG. 3 in an open disposition for operation with the accessory mounting interface coupled to an alternative GPR accessory embodiment.

FIG. 6C illustrates a side view of the locator from FIG. 3 in an open disposition for operation with the accessory mounting interface 104 coupled to an alternative GPR accessory embodiment 654, using a shell casing 656 into which different devices may be fitted. In this configuration, the receive antennas are not mounted on fixed lobes but are included in the spinning segment within the shell, which may be a single rotating disk, for example, with a monostatic Tx/Rx or other antenna configuration mounted on it.

Figure 6D:
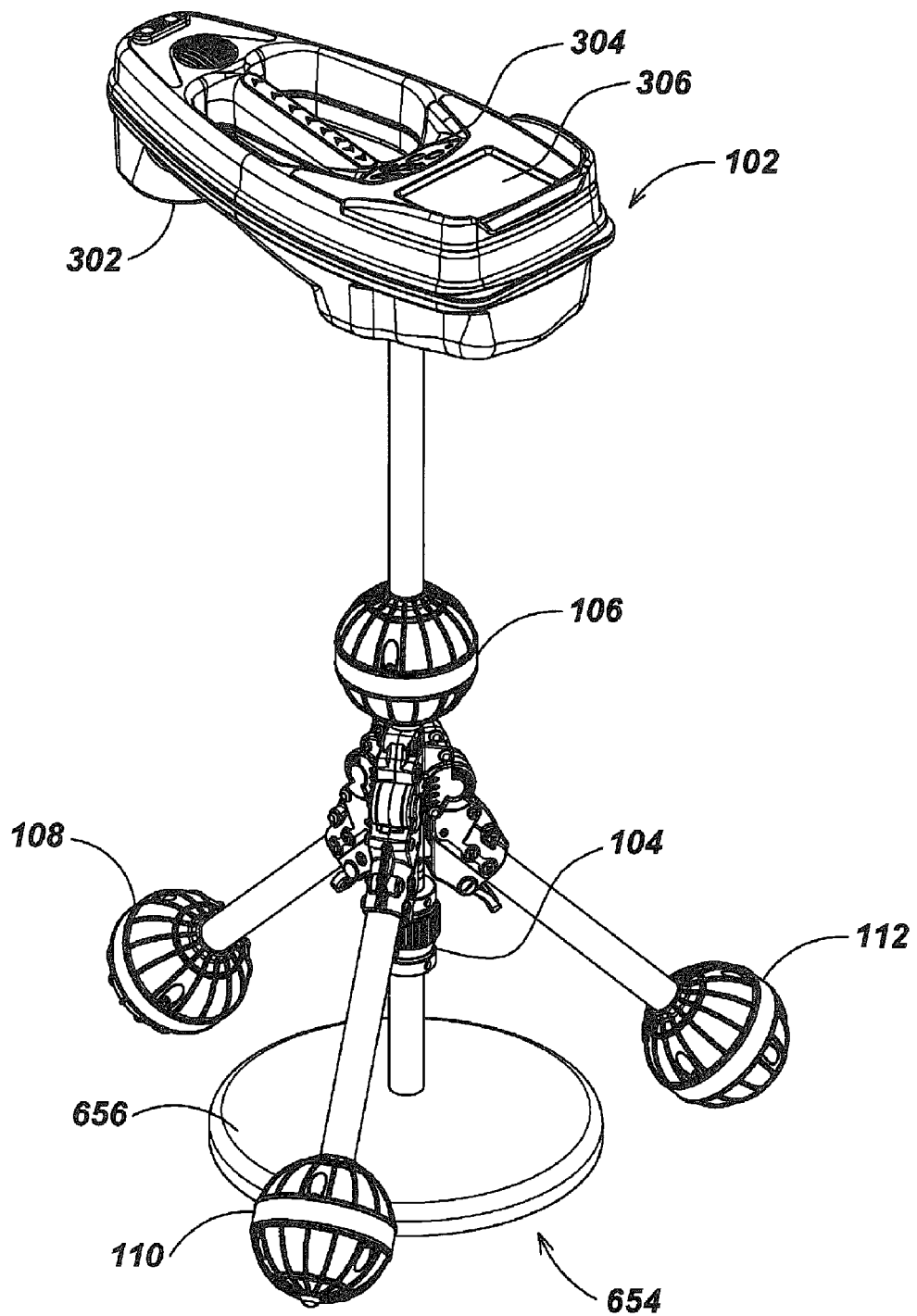
FIG. 6D is a top isometric view of the locator and attachment in FIG. 6C.

An isometric view of the same configuration is shown in FIG. 6D, illustrating the disposition of locator 102, battery case 302, display 306, keyboard 304, antenna nodes 106, 108, 110, and 112, the accessory mounting interface 104 and the shell casing attachment 656 with an embodiment of the GPR device 654 fitted to it.

Figure 7:
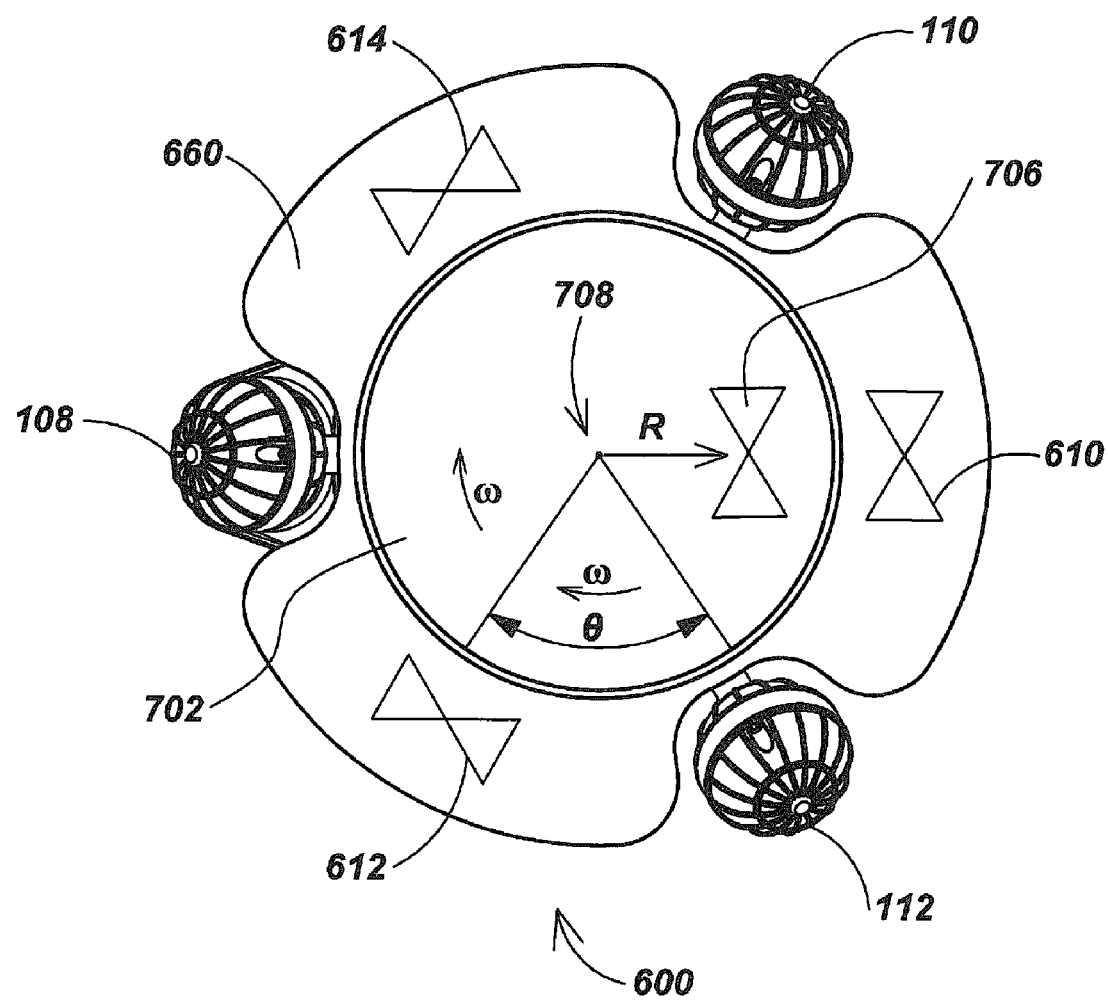
FIG. 7 is a bottom view of the locator from FIGS. 6A-B showing the spinning GPR antenna in more detail.

FIG. 7 illustrates a bottom view of a GPR antenna disk and frame assembly 600 where the inner disk 702 is spinning in the ω direction about a spin axis 708 with transmit bow-tie antenna exemplified by the Tx antenna 706 disposed at distance R from spin axis 708, and fixed, non-spinning receive bow-tie antennas exemplified by the Rx antennas 610, 612 and 614, disposed at a greater distance from spin axis 708.

One GPR accessory embodiment includes an inner spinning transmit antenna where the round trip travel time of reflected pulses detected by one or more receive antennas from any targets away from the spinning antenna axis vary as a function of rotational position of the spinning antenna. It is readily appreciated by skilled practitioners in the art that where several receive antennas are used, they may receive simultaneously, or may be switched to receive only in some timed pattern. Additionally the function of antennas shown here is an example, and the functions may be reversed, or switched dynamically to best advantage depending on the specific application. For example, an inner spinning disk with an Rx antenna may be deployed with one or more fixed Tx antennas, transmitting sequentially or simultaneously. Bow-tie antennas are shown herein, but other antenna types may be used. Additionally, multiple antennas at various locations may be used, oriented to be more receptive to signals which are differently polarized when reflected from targets.

An alternative GPR accessory embodiment includes an inner spinning transmit antenna where each transmit pulse is associated with a particular angular position of the rotating antenna and where the locator is not moving with respect to the ground during data collection. As another example, the attached GPR accessory may include a spinning transmit antenna where the frequency of the reflected pulses from any targets away from the spinning antenna axis vary as a function of rotational position of the spinning antenna due to Doppler shift.

Figure 8A:
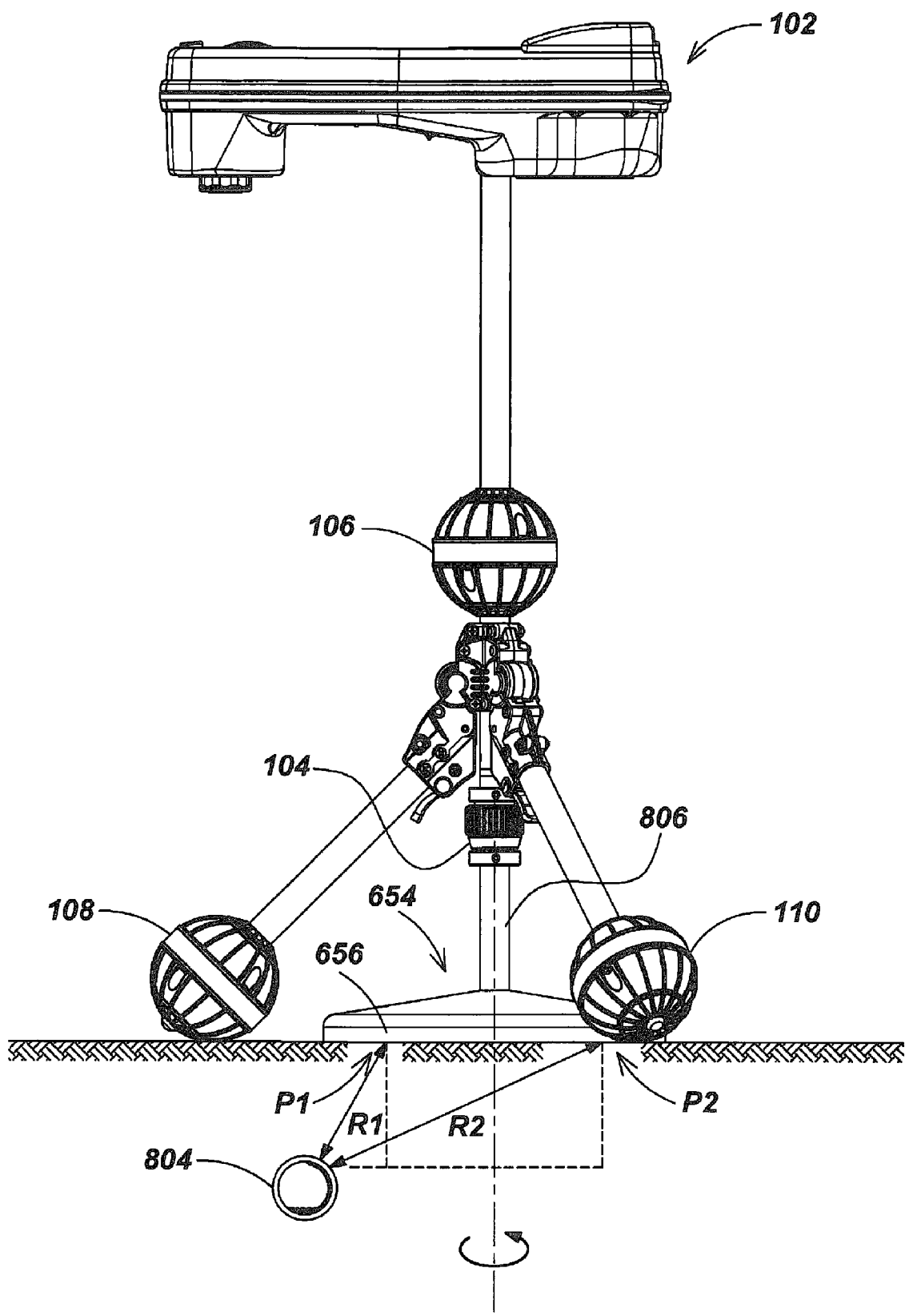
FIG. 8A is a schematic diagram illustrating the locator-target signal path geometry during operation of the locator from FIG. 6C.

FIG. 8A is a schematic diagram illustrating the locator-target signal path geometry during operation of the locator from FIG. 6C. In FIG. 8A, the GPR attachment 654 with rotating Tx/Rx assembly antenna 656 located internal to the shell casing detects two radiuses $R_1$ and $R_2$ to the target object, here a plastic pipe 804, based on detections by the receiving antenna on rotating Tx/Rx antenna 656, which is at Position P1 at time $t_1$ and at Position P2 at time $t_2$. The spinning antenna disk is driven by a motor 806 (not shown)

built into the GPR attachment 654 in any useful manner known in the art for spinning a flat disk on a spindle with an electrical motor.

Figure 8B:
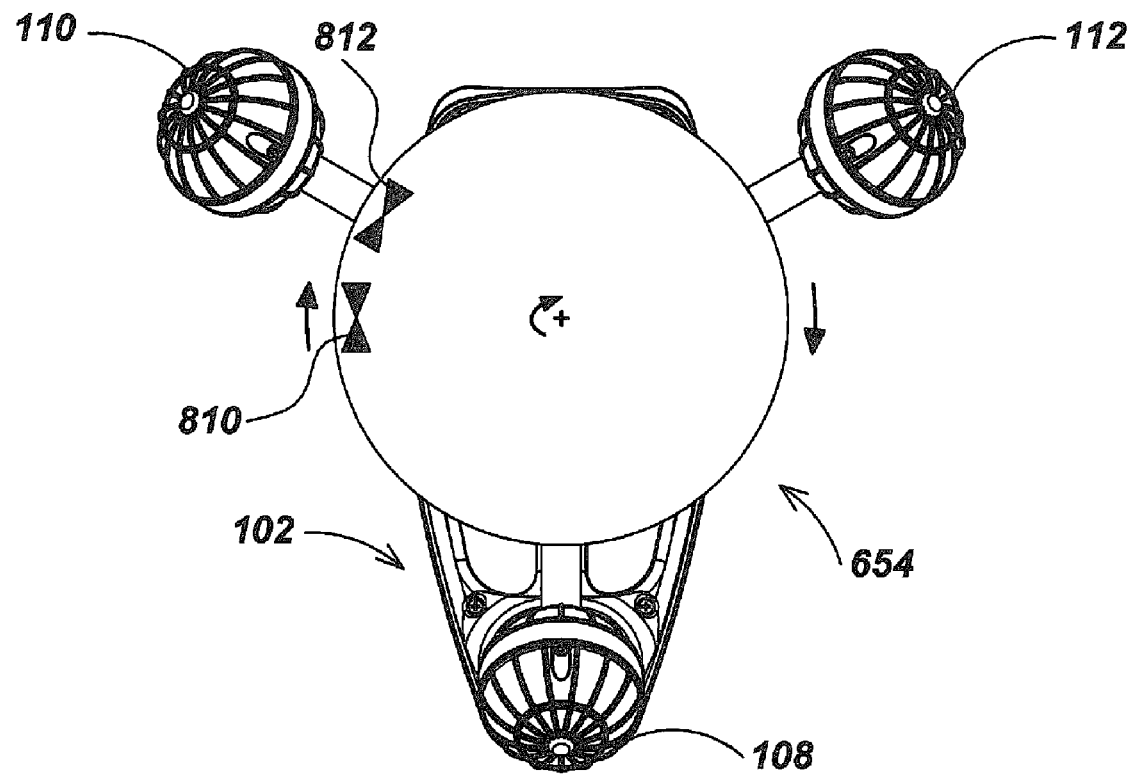
FIGS. 8B and 8C show alternative configurations of the antenna disk in FIG. 7.

FIG. 8B is a bottom view of one alternative embodiment of the GPR antenna disk that can be attached within the Shell Casing. In FIG. 8B, two bow-tie antennas 810-812 are shown supported on a clockwise rotating disk such that either of the antennas is a Tx antenna and the other is an Rx antenna. In such a configuration, the two (Tx, Rx) antennas 810-812 may transmit and receive in timed patterns controlled by a switching scheme.

Figure 8C:
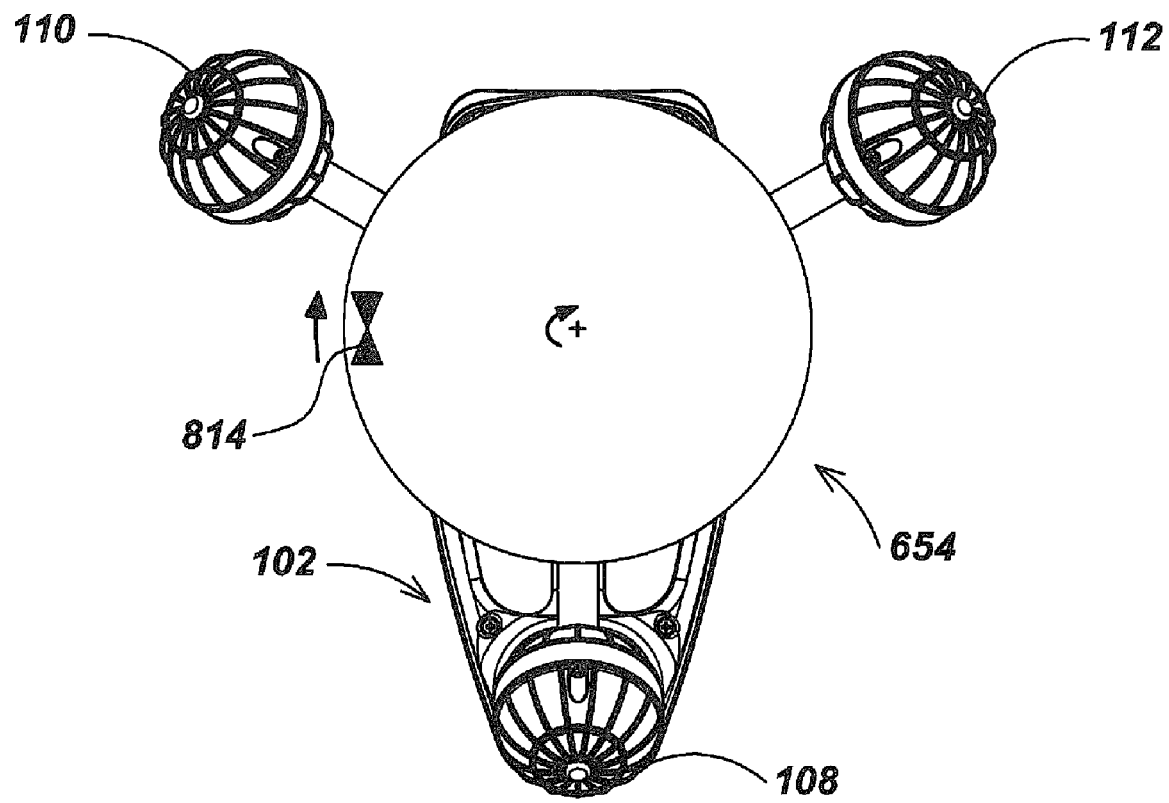

FIG. 8C is a bottom view of one alternative embodiment of the GPR antenna disk adapted for attachment within the Shell Casing 654. In FIG. 8C, a single monostatic bow-tie antenna 814 is shown supported on a clock-wise rotating disk and configured such that the antenna is a Tx antenna when required, and can switch when required to operating as an Rx antenna. In such a configuration the antenna may transmit and receive in timed patterns based on a switching scheme.

Figure 9A:
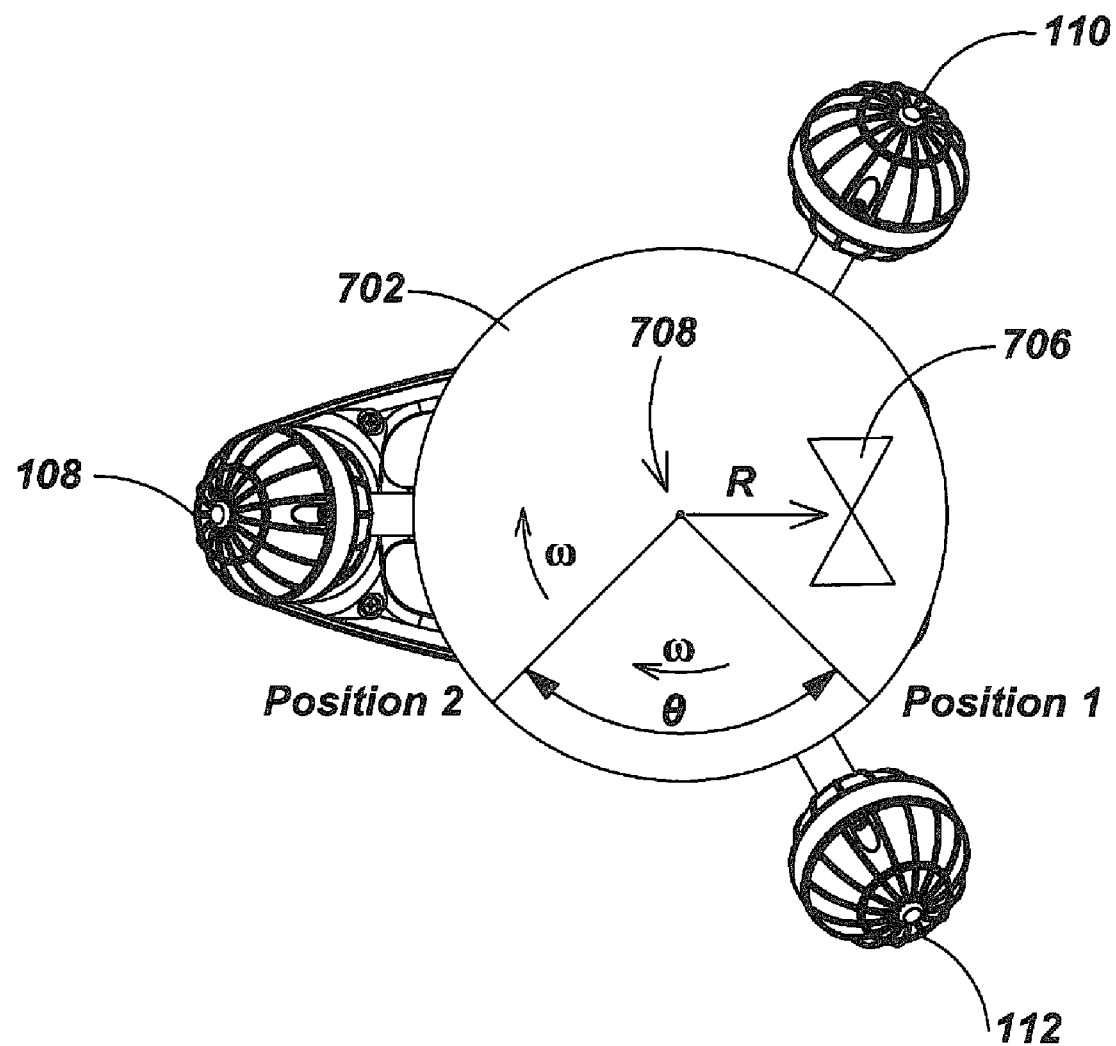
FIG. 9A is an illustration of the physical operation of the rotating disk antenna used in GPR scanning.

FIG. 9A shows a bottom view of the inner disk 702 of a GPR antenna that constitutes the inner, rotating element of the GPR attachment in FIG. 7. In FIG. 9A, an example of the antenna 706 is shown rotating in $\omega$ direction from Position 1 to Position 2 through an angle $\theta$.

Figure 9B:
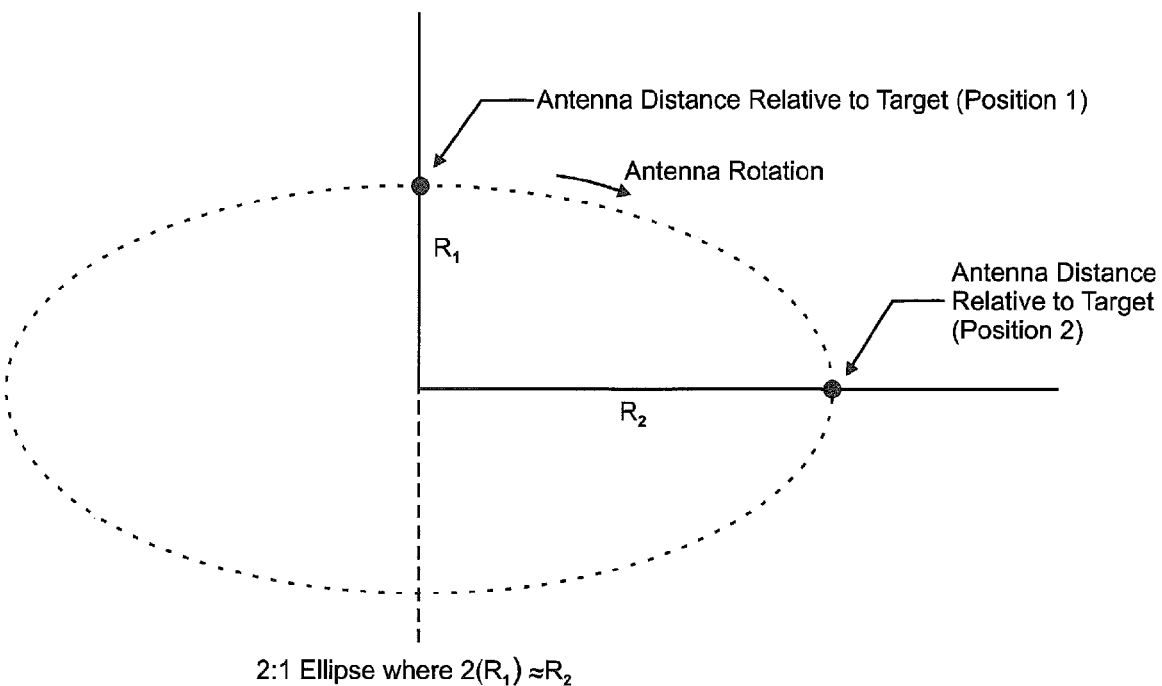
FIG. 9B is a schematic diagram illustrating the relationship between the GPR target distance and GPR antenna rotation for the locator-target signal path geometry from FIG. 8A.

FIG. 9B is a schematic diagram illustrating the relationship between the GPR target distance and GPR antenna rotation for the locator-target signal path geometry from FIGS. 8A and 9A. In FIG. 9B, the two detected radii R1, R2 from FIG. 9A are shown, and the distances of the antenna 608 relative to target 804 (see FIG. 8A) are shown. The values of R1 and R2 define an ellipse such that $2R_1 \cong R_2$.

Figure 10A:
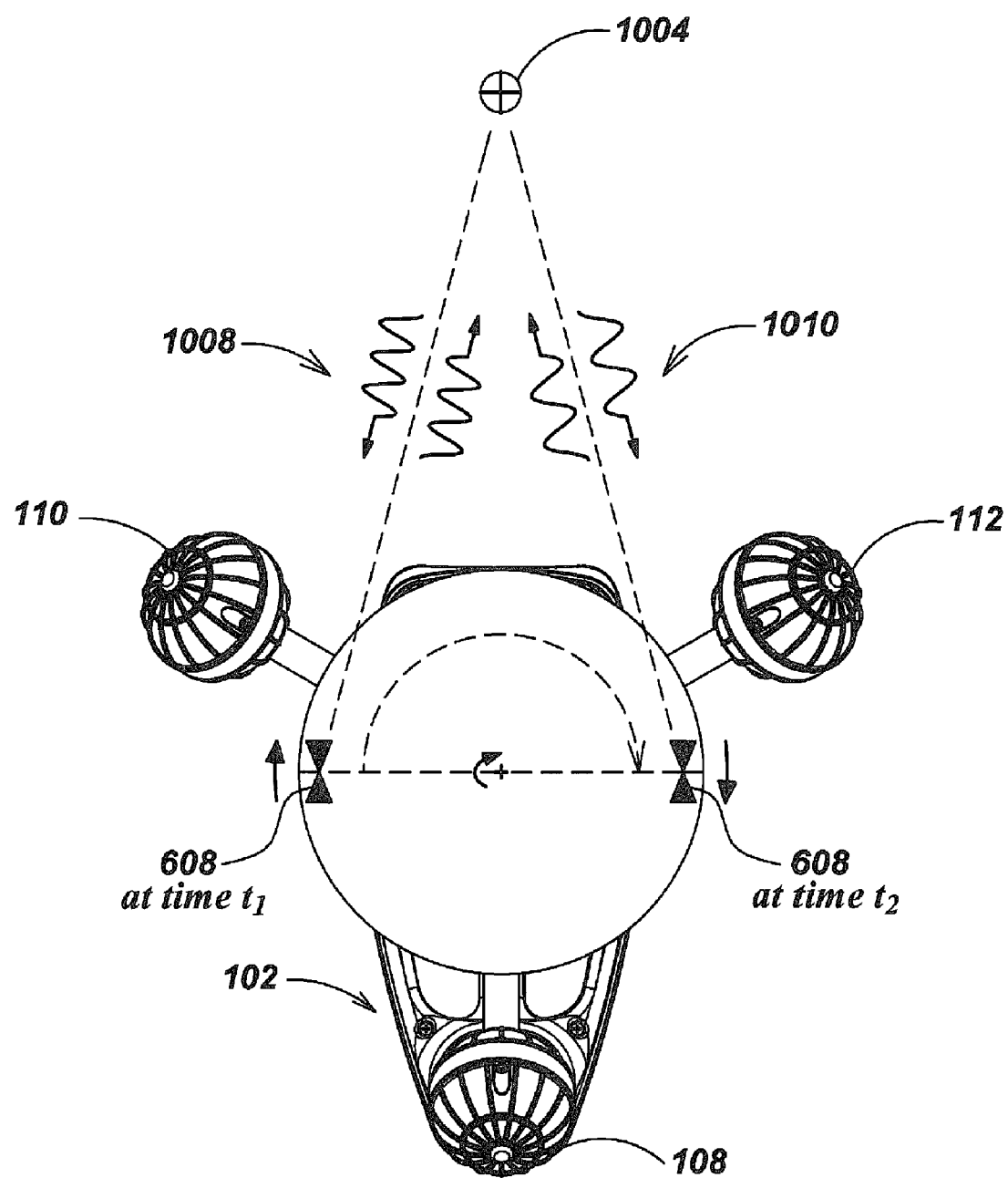
FIG. 10A is a schematic bottom view diagram illustrating the GPR signal Doppler shift with an off-axis target for the locator from FIG. 6C.

FIG. 10A is a schematic diagram illustrating the GPR signal Doppler shift with an off-axis target 1004 for the locator 102 from FIG. 6C. In FIG. 10A, a single rotating Tx/Rx antenna 608, at time $t_1$ receives a signal 1008 while the antenna is moving toward the target 1004. At time $t_2$ the same antenna 608, now moving away from the target, receives signal 1010, which when measured at the receive antenna will be less compressed by reason of a Doppler shift due to the motion of the antenna. This relative Doppler shift allows target direction to be determined.

Figure 10B:
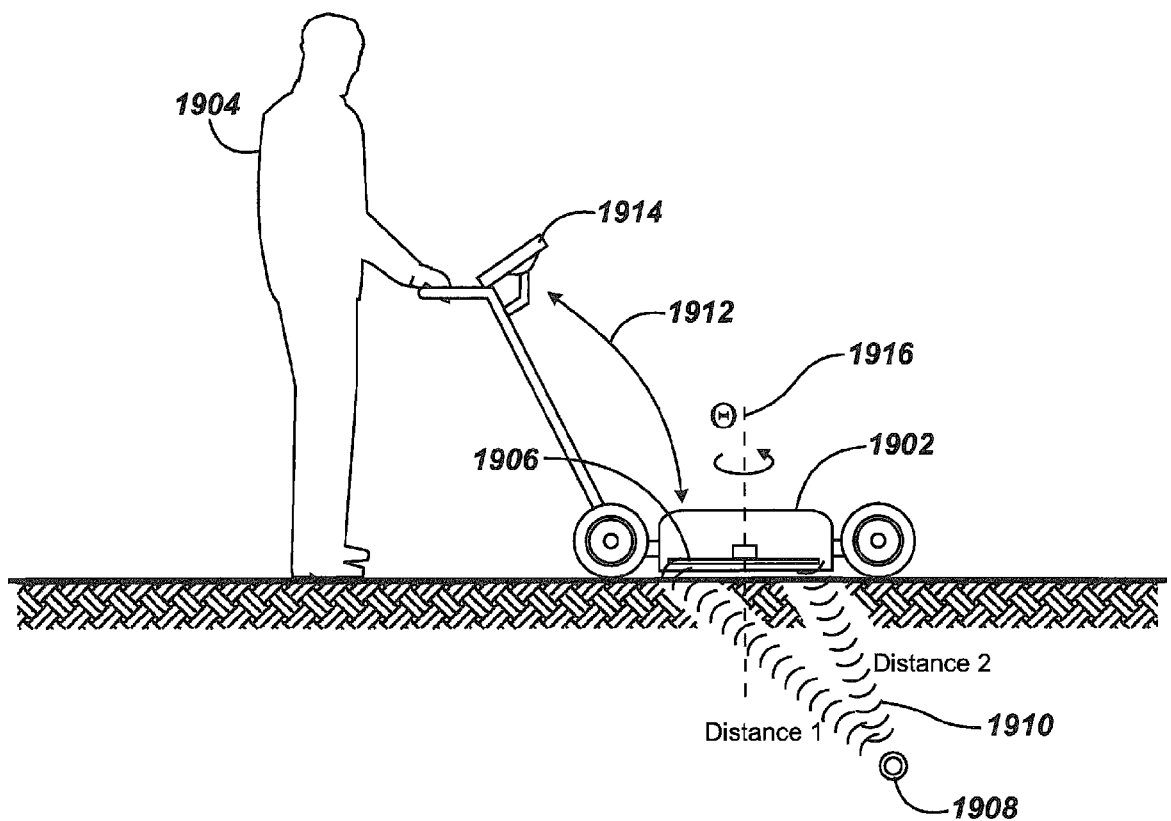
FIG. 10B is a schematic diagram illustrating the operation of an alternative stand-alone GPR apparatus embodiment employing a spinning antenna array.

A stand-alone GPR accessory is described in more detail herein below in connection with FIG. 10B. A schematic diagram is shown illustrating the operation of an alternative stand-alone GPR embodiment employing one or more spinning antennas. In FIG. 10B, the spinning antenna illustrated in FIGS. 6A through 10 is shown built into a moveable cart device 1902. The spinning Tx antenna disk 1906 rotates around a central axis 1916 in the direction indicated. A wired or wireless data link 1912 may transmit data from the GPR unit 1902 to an attached display module 1914 for analysis by the operator 1904.

A single large bow-tie antenna can be placed either centered on the rotating disk or slightly offset from the axis of rotation. This rotating antenna configuration can measure a change in signal amplitude from a reflected target that varies with antenna rotation as the orientation of the signal pulse polarization relative to an extended target varies as the antenna rotates. Extended targets such as elongate pipes will exhibit varying target strength as a function of the relative orientation of the polarization of the GPR pulse. A pair of offset, alternately transmitting bow-tie antennas can be employed that are oriented on the rotating disk at right angles to each other. Since many targets of interest such as pipes have an elongate geometry, a rotating polarization can be employed to advantage to provide an indication of the direction of target elongation.

The Buried Electronic Marker Accessory

Figure 11A:
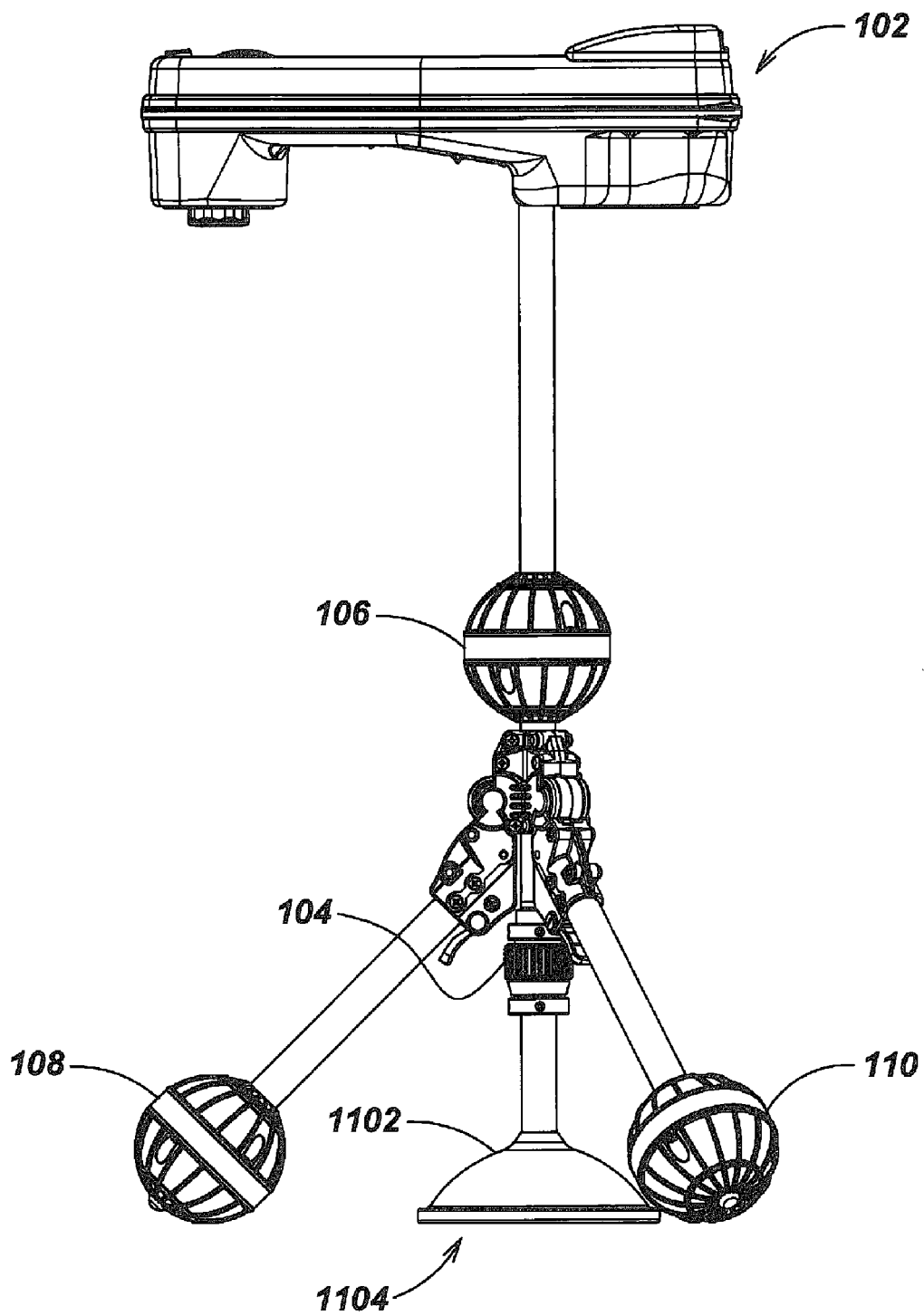
FIG. 11A is a side view of the locator from FIG. 3 in an open disposition for operation with the accessory mounting interface coupled to a preferred buried-marker excitation accessory embodiment.

FIG. 11A shows another embodiment, wherein the attached accessory is a Buried Electronic Marker exciter that transmits a signal to which buried markers can respond. FIG. 11A is a side view of the locator 102 from FIG. 1 in an open disposition for operation with the accessory mounting interface 104 coupled to a preferred buried-marker excitation accessory embodiment including the Marker Excitation attachment 1104 and an embodiment of the Shell Casing 1102. The mapping array locator 102 in combination with an EM activator offers many unexpected advantages for locating a buried marker and displaying location indicators to the user. When a buried marker is excited by a pulse of energy from the accessory 1104, it resonates by design to the frequency of the energy transmitted. The pattern of such resonance identifies the marker when it is detected by a receive coil in the Buried Electronic Marker accessory or, alternatively, by the lower antenna nodes 108, 110, and 112 (not visible) of the locator 102.

This resonance may be used to carry an encoded response based on information previously encoded into a marker such as its identification, type, date of installation, or similar data. The response resonance is detected and parsed by the locator 102 through the lower antenna nodes 108, 110 and 112 (not shown here) or by the receiver coil of an accessory attachment when so equipped.

Figure 11B:
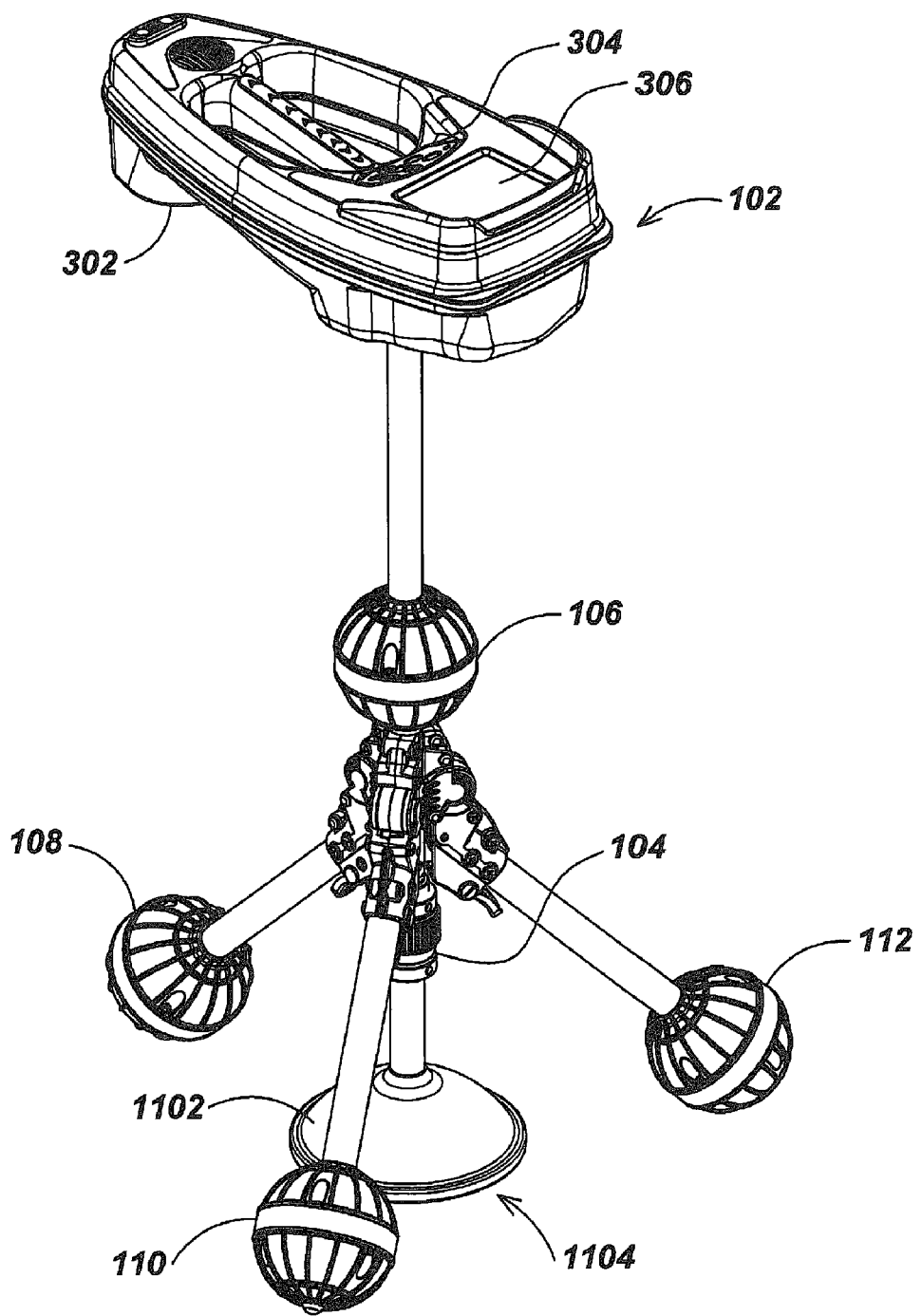
FIG. 11B is a top isometric view of the locator from FIG. 11A.

FIG. 11B is a top isometric view of the locator 102 from FIG. 11A showing three lower antenna nodes 108, 110, and 112, and the shell casing 1102 and Buried Electronic Marker attachment 1104 attached by means of the accessory mounting interface 104.

Figure 11C:
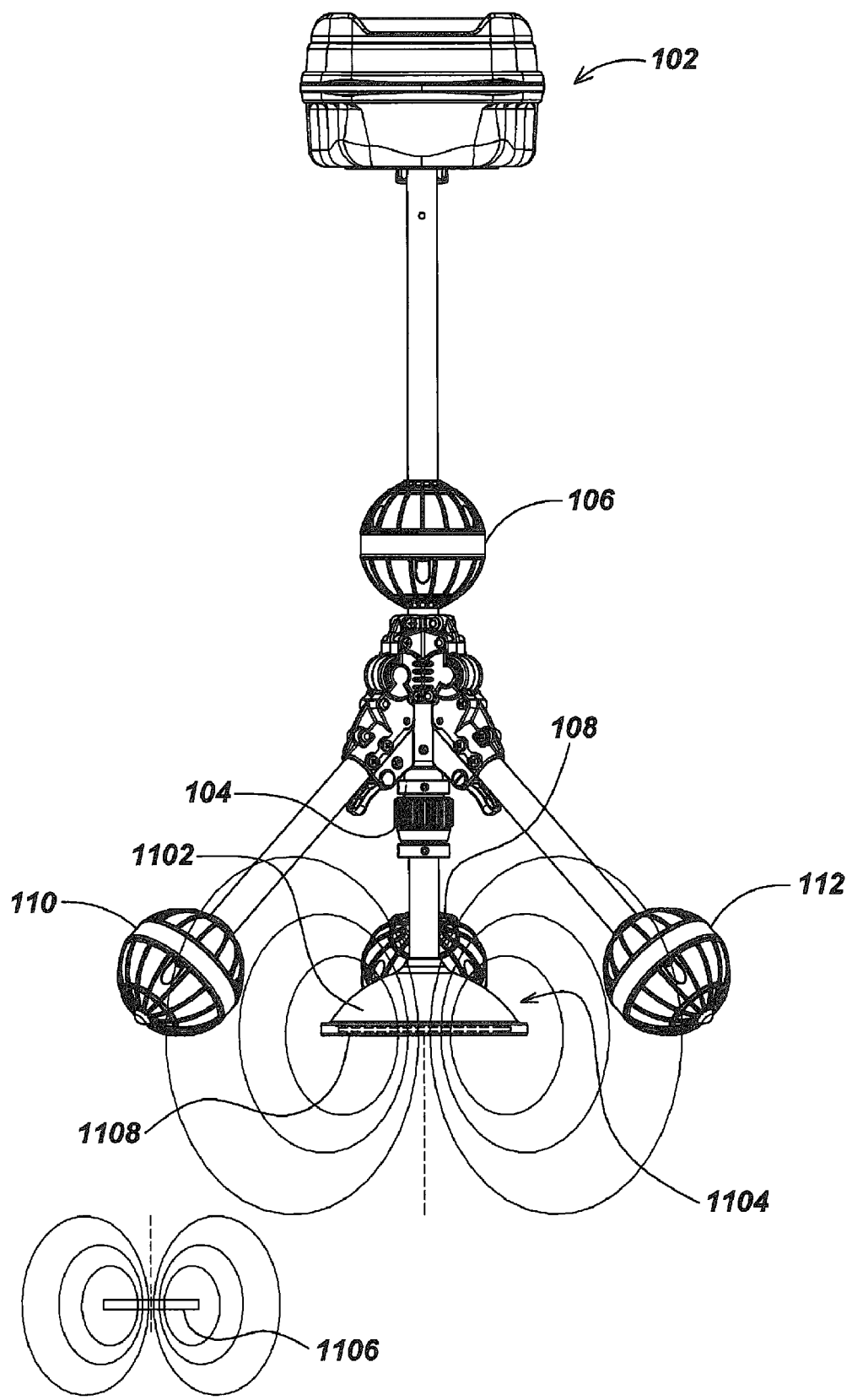
FIG. 11C is a front view of the locator from FIG. 3 in an open disposition for operation with the accessory mounting interface coupled to an alternative buried-marker excitation accessory embodiment.

FIG. 11C illustrates a front view of the locator 102 from FIG. 3 in an open disposition for operation with the accessory mounting interface coupled to the Buried Electronic Marker accessory embodiment 1104, connected by means of the shell casing 1102. In FIG. 11C, a buried marker 1106 is excited by an energy pulse emitted from excitation coil 1108 within the accessory 1104, and resonates in response at a predefined frequency that is detected by locator 102 by means of lower antenna nodes 108, 110, and 112, or optionally by means of a suitable receiving circuit (not shown) in the attachment 1104. The response detection is then parsed into marker information that may be displayed by the locator 102. An alternative means of display using an external display device such as a laptop computer may also be used and is discussed below with FIG. 26.

Note that for many accessory or peripheral devices, such as the Buried Electronic Marker attachment, an accessory may be adapted to use with a locator not equipped with an accessory mounting interface when such accessory is configured with its own power and electronics, such as by being clipped to a locator mast or deployed separately from the locator.

The Cable Fault Locating and Conductance Measuring Accessory

Figure 12A:
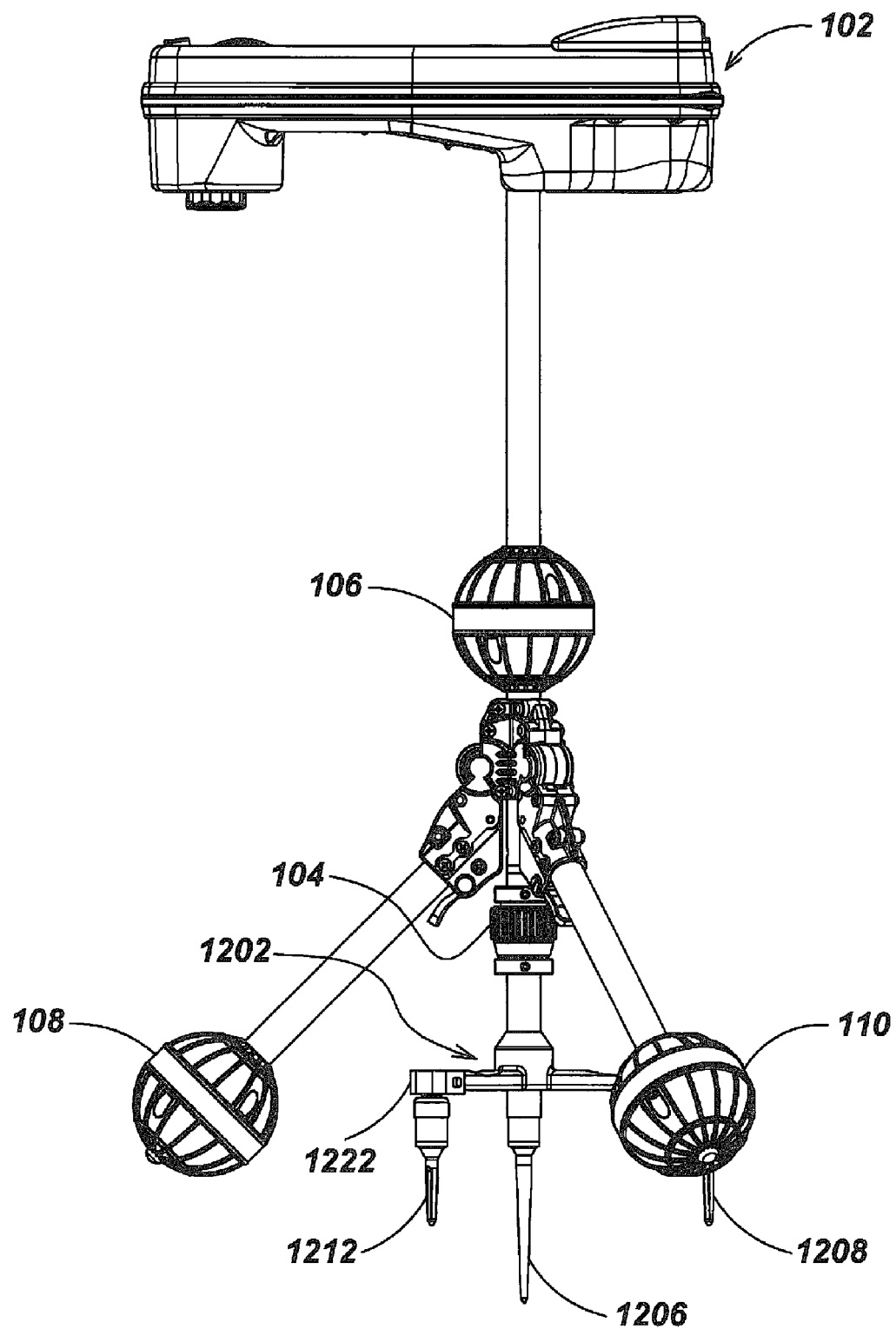
FIG. 12A is a side view of the locator from FIG. 1 in an open disposition for operation with the accessory mounting interface coupled to a preferred cable fault locating accessory embodiment.

Turning to FIG. 12A, according to another embodiment, the attached accessory is a fault detector 1202 that includes electrical connections to two or more electrodes that can be placed into the ground for sensing earth voltages such as those due to electrical cable faults. These electrodes or probes can be used for sensing earth voltages where the electric field potentials can be measured and mapped. FIG. 12A is a side view of the locator from FIG. 3 in an open disposition for operation with the accessory mounting interface 104 coupled to a preferred cable fault locating accessory embodiment 1202. In FIG. 12A, the fault locating accessory 1202 is attached by means of the accessory mounting interface 104 and consists of a frame 1222 that supports multiple probes, of which three 1212, 1206, 1208 are here shown.

Figure 12B:
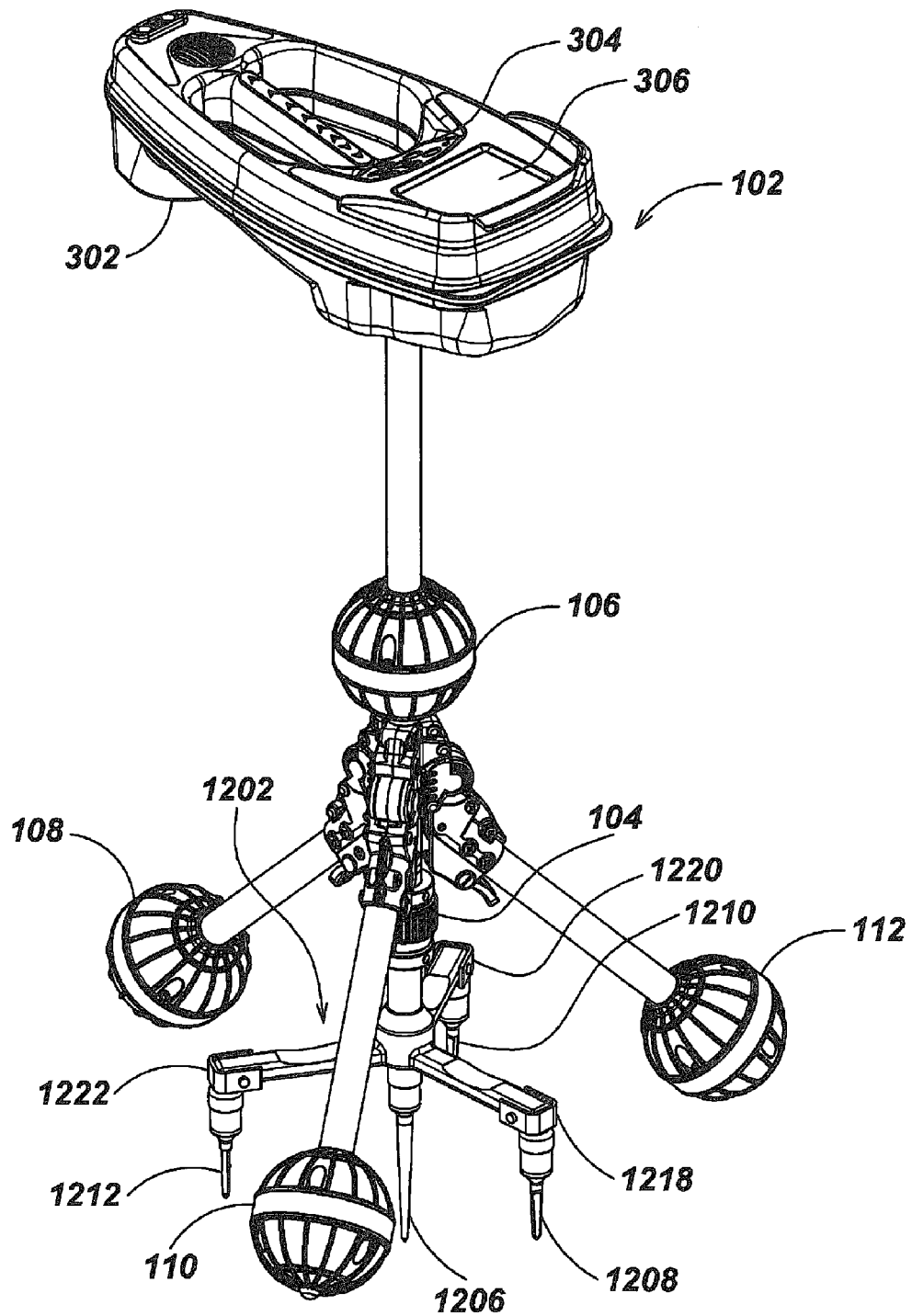
FIG. 12B is a top isometric view of the locator from FIG. 12A.

FIG. 12B is a top isometric view of the locator 102 from FIG. 12A. The attachment 1202 is coupled to the locator 102 by the accessory mounting interface 104 and consists of a frame 1222 supporting four separate probes of which probe 1206 is central and probes 1212, 1208, and 1210 are disposed to align between the axes of the three lower antenna nodes 108, 110, and 112. The probes 1206-1212 and their support frame 1222 are designed to facilitate insertion fully into the ground to measure inter-probe electrical potentials. The frame provides depressions on the top surface above each probe to support operator foot pressure applied to sink the probes into the ground. The probes are individually fitted with hinges 1218, 1220, and 1222 so that they may be either folded up or locked in an open disposition for use. As may be readily appreciated by those skilled in the art, this use of multiple probes in fault location improves the traditional art in which A-frame devices with two probes are used with one-dimensional informational results. In an alternative embodiment, the probes may be extended on flexible conductors for placement away from the locator.

Figure 12C:
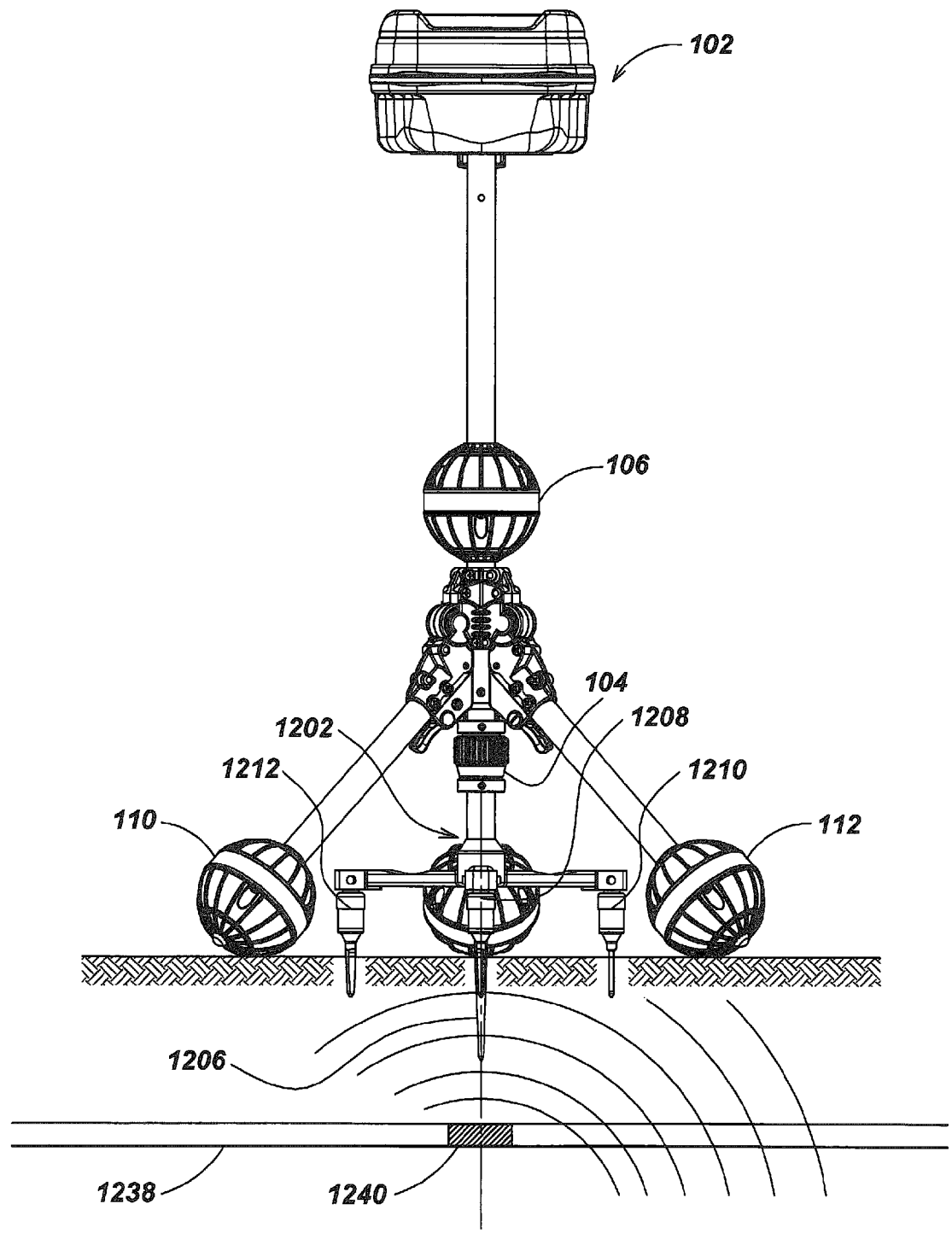
FIG. 12C is a front view of the locator from FIG. 3 in an open disposition for operation with the accessory mounting interface coupled to an alternative cable fault locating accessory embodiment.

FIG. 12C is a front view of the locator 102 from FIG. 12B in an open disposition for operation with the accessory mounting interface 104 coupled to an alternative cable fault locating accessory embodiment 1202. FIG. 12C illustrates probes 1212, 1210, 1208, and 1206 inserted into the ground for the purpose of determining the location of a fault 1240 in a buried cable 1238 by a method discussed below in connection with FIG. 13.

Figure 13:
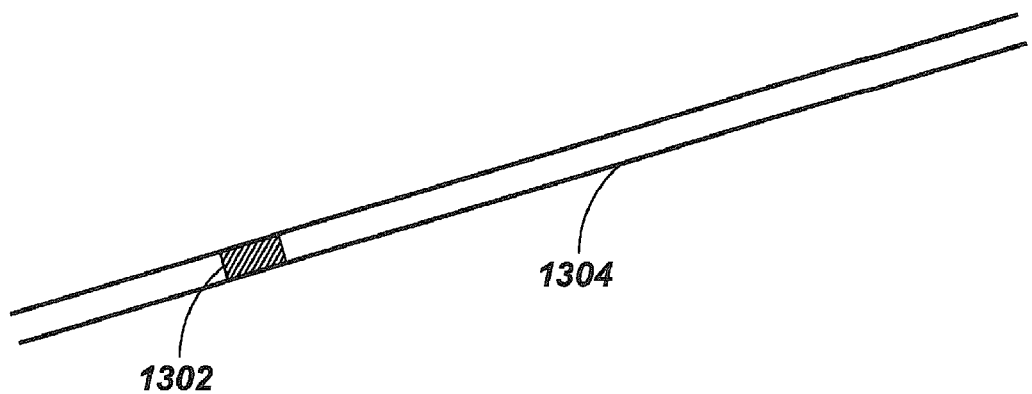
FIG. 13 is a diagram illustrating a bottom view of the locator from FIG. 12A showing the geometry of the cable fault locator accessory and the buried cable fault in more detail.
Figure 13:
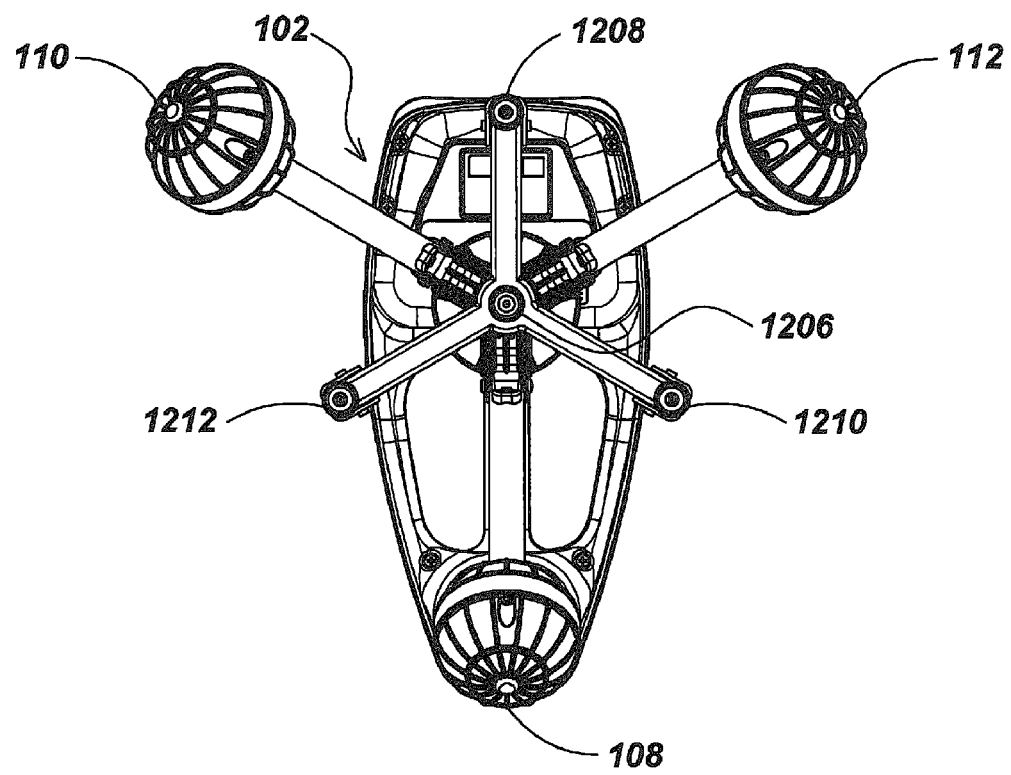

FIG. 13 is a diagram illustrating a bottom view of the locator from FIG. 12A showing the geometry of the cable fault locator accessory with a first electrode 1208, a second electrode 1210, a third electrode 1212 and a fourth central electrode 1206. To determine the location of fault 1302, the locator system employs an embedded program element (FIG. 27) to analyze electrical potential among all four probe locations and produces the following voltage difference array:

$$\begin{bmatrix} V_1 - V_2 \\ V_1 - V_3 \\ V_1 - V_4 \\ V_2 - V_3 \\ V_2 - V_4 \\ V_3 - V_4 \end{bmatrix}$$

The resultant voltage difference array is used by the program element to develop the Graphical User Interface (GUI) indicators adapted to direct the operator to the fault. By referencing the voltage gradients detected in comparing $V_1$, $V_2$, and $V_3$ with the central probe, $V_4$, an additional observation is obtained.

Figure 14:
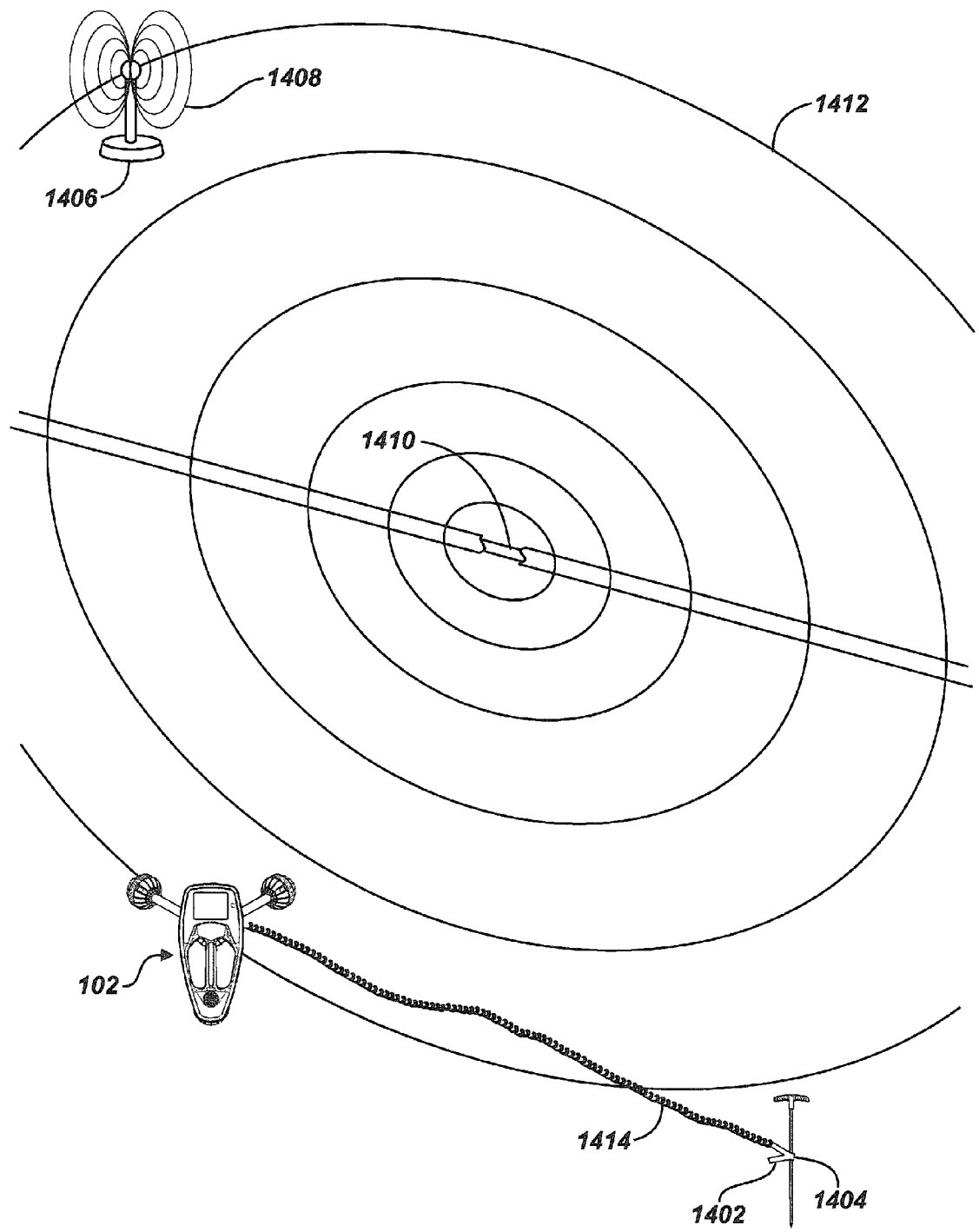
FIG. 14 is a schematic diagram illustrating a cable fault potential mapping system suitable for using the locator from FIG. 12C.

FIG. 14 is a schematic diagram illustrating a cable fault detection mapping system suitable for using the locator 102 from FIG. 12C. In FIG. 14, a cable fault attachment comprising one or more electrodes coupled by means of the Attachment Mounting Interface 104 in locator 102 is seen using a remote ground probe 1404 to which it is attached by a clamp 1402 and a coil cord 1414 from the locator 102. Further in FIG. 14, a dipole navigational beacon 1406 is deployed at a distance from locator 102. The beacon 1406 emits a dipole field 1408 detectable by the antenna arrays 108-112 of locator 102. In FIG. 14, the locator system 102 is used to isolate the location of fault 1410 by mapping the gradients of the composite field 1412, which are in part shaped by the dynamics of the electrical fault to ground 1410 caused, for example, by abraded insulation in the target cable. Comparing multiple measurements of electrical potential and combining their information with the measured location of the beacon 1406 can provide a solution for the location of fault 1410. As may be appreciated by those skilled in the art, the method described may be conducted with as few as one single electrode and a remote connected ground probe, or with any combination of multiple electrodes found to be advantageous in application. The user display, in such an implementation, guides the user to the point of maximum potential, which places him directly over fault 1410 in this scenario.

Figure 15:
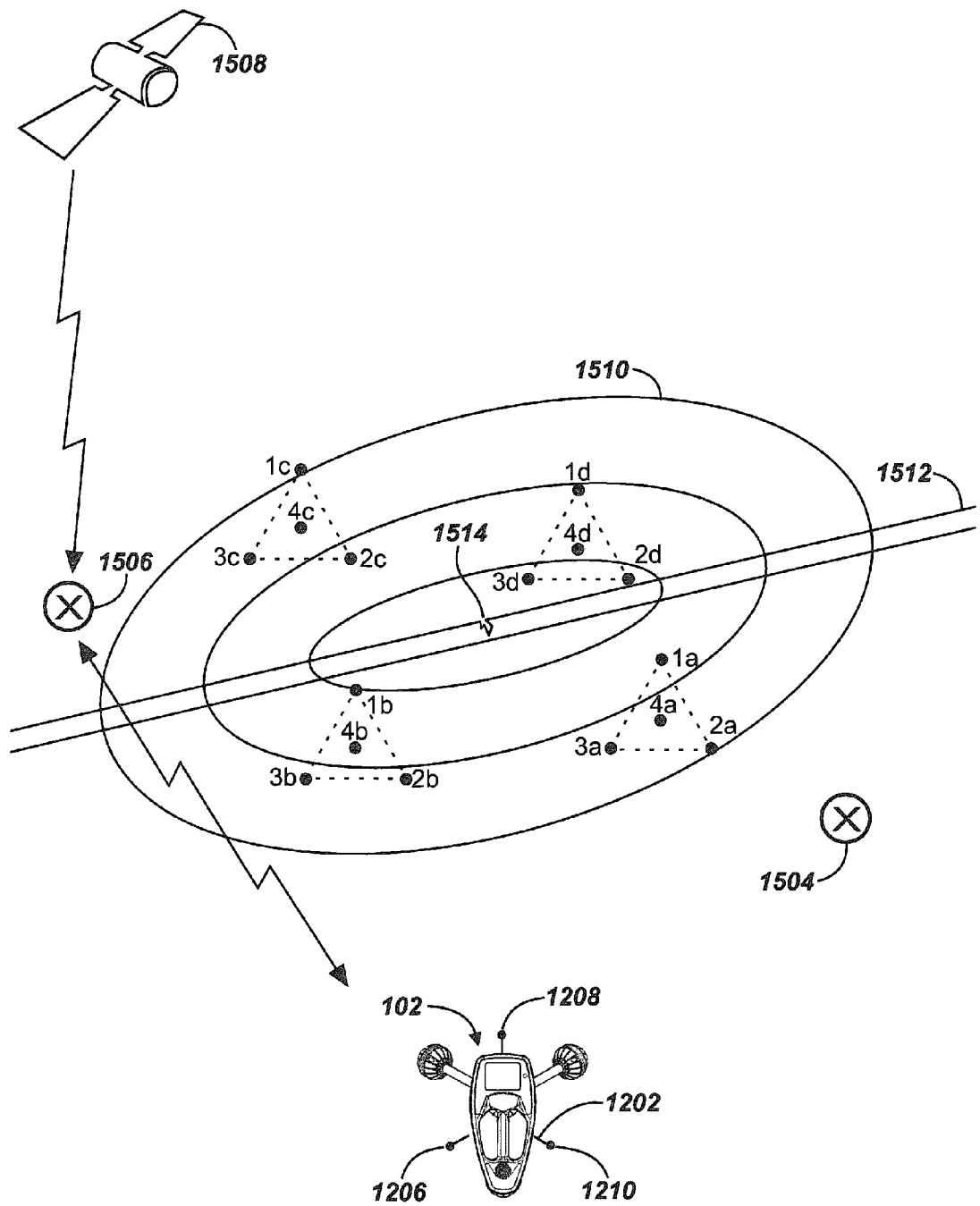
FIG. 15 is a schematic diagram illustrating a soil conductance mapping system suitable for using the locator from FIG. 14A.
Figure 16:
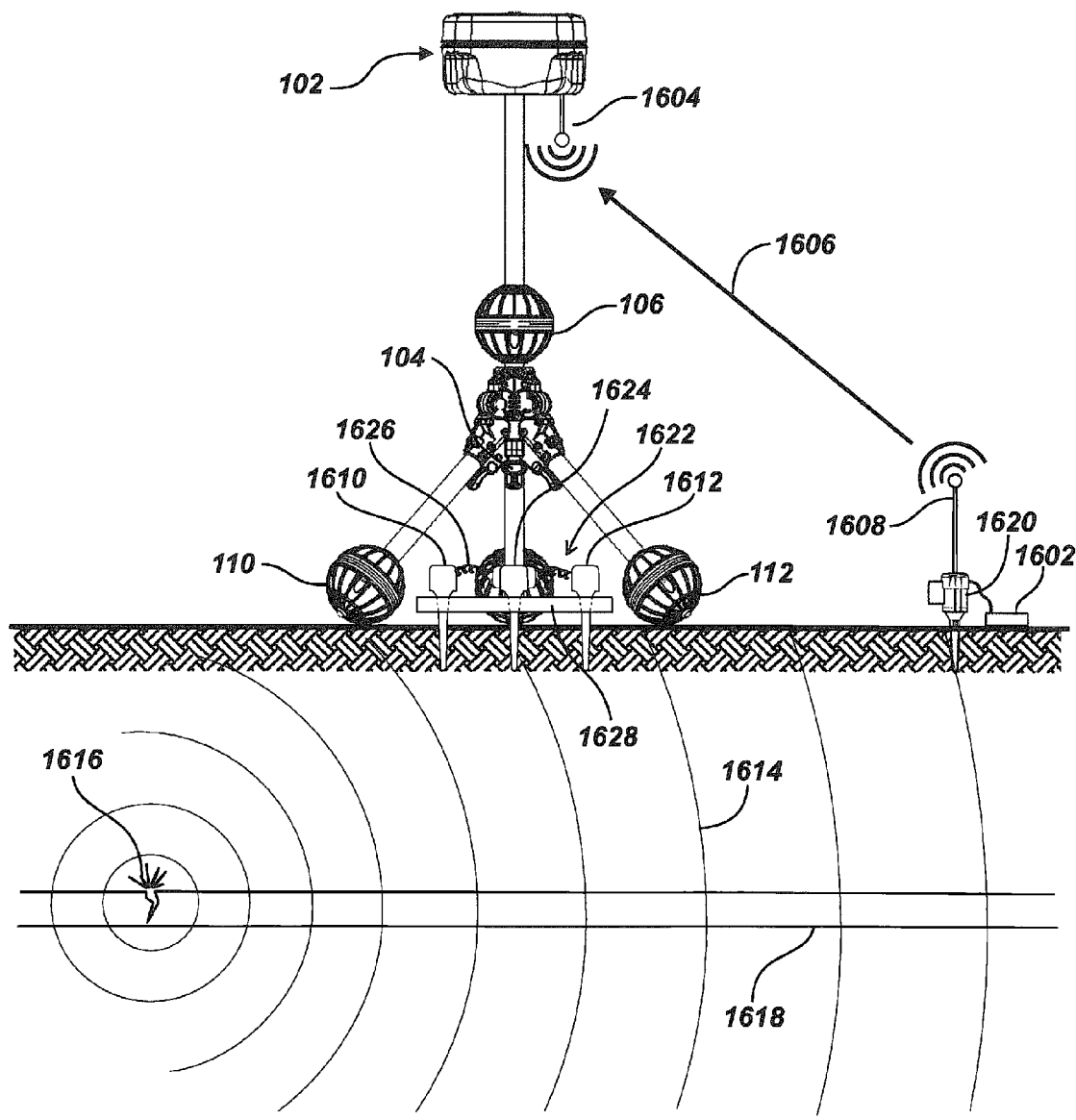
FIG. 16 is a front view of the locator from FIG. 3 in an open disposition for operation with the accessory mounting interface coupled to an exemplary geophone array accessory embodiment disposed according to an acoustic leak detection method embodiment.

FIG. 15 is a schematic diagram illustrating a soil conductance mapping system suitable for using the locator from FIG. 14. In FIG. 15 locator 102 is used to determine voltage gradients as described above in multiple locations (labeled as a, b, c, and d in FIG. 15) for use in constructing a voltage map of an area. The soil conductance variability caused by moisture from a water leak 1514 in a buried pipe 1512 influences the resultant soil conductivity map, which can lead to locating leak 1514. In doing so, the locator measures and stores in memory the electrical potential readings from each of the four probes at each of the four points 1a, 2a, 3a, 4a, for example. In FIG. 15, a positional reference beacon 1504 that emits a dipole field detectable and measurable by locator 102 provides positional information to the locator. A second positional reference beacon 1506 is equipped with a similar dipole emitter as well as a GPS receiver. The beacon 1506 emits a dipole field that can be sensed and measured by locator 102. A data link using Bluetooth or Zigbee or similar wireless protocols may be integrated into any of the several devices used in conjunction with the locator 102; here, such a link connects beacon 1506 with locator 102 and provides world-coordinate location data to it. Note that remote beacons such as those used here may be located relative to locator 102 by the use of dipole field detection or by wireless transmission of GPS data where such a beacon is so equipped. The background lines represent iso-voltaic lines in a voltage gradient map. It may be appreciated by those skilled in the art that a method of using one or more probes and a common ground stake attached by means of a coil cord, for example, as shown in FIG. 14, is useful in the mapping scenario shown in FIG. 15, and that fewer probes may otherwise be employed, as found to be advantageous in a specific application. In conductance mapping applications, a voltage may be injected at one probe and measurement of the potential or current taken at another probe. Such a high-impedance measuring system is useful for measuring soil conductivity in terms of voltage or current, or both The Leak Detection Accessory According to another embodiment, the attached accessory sensor system may be embodied as one or more acoustic sensors adapted for coupling to the ground. Such sensors facilitate use of the locator system in locating physical leaks from pipes carrying fluids such as water by sensing and analyzing relative strengths and patterns of sound signals. FIG. 16 is a front view of the locator 102 from FIG. 3 in an open disposition for operation with the accessory mounting interface 104 coupled to an exemplary geophone array accessory embodiment 1622 disposed for use according to an acoustic leak detection method embodiment. In FIG. 16, locator 102 is coupled through its accessory mounting interface 104 with an array 1628 containing three geophones 1610, 1612, and 1624 triangularly disposed in a rigid frame such that the sensor ends of the geophones are placed into or on the ground. In an alternative embodiment, the geophones may be extended on coil cords exemplified by the coil cord 1626, and deployed some distance away from the locator 102. Dipole location beacons (not shown) may be included in geophones to provide accurate positional location relative to locator 102. Dipoles may be continuous or intermittent in operation. A separate free-standing geophone 1620 is also shown inserted into the ground at a distance from the locator 102 and equipped with a battery unit 1602 and with a two-way wireless link 1608 by means of which detections made by geophone 1620 and their times of detection are transmitted along a path 1606 in real time to a wireless link 1604 in the locator 102. Further in FIG. 16, a buried pipe 1618 with a leak 1616 at an unknown location is shown, from which escape sound waves 1614 caused by the turbulent passage of liquid through the leak. The sound waves are detected by geophone sensors 1610, 1612, 1620 and 1624 at different times, as a function of the speed of sound through the particular soil being probed. By correlating sound wave detections digitally, the locator 102 may determine the bearing and distance to the source of sound waves 1614 and thereby determine a probable location of the leak 1616, using any useful methods known to the art for correlation and cross-correlation of signals.

The Acoustic Imaging and Mapping Accessory

Figure 17A:
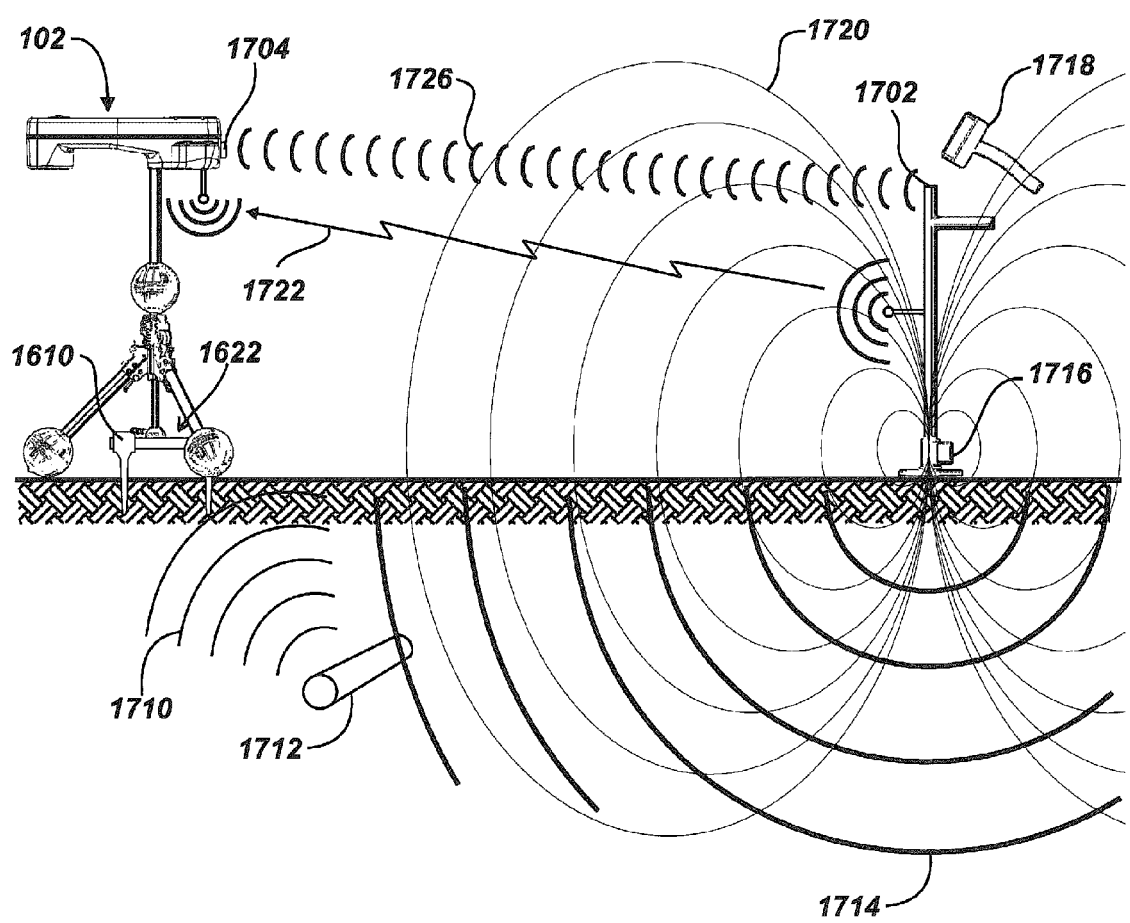
FIG. 17A is a schematic diagram illustrating an exemplary acoustic mapping system and method of this embodiment employing the locator from FIG. 16.

Attention is now directed to FIG. 17A. According to another embodiment, the attached accessory includes one or more acoustic sensors that can be coupled to the ground and a separately moveable acoustic transmitter that has an attached magnetic dipole transmitter, the position of which can be tracked by the portable mapping locator.

A method of acoustically mapping a subsurface region is introduced for tracking a dipole transmitter attached to an acoustic transmitter while employing acoustic sensors in a known positional relationship to the acoustic transmitter, where a transmitted sound pulse can be timed (e.g., by means of wireless communications) to establish an acoustic pulse starting time at the portable locator. Alternatively, the transmitted sound pulse may be timed with one or more microphones on the mapping locator to detect the air-coupled transmitted sound pulse.

According to another embodiment, the attached accessory includes one or more acoustic transmitters that can be coupled to the ground. According to yet another embodiment, the attached accessory includes one or more acoustic sensors and one or more acoustic transmitters that can be coupled to the ground. According to another embodiment, the several transmitters and sensors not directly connected to the mapping locator may be linked to it through a wireless data link such as by Bluetooth, Zigbee or other wireless protocol.

Figure 17B:
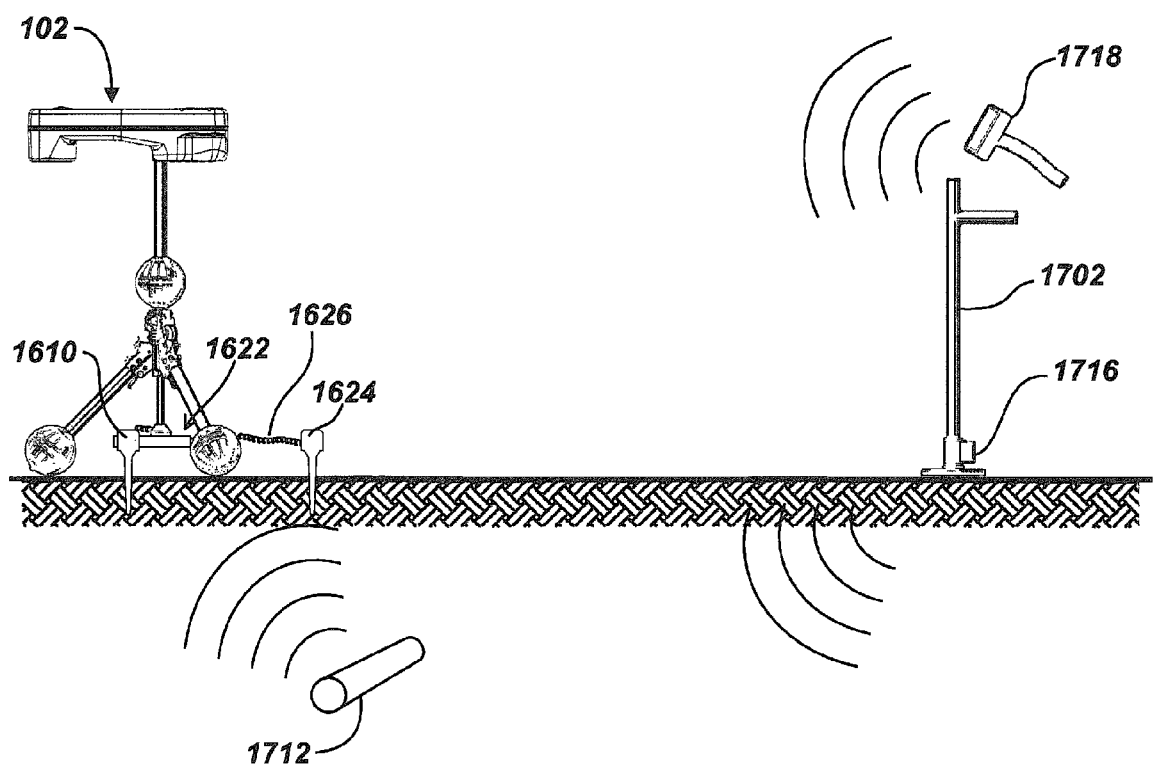
FIG. 17B is a side view of the locator from FIG. 1 in an open disposition for operation with the accessory mounting interface coupled to an alternative geophone array accessory embodiment disposed according to an acoustic mapping method embodiment.

FIG. 17A is a schematic diagram illustrating an exemplary acoustic mapping system embodiment and method employing the locator 102 from FIG. 16. In FIG. 17A, a mapping locator 102 is equipped with at least one microphone 1704 and is shown with the geophone array accessory 1622 coupled to the locator 102 through the accessory mounting interface 104. FIG. 17B shows the scenario from FIG. 17A, with an alternative geophone embodiment 1624 disposed remotely from the locator 102 and connected by means of a coil cord 1626. In FIG. 17A, a sound-generating device embodiment capable of injecting significant sound energy into the ground is shown to include a steel column 1702 struck by a heavy hammer 1718. Any other useful device may be used, such as a sonic boomer or a cartridge-firing nail gun, for example, or any other device or method for injecting sufficient sonic energy into the ground at a known moment. In FIG. 17A, the sound generating device is equipped with a dipole transmitting beacon 1716 that can be detected and whose location can be measured by the locator 102, and is further optionally equipped with a wireless link capable of transmitting a timing signal 1722 to the locator when the column in this example is struck. As illustrated, the strong sound energy 1714 emitted from the column when struck travels through the soil and is reflected from a buried pipe 1712. The reflected sound energy 1710 is detected by the geophone array 1622. The locator also detects the original sound waves 1726 from the striker 1718 hitting the column 1702, by means of at least one built in microphone 1704. Both the primary sound impulse 1714 and the reflected sound 1710 are detected at slightly different instants in time by the several geophone sensors 1610, 1612, and 1624, which are components of the accessory sensor array 1622. Note that where geophone element 1624 is disposed remotely from the locator 102 on a coil cord 1626, some means is required for determining the exact distance from locator 102 to geophone 1624, such as a small dipole embedded into the geophone and detectable by the locator 102, or a useful mechanical means for measuring or defining the distance, for example. Each of the sound signals arriving at the locator is time-tagged digitally, and the comparison of the timing of these various signals with the optional radio-link timing signal 1722 and the known location of the dipole transmitter 1716 enables the mapping locator to determine the relative distance of the buried pipe 1712 from more than one point, thereby facilitating computation of its bearing. Any useful correlation and cross-correlation techniques may be used in processing the signal data for direct and reflected sound impulses.

Figure 17C:
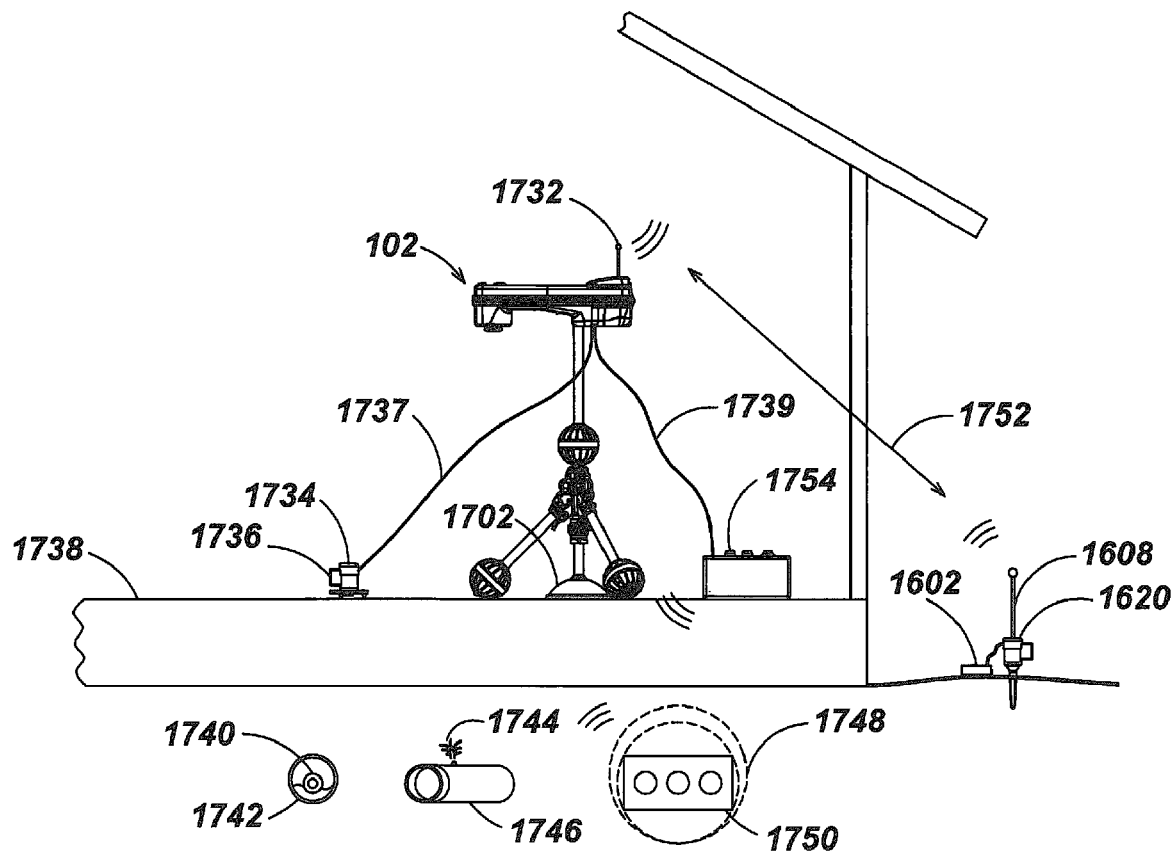
FIG. 17C is a schematic diagram illustrating an alternative acoustic mapping system and method embodiment employing the locator from FIG. 11A and other accessories.

FIG. 17C illustrates an acoustic mapping system and method. An optional external geophone 1620 is equipped with a dipole coil, an external battery 1602 and an antenna 1608 for exchanging signals and data bidirectionally along line-of-sight 1752 with locator 102. A mapping locator 102 is shown with an alternate embodiment of the geophone sensor coupled to it by means of the accessory mounting interface, in this case a flat-surface geophone 1702 suitable for use on a flat hard surface such as a floor or concrete slab, for example. An optional separate geophone 1734 with its own dipole coil 1736 is shown connected to the locator by an optional wire connector 1737. Also connected to the locator 102 by a separate wired connector 1739 is an optional acoustic source 1754 that may also contain a battery power supply (not shown) to extend operation time. Further in FIG. 17C, the underground area is shown to be populated with a buried three-line conduit 1750 that emanates electromagnetic flux 1748 by reason of electric current being carried in one or more of its conductors, such flux being detectable by the locator 102; a water-pipe 1746 that has a leak 1744; and by a sewer line 1742 into which has been placed a pipe-inspection camera 1740 on a push cable (not shown), equipped with its own dipole sonde. The locator 102 is disposed on a concrete slab 1738 and operates to simultaneously detect and report the locations of each of the targets illustrated. Sound pulses emitted by the acoustic source 1754 are detected by the several geophones 1608, 1702, and 1736 at different times depending on the transmitting media, and are reflected from objects 1740, 1746, and 1750, which reflections are similarly detected at varying delay times with respect to the corresponding impulses from source 1754. When combined with timing signals provided by the acoustic source 1754 and the time-tagged detection information relayed by the several geophones, this provides sufficient information to locator system 102 to facilitate the computation of an acoustic map of the reflecting objects.

Figure 17D:
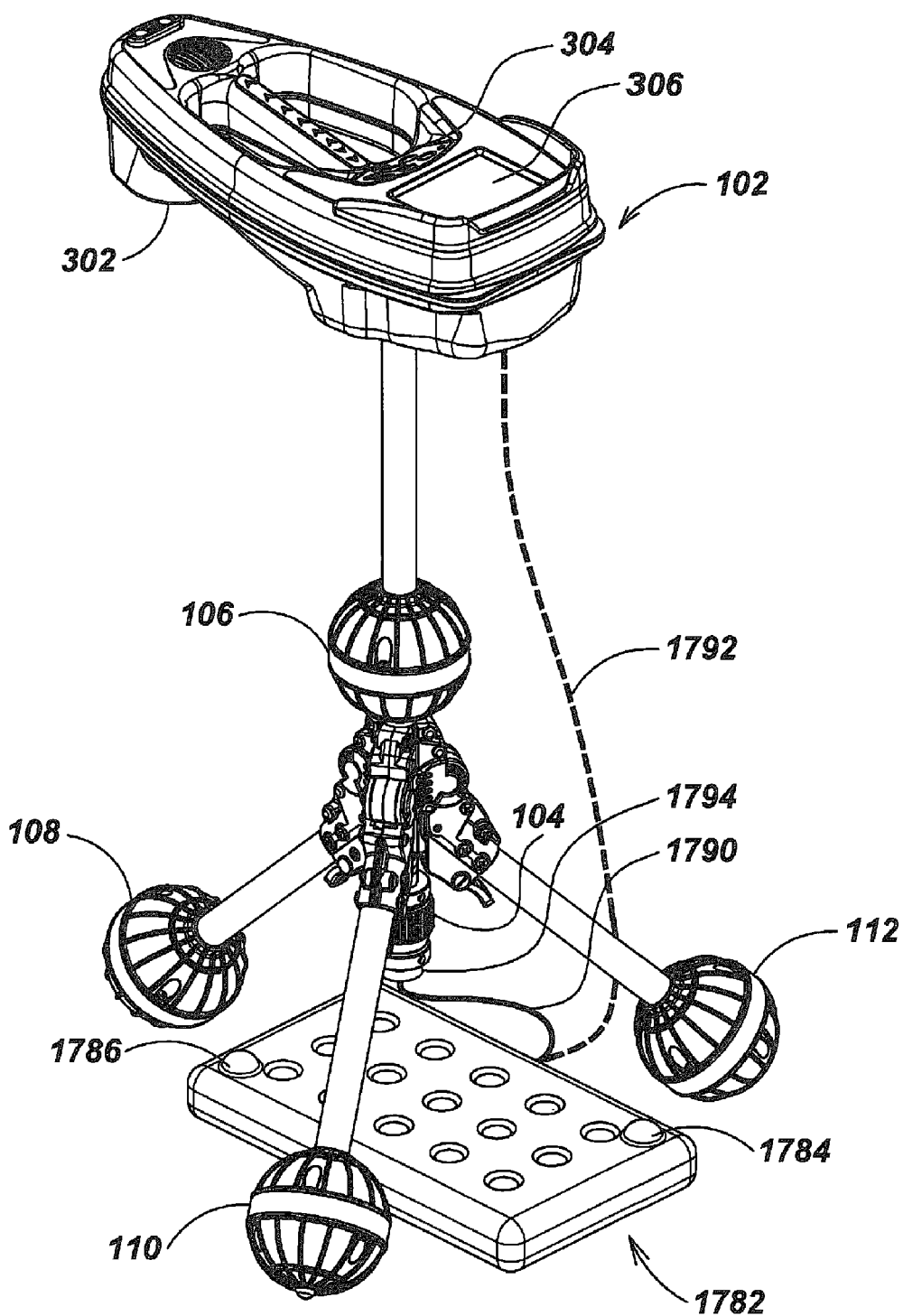
FIG. 17D is a top perspective view of the locator from FIG. 1 in an open disposition for operation and coupled to an alternative geophone array accessory embodiment.

FIG. 17D is a top perspective view of the locator 102 in an open disposition for operation and coupled by a wired connector to an acoustic receiving array 1782. In such a configuration, the accessory mounting interface 104 may be left unoccupied. Alternatively, as shown here, the acoustic array accessory 1782 may be equipped with a cable 1790 terminating in a plug 1794 adapted to couple to the accessory mounting interface 104, thereby facilitating transfer of power and data through the AIM 104. The acoustic receiving array embodiment 1782 includes two embedded dipoles 1784 and 1786, each distinguishable by the frequency or the modulation of the respective emitted EM field, are disposed within two opposing corners of the array 1782, thereby providing means for the locator system 102 to detect the relative location of array 1782. The array 1782 includes a multiplicity of acoustic sensors and locator 102 incorporates means for distinguishing and integrating acoustic sensor signal information into an acoustic map, either through embedded processing and program elements (not shown) within the array 1782 or by program element means (FIG. 27) in the locator system 102.

Many useful methods for the acoustic location of buried utilities and utility faults are known in the art. Electrical faults in cables can be made to produce sound by repetitively energizing the cable with a large capacitor. Each discharge of the cable produces a "thump" at the site of the fault. Simple mechanical and electronically amplified stethoscopes can be used to iteratively search for fluid leaks in pipes and the thumps produced in faulted cables. Proper usage of such devices presupposes a knowledge of the location of the pipe; see, for example, "Instructions for using Globe Geophone" by Heath Consultants. Digital signal processing can be applied to the signals from several geophones to beam form. The inclusion of geophone beam forming and/or cross correlation in a portable locator enables several new techniques. The portable locator can often locate both the leaking utility and nearby buried utilities by stray electromagnetic emissions from the utilities and show on a portable display the location of the leak relative to nearby utilities.

The portable locator system embodiment with an acoustic detection accessory can be used to insure that the acoustic detectors are placed advantageously with respect to the buried utility. Many soils are strongly attenuating for sound. Acoustic sensors that are misplaced even a few meters may not receive any usable acoustic signal. The acoustic detector accessories may include low frequency magnetic dipole sources that can be tracked by the portable electromagnetic locator. The acoustic processing scheme embedded into the portable locator thus has access to both the relative position and orientation of the acoustic sensors. Relative orientation is particularly important in the case where the acoustic sensors are three-axis sensors. The acoustic signal from interfering noise sources often propagates as a ground wave with substantial horizontal components, where the leak signal or thumper signal are generally nearly vertical. Usually the horizontal components of the acoustic signal arrive from a different azimuth than the interfering signals. Knowledge of the relative orientations of sensors and utilities can be used to facilitate the construction and training of adaptive noise canceling filters, adaptive beam formers, and matched-field processing.

A variety of sound sources may be included as accessories for the portable locator system 102. Impulsive hammers may be manually actuated or pneumatically, electrically, or hydraulically actuated. When tracking a horizontal drill, for example, the acoustic source can be driven by energy from the available pressurized drilling mud. The horizontal drill acoustic source may be specifically designed as an acoustic source or the noise may be produced by a rock drill hammer attached to the string, for example. Often the noise produced by the interaction of the drill head with rocks and cobble produces sufficient acoustic energy to permit acoustic tracking of the drill string and acoustic imaging of nearby utilities, for example.

Some parameters of pipes may be derived from the acoustic energy scattered by the pipes. The lowest frequencies modes of pipes are breathing modes. In the breathing modes, the prime contours of the cylindrical shell move in and out. At mid-frequencies, anti-symmetric and symmetric leaky Lamb waves are strong contributors to the scattering. The high frequency scattering is controlled by the wall thickness of the scattering pipe or conduit.

An acoustic sensor can be embodied as, for example, electromagnetic moving coil, moving magnet, piezoelectric, or a combination thereof for greater bandwidth. Piezoelectric sensors have the advantage of less coupling from the navigation sondes to the acoustic sensor. In most applications, the sonde can be turned off after 10 to 20 seconds of position integration, so electromagnetic inference is not a problem. A recurring problem in leak detection and seismic imaging is wind noise coupling into the acoustic sensors or geophones. The locator system may include several other microphones that are reasonably decoupled from ground motion and suitable for use in adaptive noise cancellation. Multiple microphones each with a cardioid or other directional beam pattern may be used to facilitate cancellation of several different noise sources, for example. Suitable geophones include both unidirectional phones and multidirectional phones responding to sound from multiple axes. Geophones in this embodiment may be either uni- or multi-directional.

Because dry soils are poor transmitters of acoustic energy, they transmit GPR energy well; conversely, moist soils defeat GPR by dissipating the energy injected from a GPR Tx device rapidly, while moist soils lend themselves to good results in acoustic scanning. An additional advantage of acoustic tomography is that it identifies plastic pipes that cannot be traced by normal locating techniques in the absence of a tracing wire. The acoustic array 1782 described herein, or the geophone array 1622 shown in FIG. 16, may also be employed in a method known as "acoustic day lighting," under suitable conditions. In this approach, the ambient sound caused by, for example, passing trucks, railroad trains, or cars in an urban environment, provides enough ambient energy to enable detection of buried objects by passive receipt of reflected sounds.

Both the microphones and the acoustic sensors can include low-noise preamplifiers before capturing the signal at 24-bit analog-to-digital converters (ADCs) such as the Texas Instruments ADS1252. The signals may be processed in a fixed-point processor such as the TMS320VC5441, which has the 12 MB/S ports capable of interfacing with ADCs such as the ADS1252.

The Cycle-Skipping Phase-Encoding Method

FIGS. 18A-18F are schematic diagrams and charts illustrating an embodiment of the cycle-skipping method for encoding and transmitting relative phase information. The preferred method is to periodically phase-flip an alternating-current (AC) drive waveform by dropping half-cycles at pre-determined intervals. The drive waveform may be a square-wave output that is direct connected to the target utility, or it may be an induced sinusoidal waveform. An induced waveform is preferably created in a high-Q LC-tank circuit adapted for suspending the tank oscillation by switching the capacitor (C) out of the tank circuit (by open-circuiting C) at maximum capacitor voltage or, alternatively, by switching the coil (L) out of the tank circuit (by short-circuiting L) at maximum coil current. This display method is modulated by and cooperates with the defocused line display method described herein below.

The method of cycle-skipping is used to interpret phase, and therefore current direction, and can be used with direct-connect locating to indicate the direction of current flow with respect to the locator system position. The technique may also be designed into trans-mitters by suspending resonant high-Q tank resonators in an inductive transmitter, as described. In an alternative embodiment, a skipped fractional-cycle transmission will permit information transmission from a sonde, from a drill head used in HDD applications, or from a buried EM marker, for example. The cycle-skipping method may skip entire cycles, which advantageously maintains signal phase, or may skip fractional cycles (e.g., half-cycles), which provides easier detection by locator system 102. A predetermined skipping pattern may be selected for the temporal asymmetry necessary to facilitate phase identification. Half-cycle skipping can be implemented as a phase lock loop (PLL) circuit.

Figure 18A:
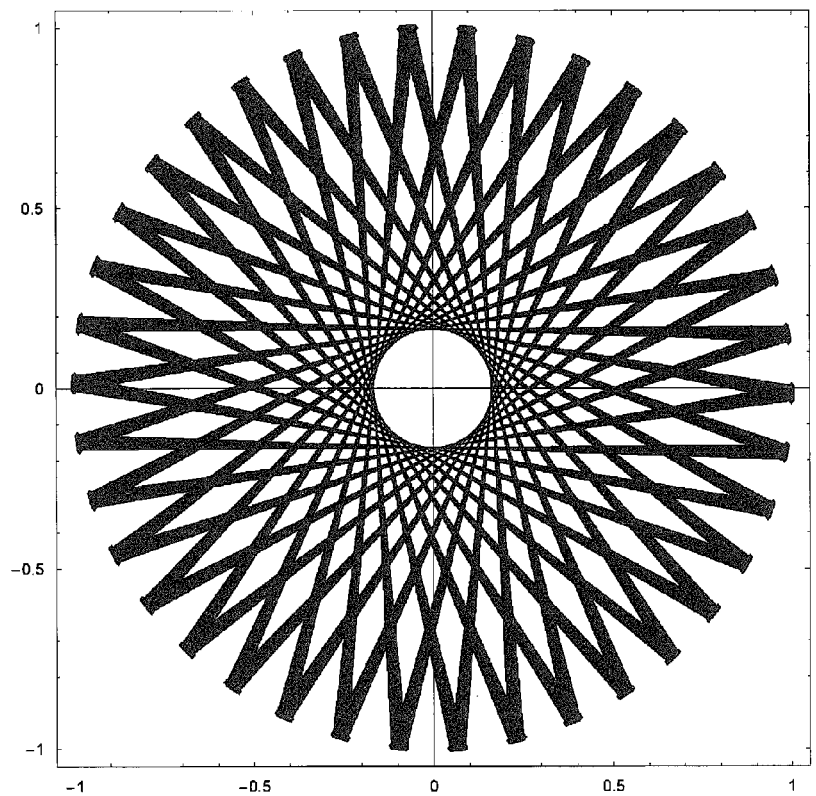
Figure 18B:
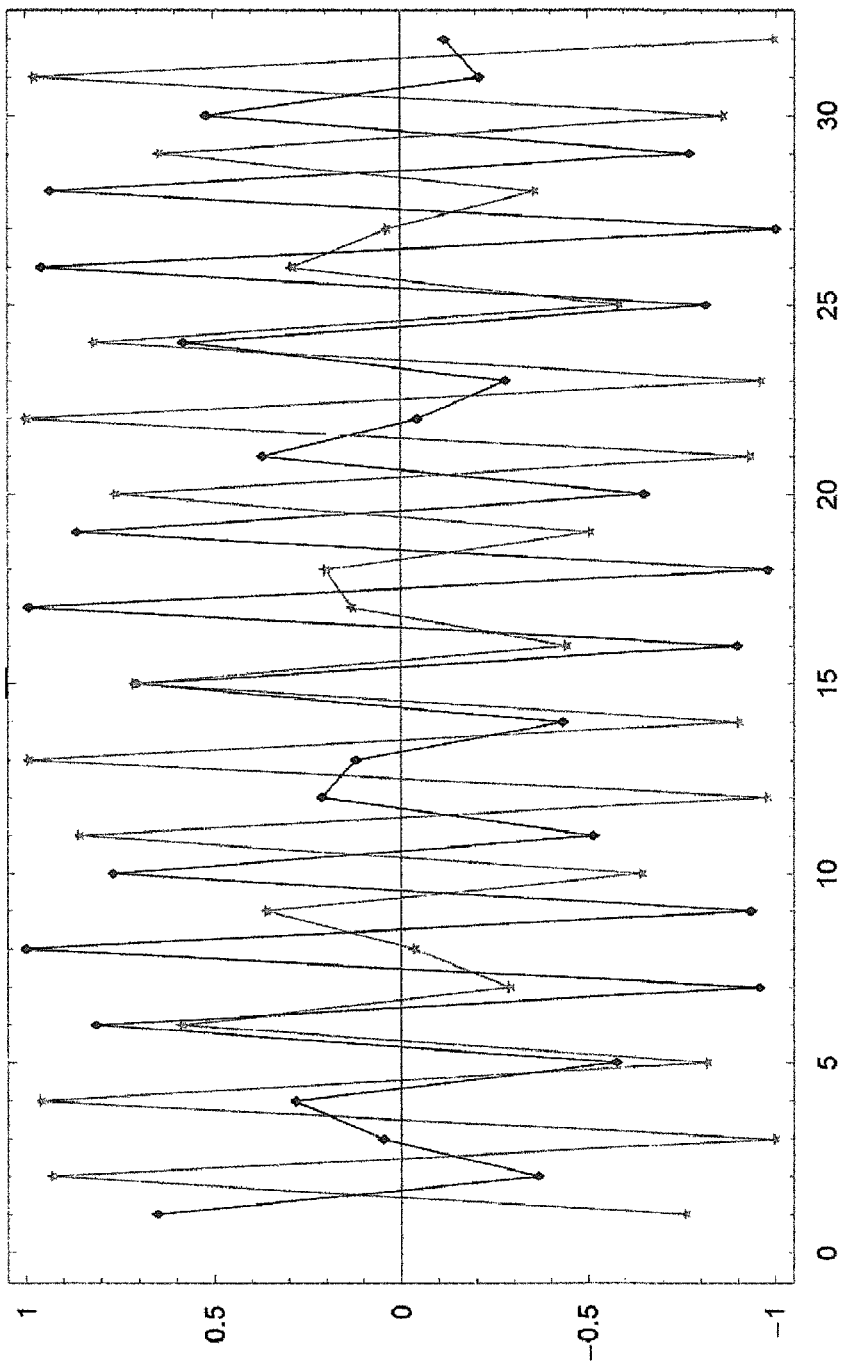
Figure 18D:
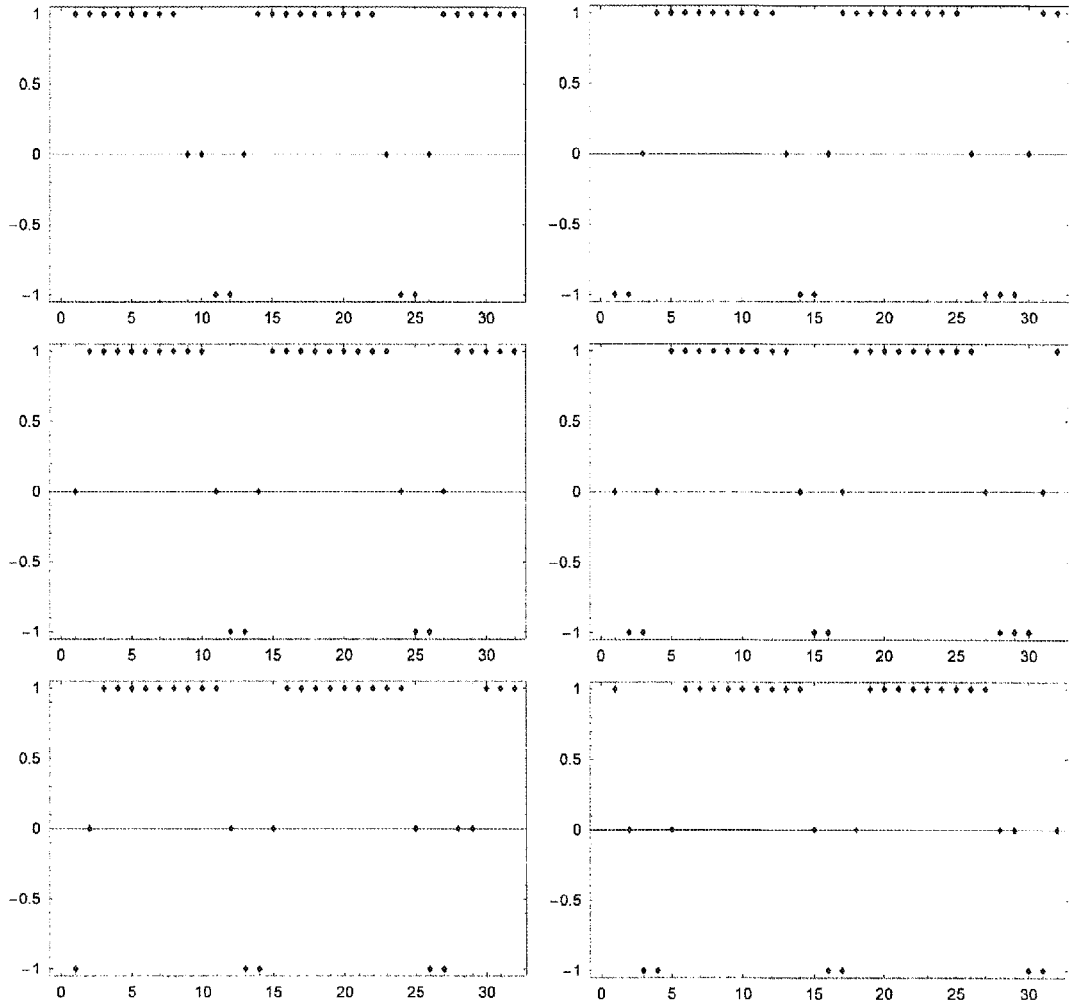
Figure 18E:
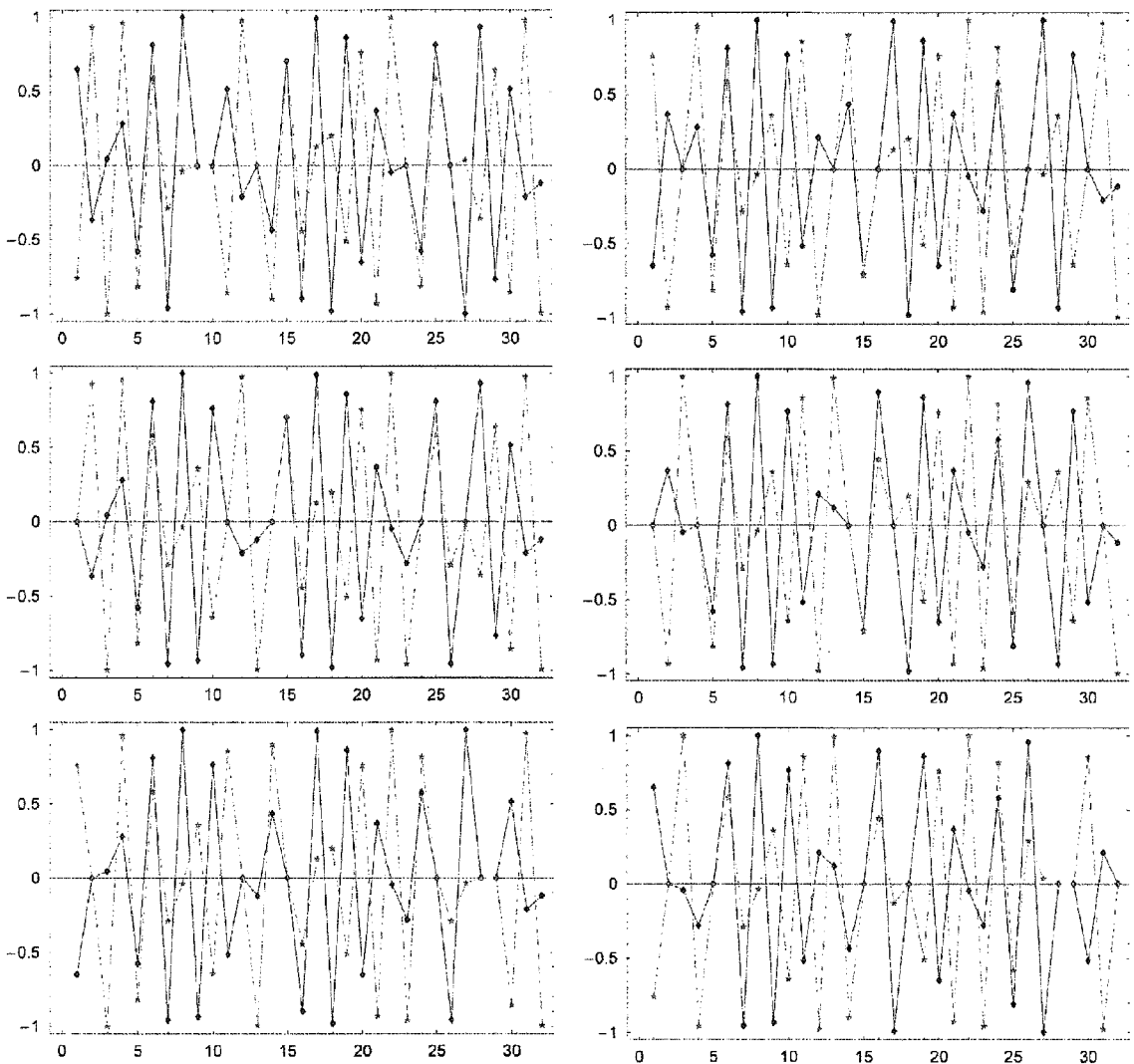
Figure 18F:
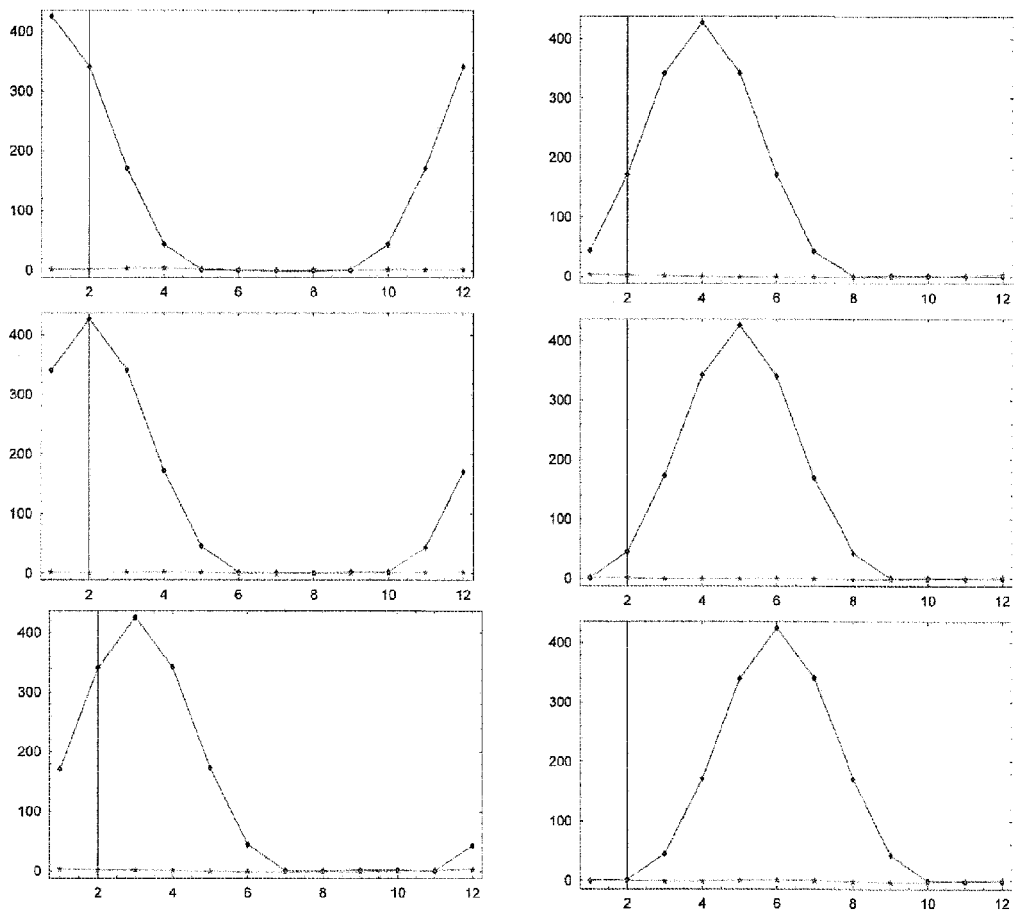

FIGS. 18A through 18F are a disclosure of an exemplary mathematical method by which a cycle-skipping technique can be used to calculate phase and current direction. Other approaches may be used. FIG. 18A shows a plot of an unmodulated waveform against a unit circle, with real values plotted on the x axis and imaginary numbers on the y axis. An example of the unmodulated waveform as received from an antenna node is illustrated in FIG. 18B. FIG. 18C describes a series of Mathematica functions for producing half-cycle modulation patterns, which produce the positive, negative or zero values shown in FIG. 18D when applied. These modulation values are used as inputs to modulate a local oscillator, with output results shown in FIG. 18E. A cross-correlation of input signal and reference signal is then performed using the functions described in FIG. 18F, with the resultant values shown. These post-filtering values are positive for a current in one direction, such as away from the transmitter, and negative for a current direction in the opposite direction, such as approaching the transmitter. The phase values are greater than zero in FIG. 18F. The positive or negative sign of the signals in FIG. 18F are available in locator system 102 for use in providing a phase-encoded graphical user interface (GUI) diagram on display 306 (FIG. 3), for example, as is now described.

The Phase Encoding Display Method

Figure 19A:
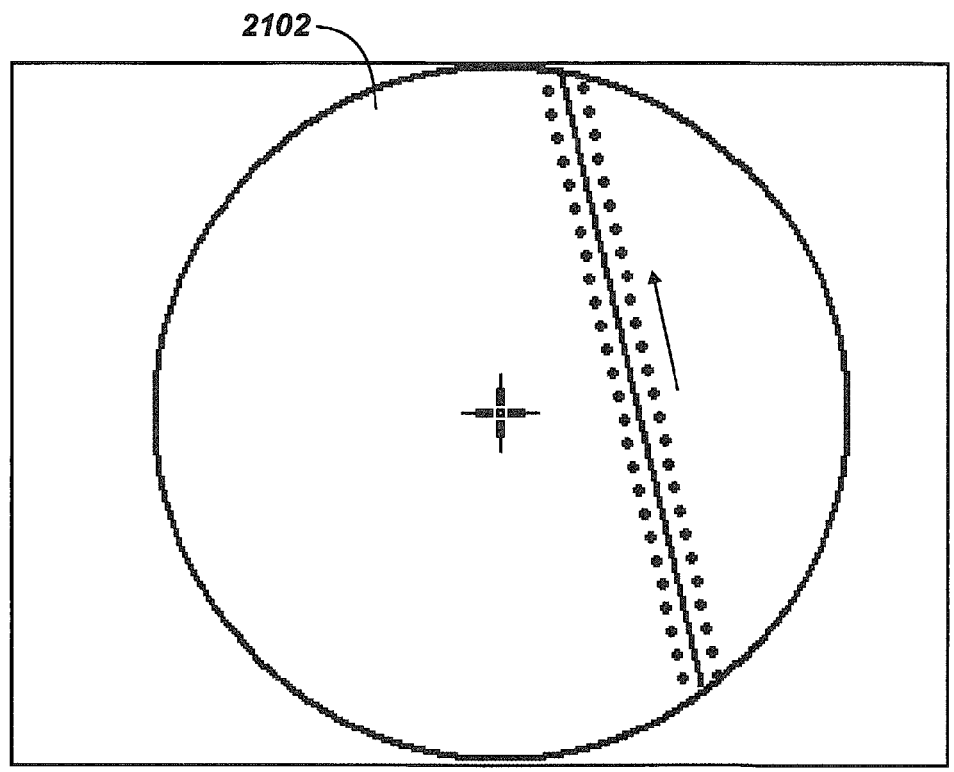
FIG. 19A is a diagram illustrating a graphical user interface (GUI) diagram for indicating relative signal phase to a locator user according to an exemplary method embodiment.

FIG. 19A a graphical user interface (GUI) diagram illustrates an exemplary embodiment of a method for indicating relative signal phase to a locator user. In FIG. 19A, the display mapping area 2102 of the locator is shown displaying a detected line with moving dots shown on either side of it. The dots on the sides of the trace line are displayed as moving in lock-step, either toward the top of the display or toward the bottom, depending on the display indicator representing the detected current direction. The current direction is calculated from the phase direction determined by the fractional cycle-skipping phase-encoding method discussed above.

Figure 19B:
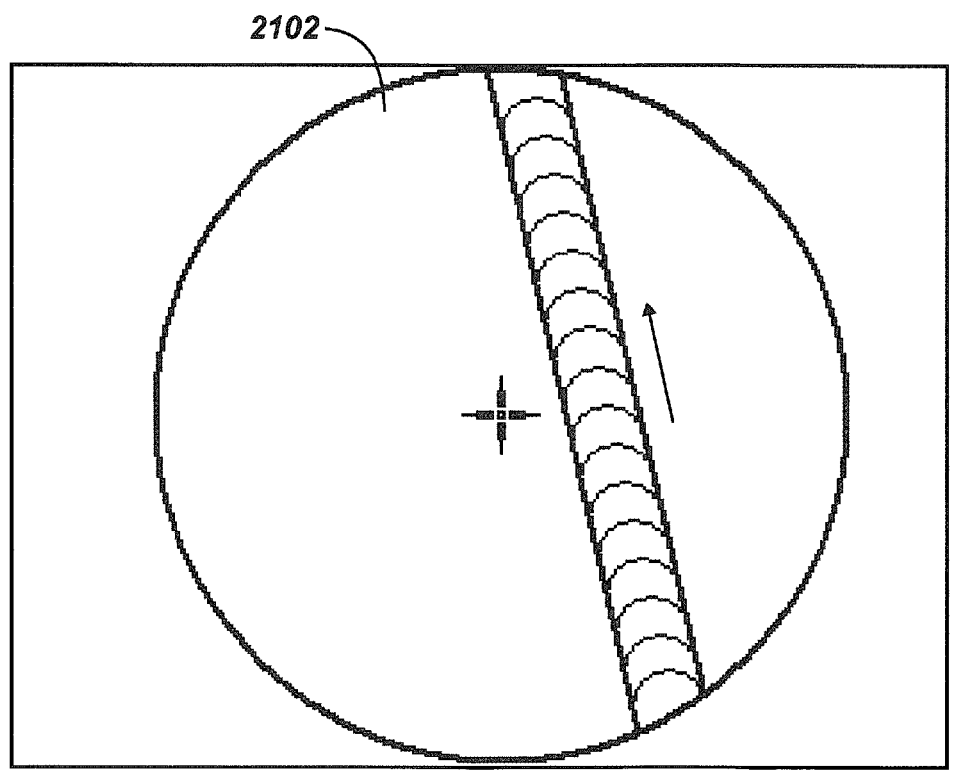
FIG. 19B is a diagram illustrating a graphical user interface (GUI) diagram for indicating relative signal phase to a locator user according to an alternative method embodiment.

The visual indicator display shows current direction, which is directly correlated to phase, along a linear display feature representing the detected line, by using the apparent motion of objects in the display moving along the direction of the linear feature. This is referred to by some as a "marquee" type of display and by others as a "crawling line" display. Current direction may also be represented by drifting clouds, chevrons, arrows, or particles, for example. The specific visual indicator may be embodied as any useful image for conveying a sense of motion along a linear object displayed as representative of the detected utility line, pipe or cable. Another preferred embodiment is shown in FIG. 19B, in which the visual indicator used is a series of arc-segments within a channel aligned to represent the detected utility line and indicating current direction by the direction of their curve. A simple arrow may also be employed.

The Variable Time-Bandwidth Locator System Processing Method

Figure 20A:
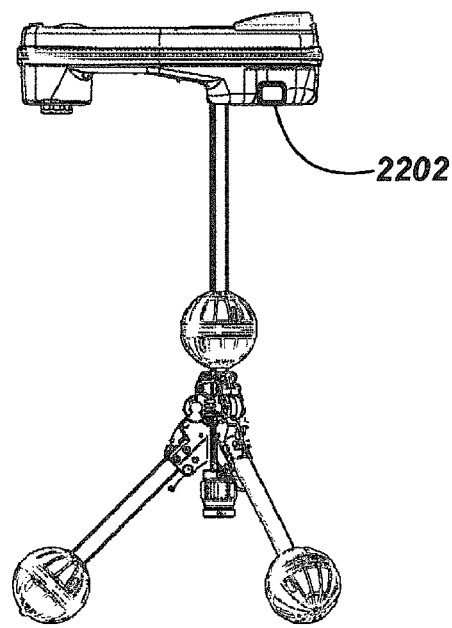
FIGS. 20A-20E are graphical diagrams illustrating a variable band pass filter processing method using a long time period to reduce digital filter bandwidth and improve signal-to-noise ratio (SNR)

FIG. 20A illustrates another locator embodiment that is equipped with variable time-bandwidth filtering circuits for significantly improving the displayed signal when provided with data samples sufficient to identify noise elements.

Figure 20B:
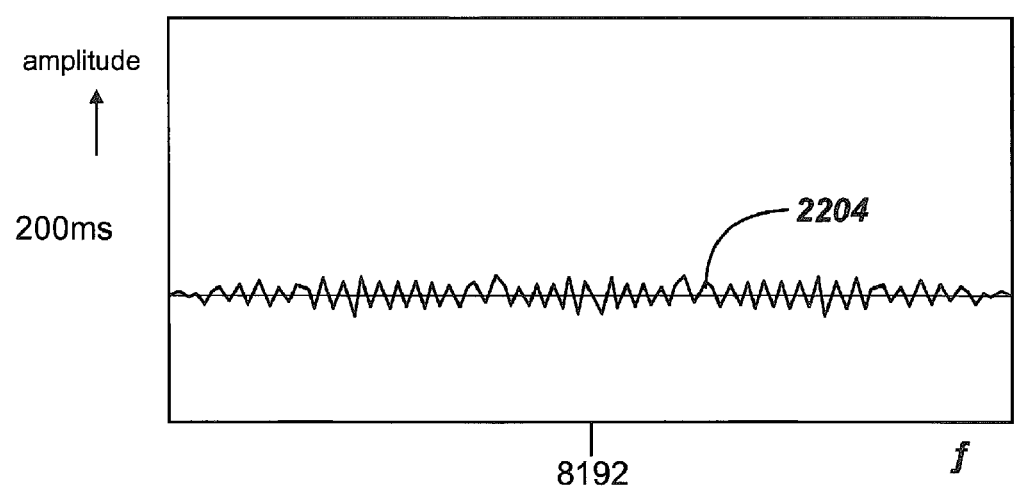
Figure 20C:
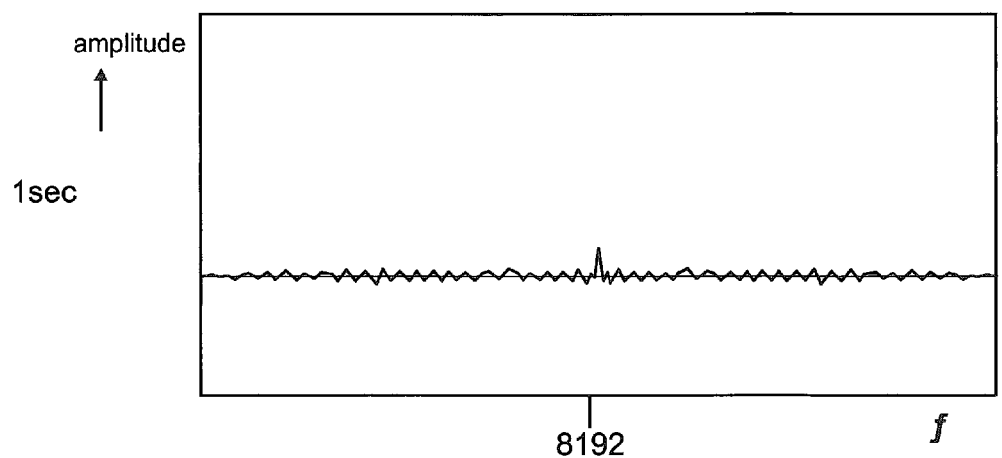
Figure 20D:
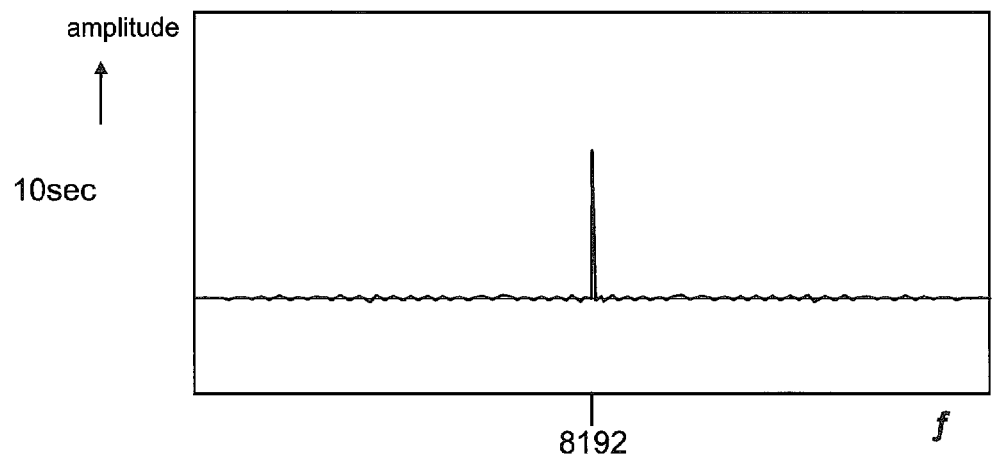
Figure 20E:
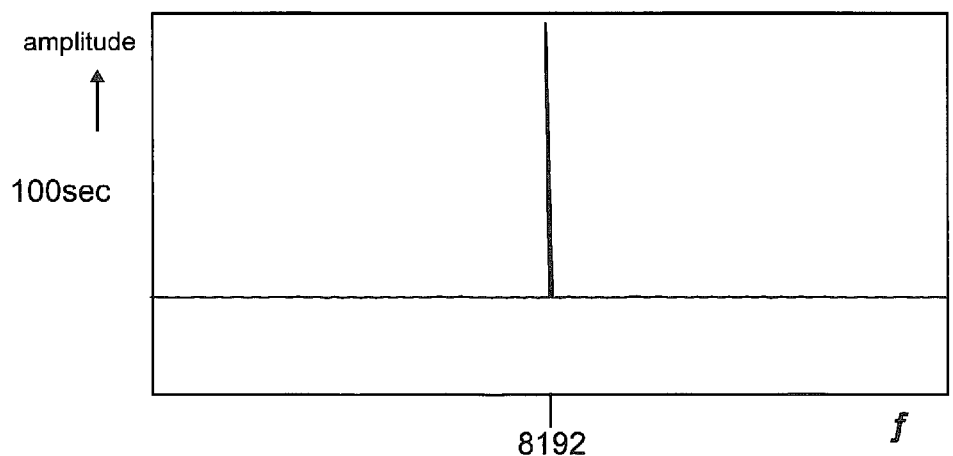

FIGS. 20B-E are graphical diagrams illustrating a variable bandpass filter processing method performed by one or more program elements (FIG. 27) in the locator processor 2202 (FIG. 20A) that uses a long accumulation time to improve signal-to-noise ratio (SNR). FIG. 20B is a chart showing an exemplary signal waveform 2204 captured by a locator system 102 that is processing antenna node (106-112) detections integrated over a time-window of 200 milliseconds, with the locator system passband centered on 8192 Hz as a frequency of interest. As shown, the signal at the frequency of interest in FIG. 20A is buried in ambient noise and cannot be visually distinguished. FIG. 20C depicts the same signal as it may appear when the locator continues to receive and process signal samples at the location used in for signal 2204 in FIG. 20A for an integration period of 1 second. FIG. 20D depicts the same signal as it may appear when the locator remains stationary and continues receives and processes signal samples for a period of ten seconds, with a corresponding increase in SNR. FIG. 20E depicts the same signal displayed after an integration period of 100 seconds.

Figure 20F:
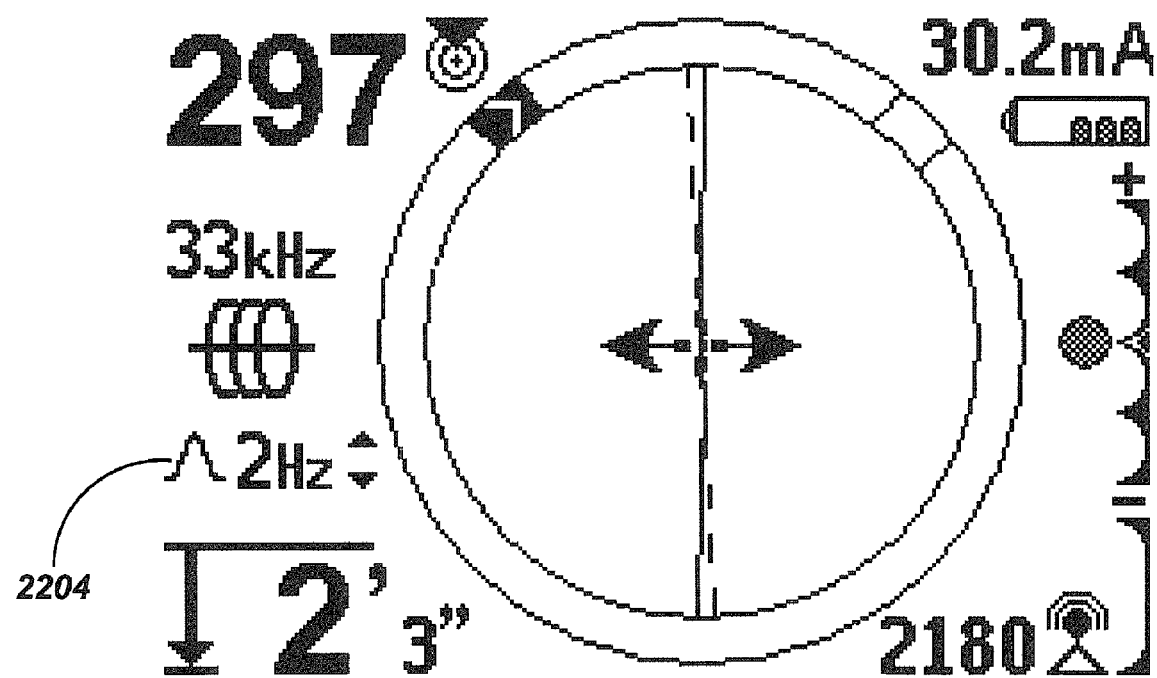
FIG. 20F is a diagram illustrating a GUI control indicator for the processing method for FIGS. 20A-E.
Figure 27:
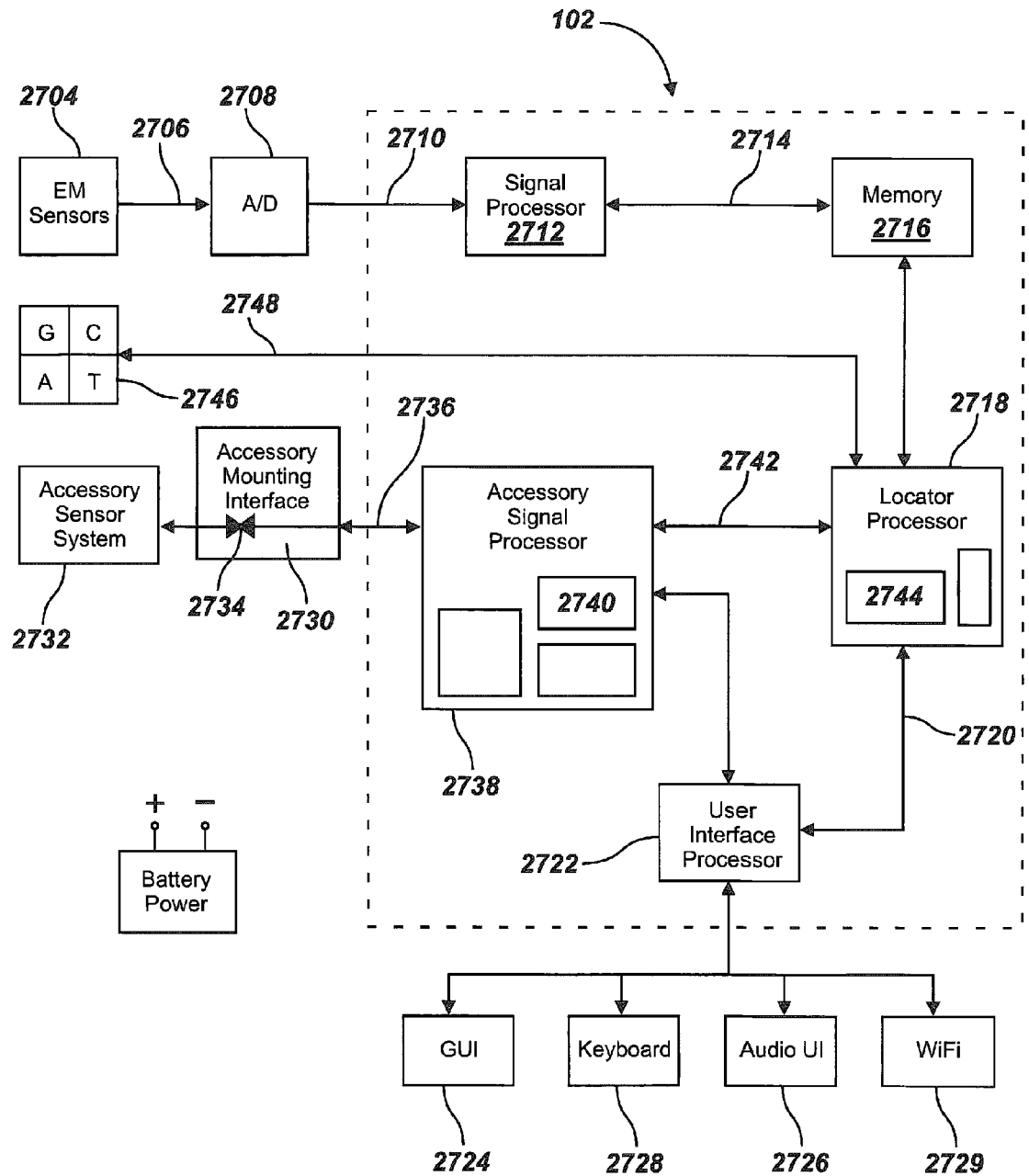
FIG. 27 is a schematic block diagram illustrating the relationships between the functional electronic elements of the locator system embodiment of FIGS. 1-3.

FIG. 20F is a diagram illustrating a GUI control indicator for the variable bandpass filter processing method illustrated in FIGS. 20B-E. In FIG. 20F, the locator GUI display screen includes visual indication of the sample window in use by the variable pass bandwidth control 2204. In the example, the variable pass bandwidth is set to analyze a sample of 2 Hz. The filter can be set for larger band-widths, such as 8 Hz, or smaller band-widths such as ½ Hz or ¼ Hz. When the filter is set low, such as ¼ Hz, more samples are collected, requiring a longer period to process a block of data but producing a higher SNR. Conversely, when the filter is set to a higher value, such as 8 Hz, the SNR is lower, but the response time of the locator to changing conditions is proportionately faster, as fewer samples are being processed. This innovation is adaptable for use during portable locating and improves the information made available to an operator, whether or not the locator is self-standing. The adjustment of the variable pass bandwidth settings as a function of signal clarity can be automated in a program element within the locator processor (FIG. 27).

Two primary modes are used in applying the filtering. In narrow-band filtering, directly-applied digital filters can respond rapidly, but tend to lose precision over a sampling time exceeding around five seconds. Broadband filtering, by contrast, uses correlating and cross-correlating methods to build an additive picture over longer periods of time, which improves in accuracy as the process continues.

The Known Power-Line Harmonic Frequency Avoidance Method

Figure 21A:
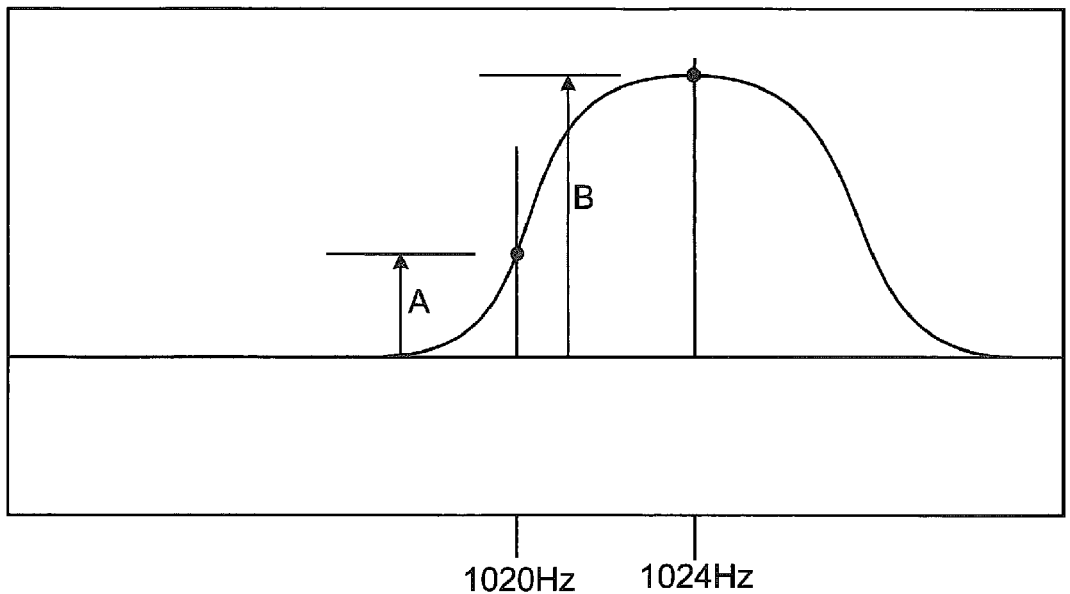
FIGS. 21A-21B are graphical diagrams illustrating an exemplary method for shifting a digital filter center frequency away from an interfering power line harmonic signal to improve locator performance.
Figure 21B:
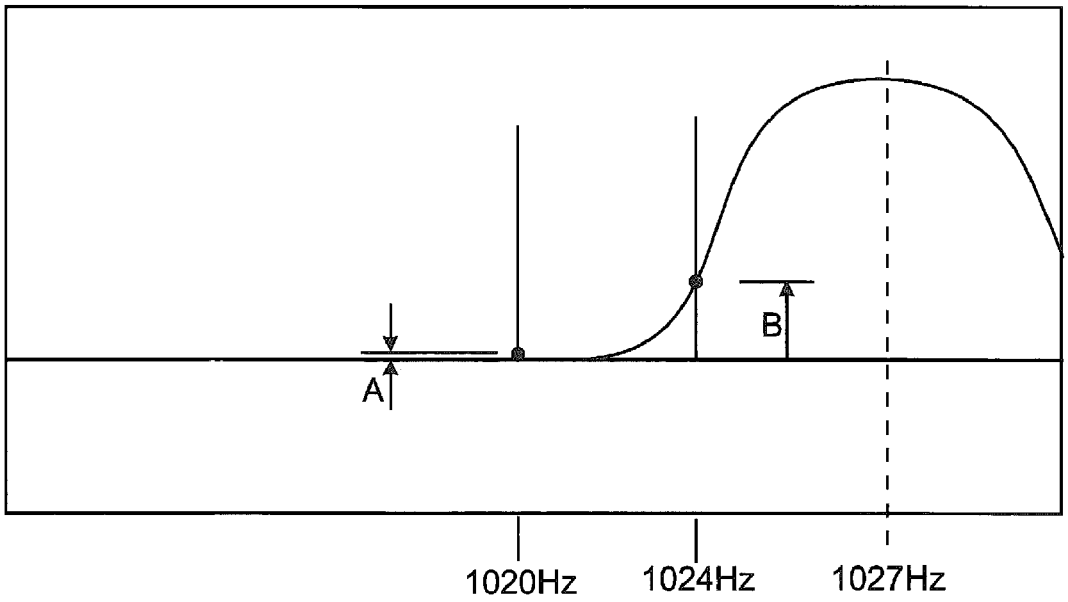

FIGS. 21A-21B are graphical diagrams illustrating an exemplary method for shifting a digital filter center frequency away from power line harmonics to improve locator performance. This method was successfully tested by the inventors and has proven useful. In FIG. 21A, a graphic illustration depicts a non-shifted frequency map in which the 1024 Hz band being sought with a portable locator is compromised because of signal leakage from a lower band, here 1020 Hz, the 17$^{th}$ harmonic of ubiquitous 60 Hz power. The method presented consists of imposing a shift to the right by an increment, in this example, of 3 Hz, thus centering the same symmetrical signal curve around a value of 1027 Hz. This shift provides a clearer signal at 1024 Hz because the signal curve is now outside the influence of the harmonic noise at 1020 Hz. With the noise element shifted out of band, a lower but clearer signal of the target frequency (1024 Hz) is obtained. In both FIGS. 21A-B, signal-to-noise is defined by the ratio B/A, which by inspection of the diagrams is clearly enhanced in FIG. 21B over FIG. 21A.

The Display Sketch Method

Figure 22A:
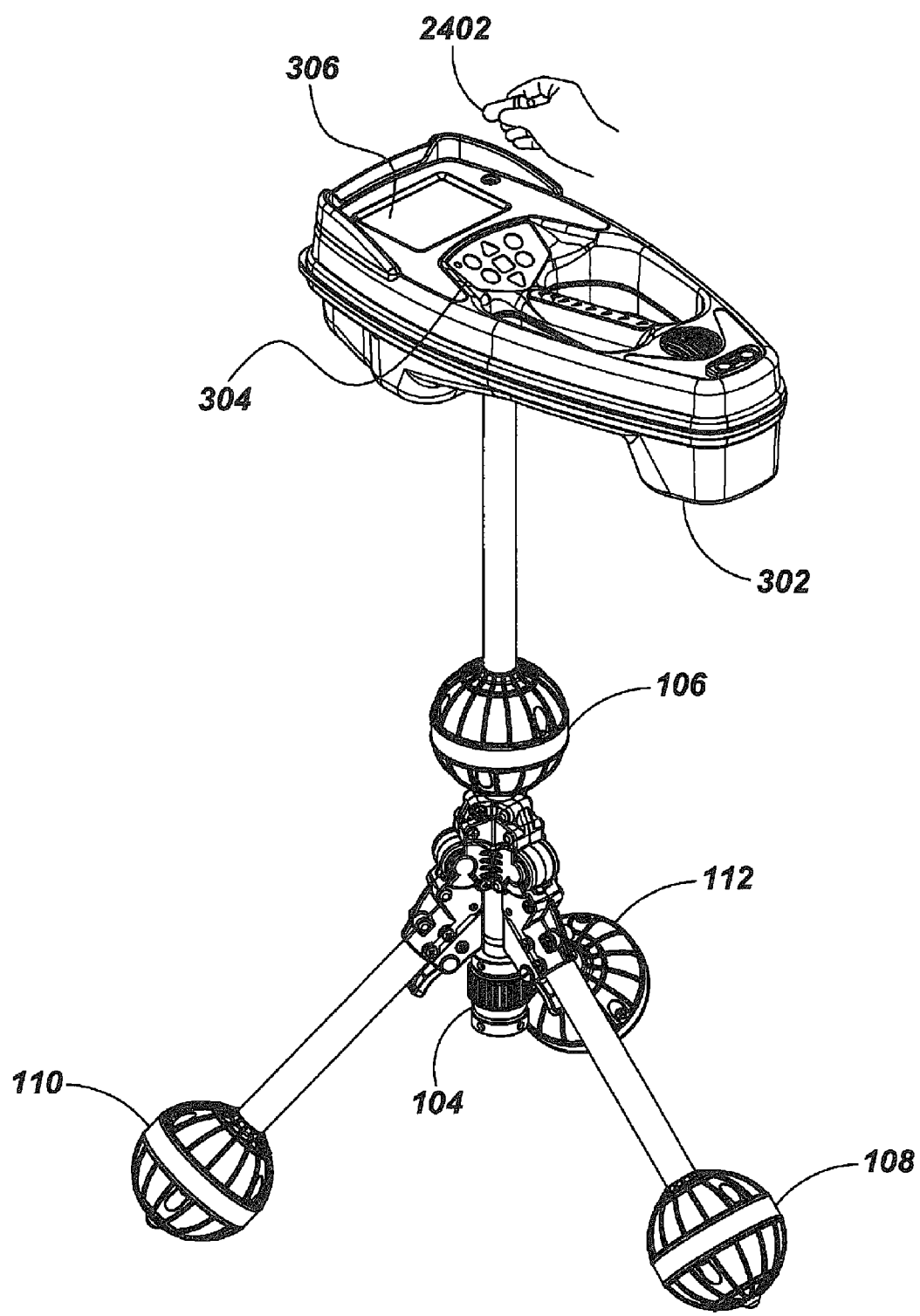
FIG. 22A is a diagram illustrating an exemplary locator system embodiment employing sonde tracing and direct distortion display.
Figure 22B:
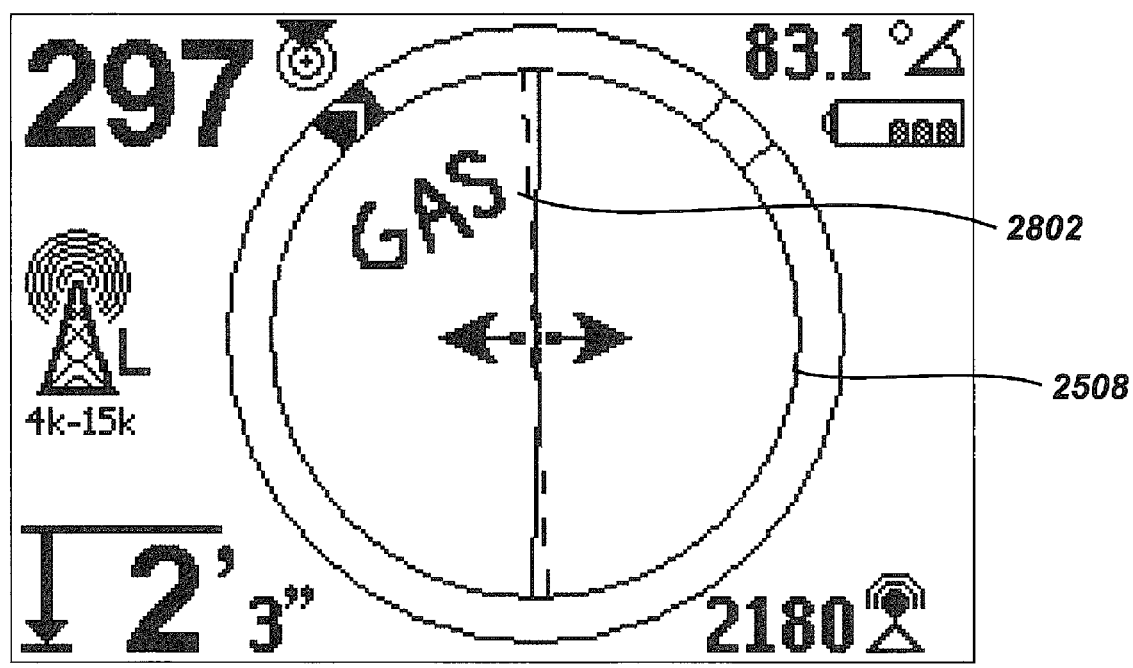
FIG. 22B is a diagram illustrating an exemplary GUI display suitable for use with the dipole Sketching Method embodiment.

Looking to FIG. 22A, another embodiment is shown wherein an operator is provided with a specialized dipole sonde configured as a stylus with which hand-drawn markups or annotations may be made on a GUI display screen and then stored, recovered, or transmitted for further use. FIG. 22A is a diagram illustrating an exemplary locator embodiment employing dipole-enabled sketching on the locator's display. In FIG. 22A, the operator holds a batterypowered dipole sonde 2402 configured so as to fit to the average hand, and by moving it across the display screen 306 the operator can annotate the display screen as it is shown at any point in time. An example of the result of such annotation is shown in FIG. 22B, where the operator, using the sonde as a stylus, has annotated the display screen 2508 with a note 2802 that the display is showing the trace of a gas line. Annotated screens can, for example, be printed out with a "locate ticket" through software in an independent laptop or notepad screen device, or simply preserved at the locator for note taking or diagramming use later. In this aspect, a small sonde is fitted with a push-button switch, which, when activated, causes movement of the sonde to act as a stylus drawing a line as the sonde is moved when the switch is activated and the sonde is over the GUI screen. The switch may be pressure activated from the contact point with the screen, or activated manually by the operator. The drawing routine stops when the switch is deactivated such as by the sonde being lifted from the screen or manually switched off.

Various means can be used to associate the operator controlled movement of the sonde used for display sketching. The upper antenna node 106 can display a sonde pole, where the field lines are near vertical. The operator can move the image of the pole on the screen by manipulation of either tilt or the position of the sonde. Alternatively, the full antenna array can be used to position the sonde and space and the true spatial movement of the sketching sonde can be used to drive the tracing cursor on the display screen.

The "3D" Direct Distortion Display Method

Figure 23A:
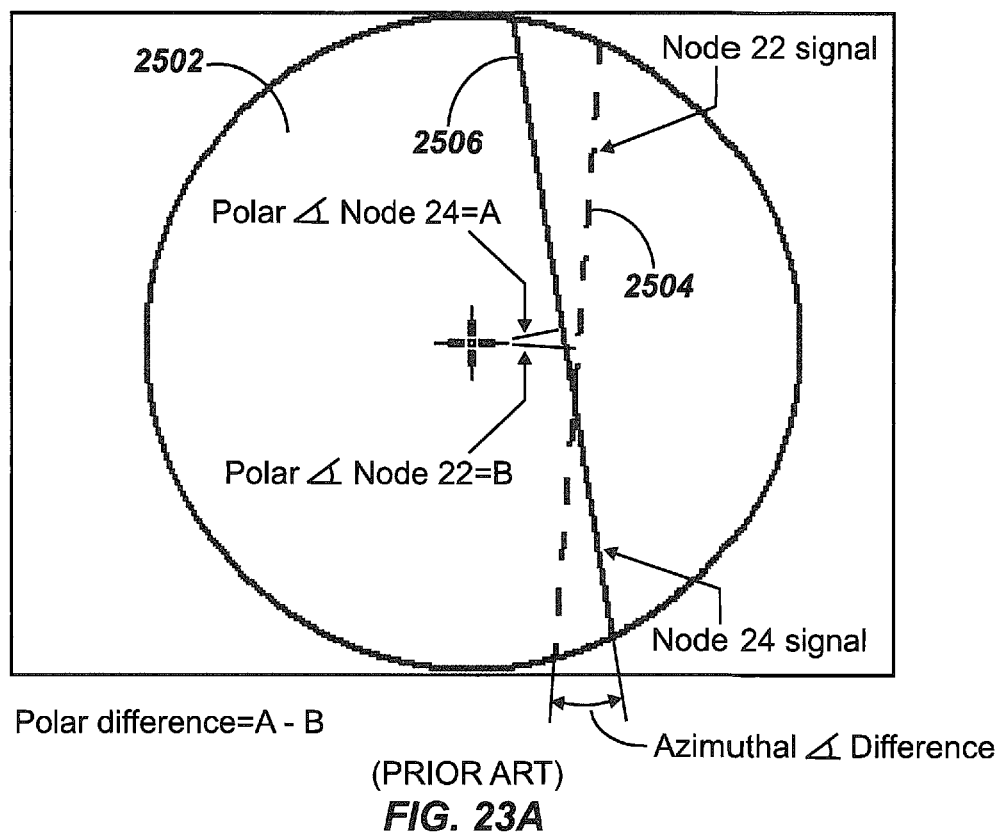
FIG. 23A is a GUI diagram illustrating prior art relating to the 3D field-distortion display method embodiment.
Figure 23B:
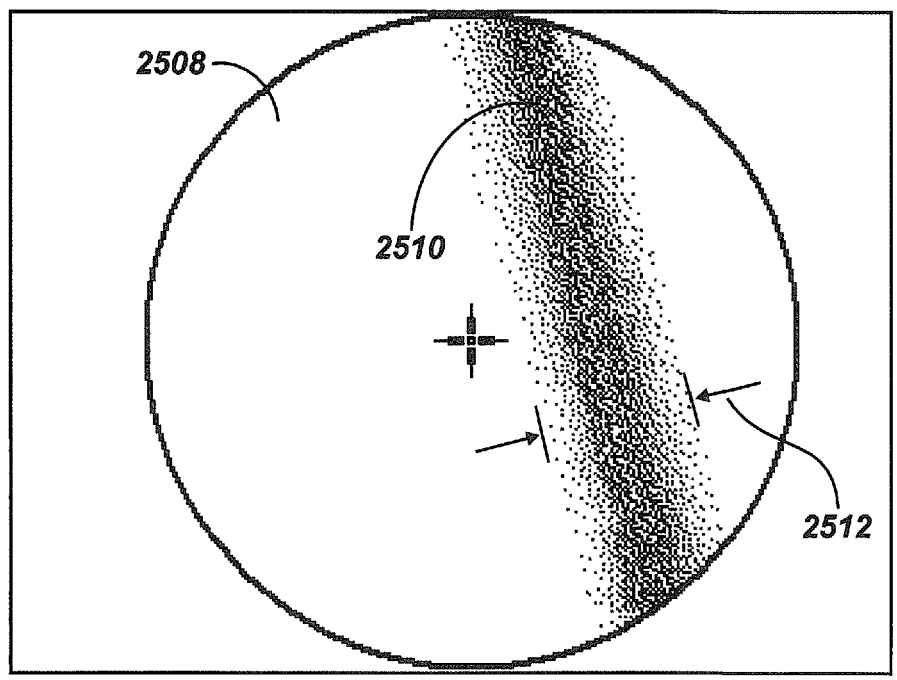
FIG. 23B is a GUI diagram illustrating the presentation of the 3D field-distortion display method embodiment.

Turning now to FIGS. 23A and 23B, another embodiment is shown wherein a visual indication of a detected trace line on a locator GUI display is enhanced with clouding, blurring, or other suitable modulation to reflect the lack of clarity or "distortion" in the local EM field at locator system EM detectors and processed mathematically by the locator's processor.

In line tracing, distortion typically represents the deviation of the measured field from an expected cylindrical geometry. The "quality" of the EM field radiated from a buried utility is useful operator information because it determines how accurately the locating device can estimate depth and position of the utility. Poor quality EM fields are defined herein as weak, noisy, or heavily-distorted fields. Weak and noisy fields often result from poor conduction of the energizing signal on the buried utility or improper hookup of the transmitting device. Distortion can be caused by a number of factors, including coupling of the field onto nearby conductors, large ferrous objects such as cars or utility boxes in the near vicinity, weak conduction on the buried utility, and jamming signals.

FIG. 23A is a GUI diagram illustrating the presentation of the 3D field-distortion display method in prior art using two separate display lines 2506, 2504 to indicate the trace as detected by the upper and lower antenna arrays of a two-node locator. An example of such a locator is illustrated in FIG. 23D, which shows the three axes of B-field detection for the upper node 2354 and lower node 2356, on which the calculation of distortion is based. Increasing distortion is indicated by an increasing difference in alignment and orientation of the top and bottom node 3D B-field measurements.

FIG. 23B is a GUI diagram illustrating the presentation of a direct field-distortion display method embodiment. FIGS. 23A and 23B show that the distortion of a field is calculated from both the azimuthal and polar angles of the trace lines. The polar angles govern the trace line separation from the center of the display field, while the azimuthal angle governs the trace line bearing. In FIGS. 23A and 23B, the lower Node Signal line 2506 (from node 2356 in FIG. 23D) and the blurred signal line 2510 are in the same place. The method for the calculation and display of a composite distortion signal in this manner is equally applicable, for example, to a two-node or a multi-node locator, such as the example locators shown in 23C as locator 102 and in 23D as locator 2352.

Figure 23C:
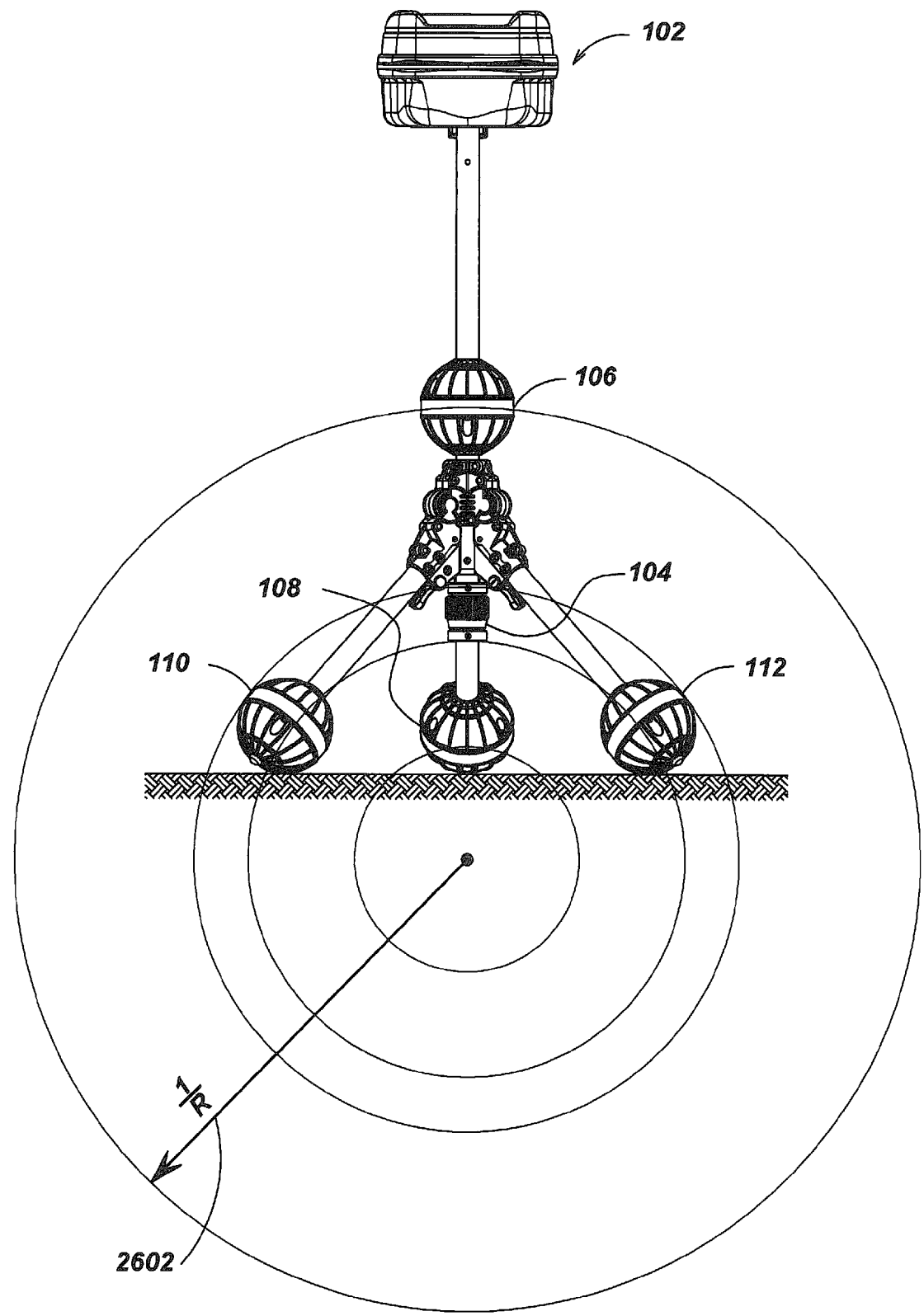
FIG. 23C is a schematic diagram illustrating the distribution of an undistorted magnetic field with respect to the locator from FIG. 3.
Figure 23D:
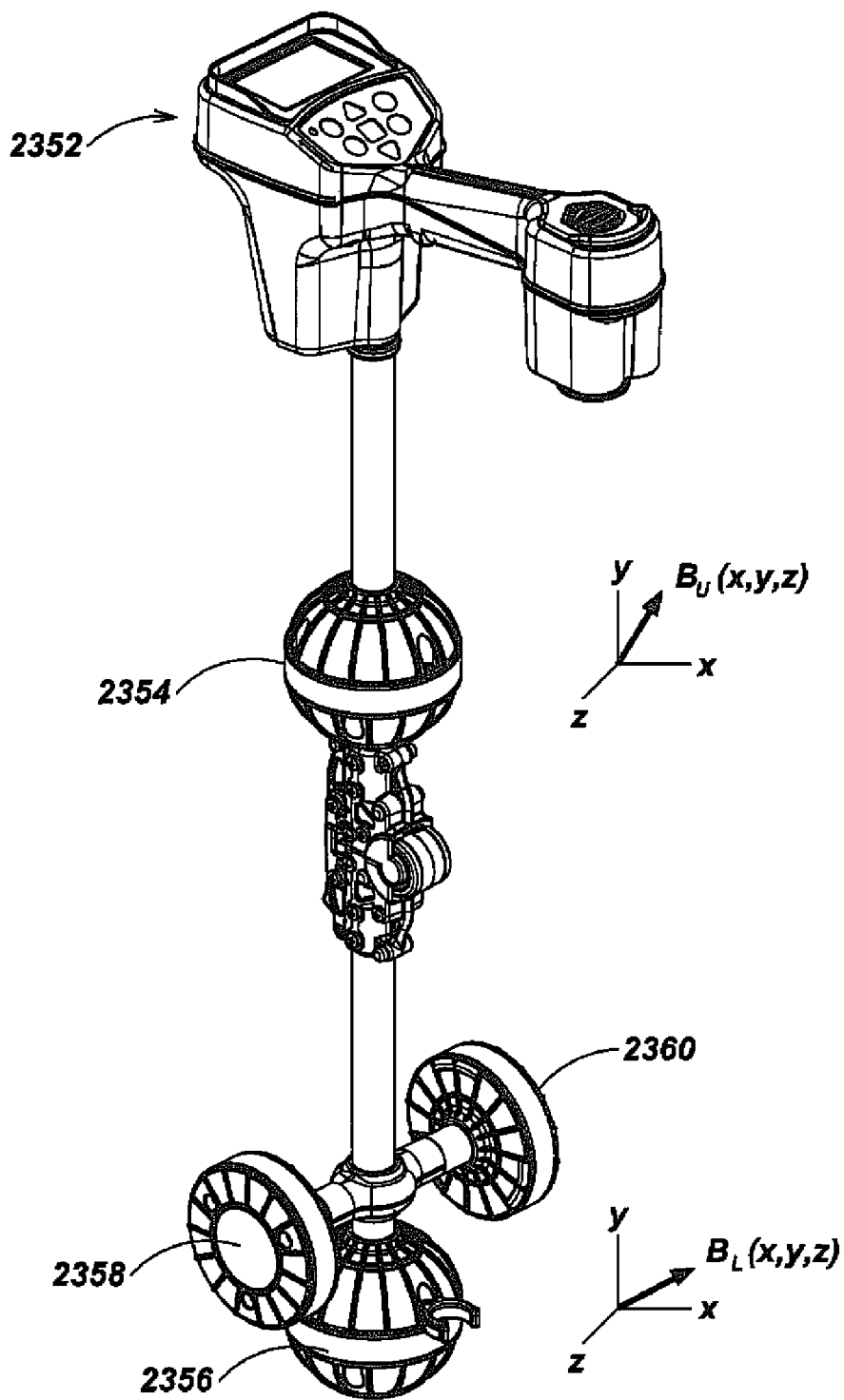
FIG. 23D is a view of a two-node locator embodiment equipped with separate gradient coil antennas suitable for use with the field-distortion display method embodiment.

FIG. 23C is a schematic diagram illustrating the distribution of an undistorted magnetic field with respect to the locator from FIG. 3. The strength of the field in an ideal circular field varies inversely with R, where R is the radius 2602 from the conductor's center to the point of measurement.

Figure 23E:
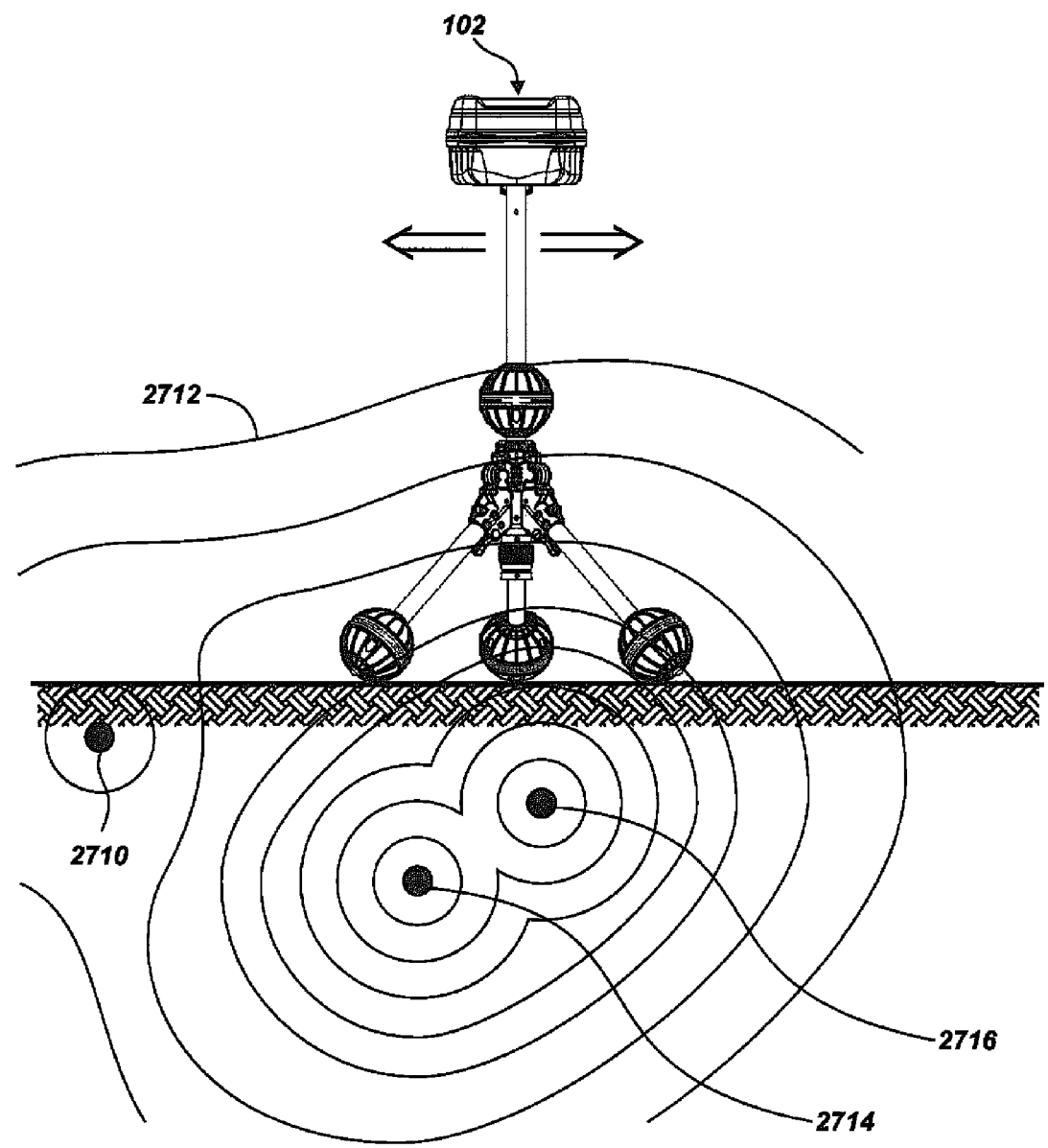
FIG. 23E is a schematic diagram illustrating the distribution of a distorted magnetic field with respect to the locator from FIG. 3.

FIG. 23E is a front view illustrating the distribution of a distorted magnetic field with respect to the locator from FIG. 3. Because the field is a composite caused by multiple conductors 2710, 2714, and 2716, the measurement of field strength is not be directly and consistently inversely proportional to the value of R.

Returning now to FIG. 23B, a linear feature 2510 is shown on the mapping area 2508 of the display of a locating device, and the visual indicator is enhanced by blurring the line or softening or defocusing or disturbing in a way that visually indicates positional uncertainty in the detected object and thereby communicated to the operator of the portable locating device with simple inspection of the visual features of the image representing the object on the display. The width of the blurring 2512 is made proportional to a measure of the degree of detected distortion. Clouding the display line in this fashion proportionate to distortion is merely one of many useful indicators for distortion, any of which need merely project a suitable degree of uncertainty to the user. For example, other such indication means may use colors, fading displays, different symbols or various any other similarly useful visual and aural user interface mechanisms known in the art.

The method illustrated uses spatially separated full field data, where the relative positions of the measurements with respect to each other are known, to calculate the depth and position of a buried conductor. It is highly advantageous to have the field sensors as close to the target as possible. There are two important embodiments. The first emphasis is to fit the data to a cylindrical field model to create more accurate positional information, as well as to calculate a quality figure of merit that would usually be recorded for Geographical Information System (GIS) purposes. Such purposes may include, for example, the development of a geographically-coordinated database of past locate results. The self-standing locator uses all four antenna nodes, or may use only the lower three to dynamically fit sensor data to a cylindrical field model.

Secondly, distortion defocusing (FIG. 23B) is used to display the quality of the fit.

An ongoing challenge in underground-utility-locating is to improve the accuracy of each locate. The importance of accuracy in utility location cannot be underestimated, as "hits" resulting from inaccurate locates translate into human injury, loss of life, and millions of dollars in lost revenue due to service interruptions. Improved accuracy can be accomplished by aiding the operator in assessing the quality of the EM field radiated from the buried utility being interrogated.

To mitigate inaccurate locates, the locator system presents the operator with a wide range of independent data including field strength, field angle difference between two antenna nodes with a linear offset, depth of radiator, and field gradient level. The operator must assimilate and analyze this data to determine the quality and accuracy of a given locate. This requires a somewhat sophisticated physical understanding of what the EM field radiated from the buried utility "looks like" and how it may be effected by objects in the vicinity of the locate.

This method simplifies the GUI for the operator by presenting a more intuitive display representing the quality of the signal radiated from the buried utility. It unambiguously displays the "quality" of the signal in an intuitive manner.

Figure 23F:
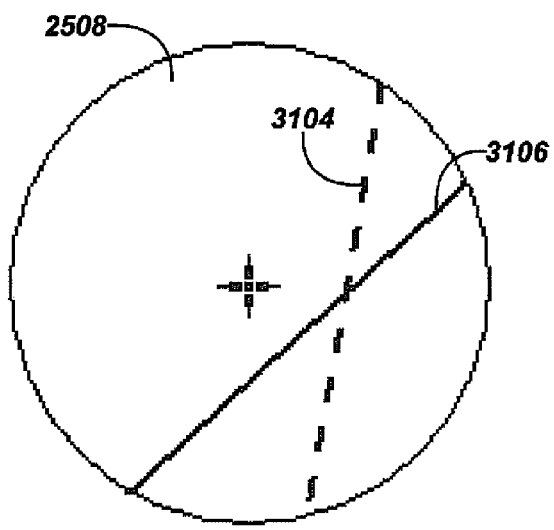
FIGS. 23F-23J are diagrams illustrating a preferred magnetic field distortion GUI display embodiment.

Past efforts to help operators assess the degree of field distortion relied on displaying a representation of the measured field angles sensed by the top and bottom antenna nodes. An example of this prior art is seen in FIG. 23F. In FIG. 23F, a display mapping area 2508 shows a trace line 3106 as detected by the lower node of a two-node antenna locator, while a second line 3104 displays the trace line as detected by the upper of the two nodes of the locator of FIG. 23D.

With such early displays, the user is expected to interpret angular and positional differences in the two lines as a measure of field distortion. Unfortunately, the mere presence of a line drawn on the display is enough to lead some operators into believing they have located the utility line sought, even though the top antenna node field angles reflected heavy distortion.

Figure 23G:
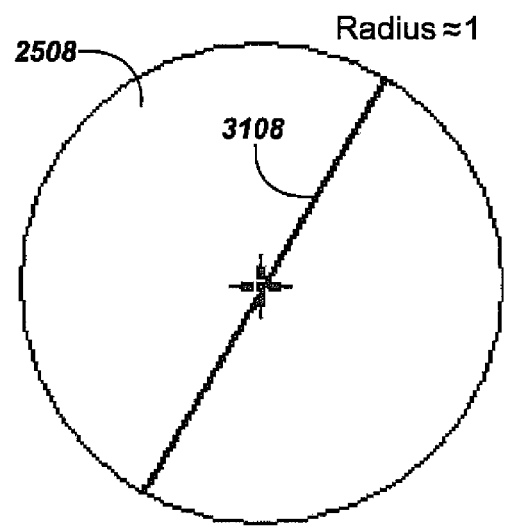
Figure 23H:
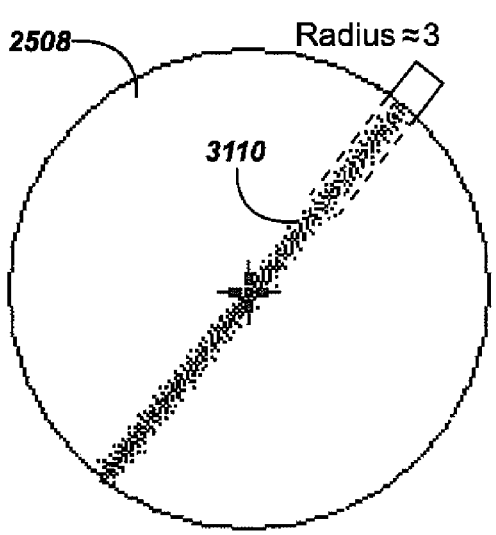
Figure 23I:
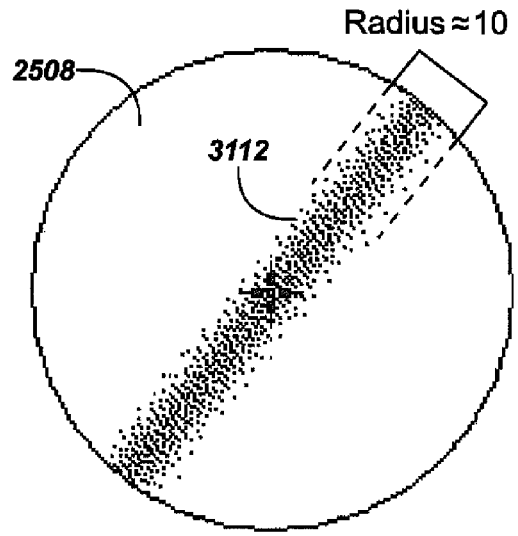
Figures 23J, 23K, 23L:
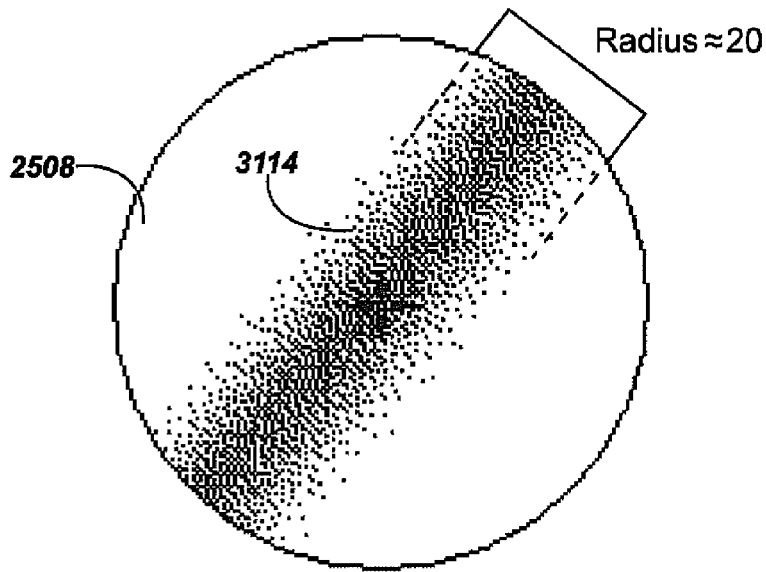
FIGS. 23K-L are diagrams of mathematical equations illustrating exemplary features of the magnetic field distortion GUI display embodiment.

The direct-distortion display embodiment combines the field angle information that was previously displayed as two separate and distinct displays into a single visual indication that is both simpler and more intuitive for the operator to interpret, and instantly reflects the quality of the locate to the operator unambiguously. FIGS. 23G-J illustrate this novel interface and display in more detail. In FIG. 23G, a locate trace of relatively high certainty is illustrated in which the defocusing radius is only 1. In FIG. 23H, with a higher distortion value, the radius is set to 3, and the display of dithering or blurring around the line portrays a higher degree of distortion, or lower confidence. In FIG. 23I, the radius value is computed to be 10, with a proportionately wider distortion in the line display indicating a correspondingly lower certainty in the locate. FIG. 23J illustrates the process carried further with a higher distortion value and the trace line 3114 in the display's mapping area 2508 showing proportionately less certainty.

There are two basic steps to this direct-distortion display method; (a) calculation of the level of field distortion present, and (b) generation of the visual indicator GUI display that represents the level of field distortion.

Estimation of Field Distortion: The degree of field distortion is defined by the equation in FIG. 23 K, where $\theta$ is the measure of the vertical angle component of field angle and $\phi$ is the measure of the horizontal angle component of the field.

Display of Field Distortion: Using the level of distortion calculated in the equation in FIG. 23 K, a novel graphical display has been implemented to present the information in an intuitive manner. FIG. 23 J illustrates a single instance of a random "point cloud" 3114. A point cloud is defined by its center (x, y) coordinates, the radius of the point cloud, and the density of the point cloud. The center coordinates correspond to where the cloud originates on the graphical display. The radius of the point cloud corresponds to the maximum distance, bounded to a square that a given point in the cloud can travel from the center coordinates. The density of the point cloud corresponds to how many individual points appear in the point cloud. Given these input criteria, the coordinates for each point are generated using the Cpseudocode routine of FIG. 23L, where % is the Modulus operator. In practice, radius is set to be equal to the value of Distortion calculated as specified by the equation in FIG. 23K. For the final output display, each point of the line representing the bottommost antenna nodes sensed field angles is replaced with a point cloud, resulting in displays as seen in FIG. 23G through FIG. 23J described above.

Using a mapping locator embodiment, positional information may also be employed to achieve the result described above. Using this technique requires that the data be spatially related so that the overall shape of the field from the pipe or cable can be ascertained from spaced apart measurements. This technique can be applied to distortion in a highly general sense where the measured fields vary in some way from an expected ideal field. Any calculation means to indicate some measure or degree of variance from an ideal or expected field can be employed. Any display means to graphically indicate uncertainty or ambiguity can be employed.

The Locate Validation Method

Figure 24A:
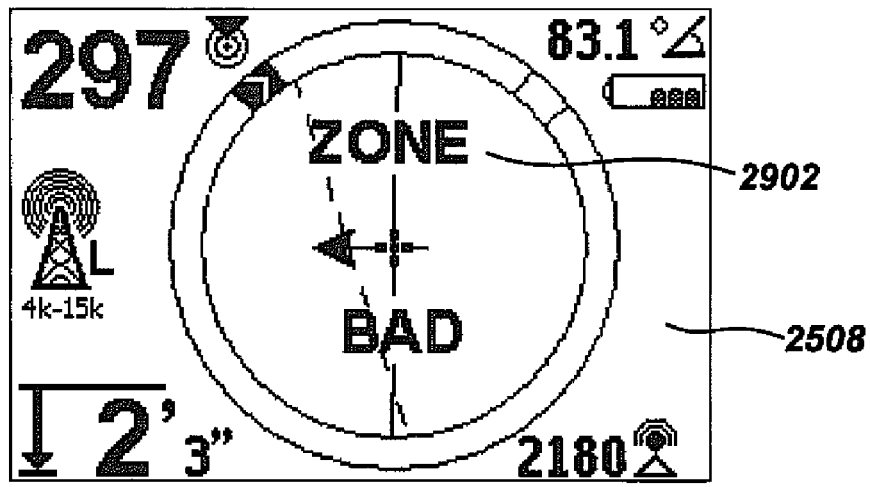
FIG. 24A is a diagram illustrating an exemplary GUI display of a distorted single locate warning for signal properties showing an unacceptable locate result.

Attention is now directed to FIG. 24A, which illustrates another embodiment wherein a locator is provided with a program element (FIG. 27) to display visual indications alerting the operator when a locate is certain enough to justify painting or marking the ground with the detected utility line location, and when a locate is not certain enough to "put down paint."

FIG. 24A is a diagram illustrating an exemplary GUI display of a distorted single locate warning for signal properties showing an unacceptable locate result. In FIG. 24A, the display screen 2508 is showing a sample message 2902 that the locator generates according to the degree of calculated certainty of the reported location of a target utility. Such a calculation is based on locator-processed signal strength comparisons from the several antenna nodes. In an alternative embodiment of this method, a color display may be used to display parallel red lines indicating the "mis-mark allowance" or tolerance for error in marking the ground to indicate the location of a utility, usually ±18-inches within the United States, or to display a similar pair of green lines to indicate the ±3-sigma confidence limits of the detection, for example. When the green lines lay outside the red ones, a visual message such as "No Paint—Request Potholing" or the like can be used to advise the locator operator. This display embodiment, and others extended on similar applications of this method, resolves a clearly-felt industry-wide problem with locating errors resulting from under-trained and under-experienced employees in a high-turnover industry. The parameters of such a software program element can be adjusted to accommodate geo-local variables for locators used in Europe or Asia, for example.

Figure 24B:
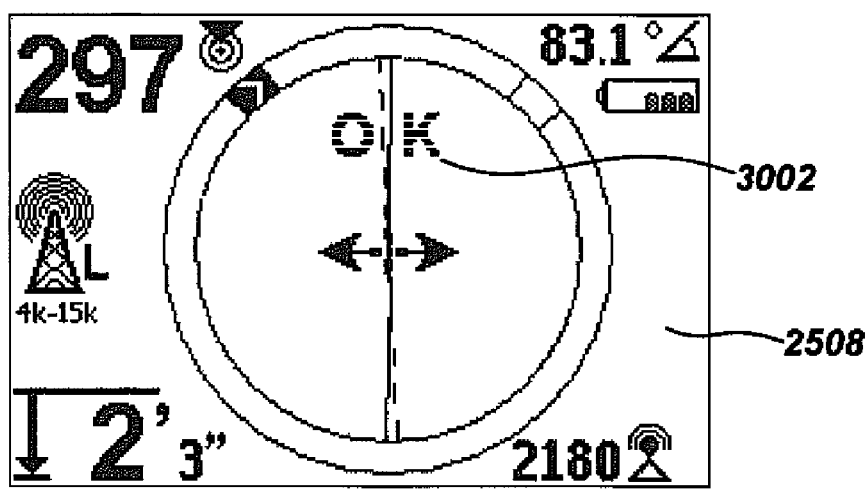
FIG. 24B is a diagram illustrating an exemplary GUI display of a slightly distorted single locate warning for signal properties showing an acceptable locate result.

FIG. 24B is a diagram illustrating an exemplary GUI display of a minimally distorted single locate message for signal properties yielding an acceptable locate result. In FIG. 24B an "OK" message 3002 shows on the display screen 2508 to confirm that the locate is of sufficient reliability to mark the utility's location on the ground. Such a display may be automatically generated during a locate, for example, when the alignment of multiple sensor information, depth calculation, signal strength, and other calculations was such that a high certainty of a good locate was justified.

The Laser Range Finder Accessory

In another embodiment, the attachment is an optionally removable laser range finding device that may measure distances by pointing to a target or scanning across a target and calculating its nearest point. The man-portable laser range finder 1820 may be operated while coupled to a mapping locator in vertical orientation or held in a horizontal orientation, or it may be operated as a separate device as required by the circumstances of use and task.

The following discussion provides further insight into the design, methods and techniques of the several embodiments of a laser range-finder attachment that can be detached and deployed and/or used as a stand-alone device, illustrated in FIGS. 25A through 25M. According to this embodiment, one or more dipole transmitters is fixed to a man-portable Laser Range Meter, and the self-standing, Multi-Channel locator is used to precisely establish the position and pointing direction relative to the locator. The Laser Range Meter then establishes a distance from itself to some target point and this information can be used to accurately establish the three dimensional position of this target point in relationship to the locator. The range information can be communicated from the man-portable laser range meter to the self-standing multi-channel locator by known means including, cable (USB, RS-232, etc.) or wireless radio (Bluetooth, Zigbee, WiFi, 802.xx, etc.) means. This range information can also be encoded into the transmitted dipole signal.

Collecting data with a laser range meter allows positional information to be rapidly collected over a large area and also allows information to be easily collected from practically inaccessible locations such as the position of the top of a utility pole. Even wires strung between poles can be mapped if desired. Complex topography and objects hereto very difficult to map become easy to map quickly in the field in real time. The self-standing locator may include program elements adapted to use the techniques described by Rorden et al. in U.S. Pat. No. 4,710,708 (entirely included herein by reference) to determine the position and orientation of the Laser Range Meter attached dipole(s) relative to the antenna array. In particular see FIGS. 25A-25B, or the sub-class system type 1.1 of Rorden et al. As described elsewhere herein and in one or more of the commonly-assigned patent applications cited above and fully incorporated by reference, the position of the self-standing locator relative to the world coordinate system may be established by various means including GPS, compass, tilt sensors, inertial navigation and in particularly fixed dipole transmitters or spinning dipoles in fixed locations. One method is to embed into the laser range-finder a device such as the AMI-601 described above.

The preferred embodiment uses a Laser Range Meter such as the HILTI PD 28 that can stream range data continuously and measure from 0.1-100 m with an accuracy of +/−3 mm at a 10 Hz rate (with normal reflectance). The Leica DISTO A3 is another suitable device if it is modified for remote data output. Other types of range meters, for example those employing sonic pulses can also be used.

An audio signal may be employed with the laser range meter, associating measured range with frequency, where close objects are associated with a high frequency audio signal and lower frequencies are associated with more distant objects. This greatly improves the intuitive character of the tracing objects for the operator.

Several controls may be added to the range meter or any separate user interface that may be associated with the use of the range meter. One such control associates a line with two endpoints, which is useful in tracing a curb edge or a utility pole. Another exemplary control is "trace area," which can be used to trace a building or sign face for example. Associating data points with known geometries simplifies the later interpretation of the data collected and also makes real time map creation less ambiguous.

In a similar vein, audio annotations can be incorporated so the each traced object can be described or named as it is added to the mapping data set. A Bluetooth headset such as used with cell phones is useful for such a purpose. Such audio annotations may be compressed and logged into an internal file structure or database by known means. Voice recognition techniques may be employed to automate this process. The user may shoot a pair of points, one at the base of a utility pole and one at the top of the pole and then read the pole number off of a tag on the pole itself. Tracing a circle around a manhole cover and then audio logging the statement "storm drain manhole cover" would make the mapping data set more useful. Techniques using high Q dipoles to increase useful range and reduce power requirement can be employed to improve system performance as described elsewhere. Other techniques involving suspending a high Q resonant LC tanking to encode phase data can also be employed to improve system performance. Such techniques can involve complete or fractional cycle skipping. The locator can employ long time constant digital filters of very narrow bandwidth to improve the signal to noise ratio of positional reference dipoles while it is placed unmoving an a self-standing configuration to improve mapping accuracy and range.

Various techniques can be used to resolve any laser pointing direction ambiguity. Accelerometers may be placed on the range meter. A compass may be placed on the range meter. Two dipoles may be employed to both improve positional and pointing accuracy but also to resolve any pointing direction ambiguity. Phase encoding techniques can also be employed in the signal transmitted by the dipole to resolve pointing direction. In areas where magnetic or conductive objects are likely to be present it is desirable to use low frequency dipole beacons (1 Hz to 10 kHz). With multiple beacons and the spaced apart antenna array of the self-standing locator the presence of distortions in the mapping signals can be recognized and at least partially corrected for. The use of other navigational sensors (GPS, optical, inertial) not based upon the dipole transmitted fields are desirable in high distortion regions.

The laser range meter can be optionally mounted on a low cost scanning assembly, where for example, the laser may start pointing straight up and then rotate azimuthally around, while slowly scanning downwards in polar angle thereby entirely scanning the region into which it is placed. The scanning speed is a function of the maximum range and the resolution desired as well as the maximum update rate of the laser range meter. With constant and known rotation rates and with the geometry of the rotation device well characterized, the scanning accuracy of such an arrangement can be improved over that of free hand pointing. Automated software can more readily assemble the stream of data points into a surface model of the mapped region. As an example, the rotating device may itself be battery powered, and mounted or placed on top of the self-standing locator.

Triangulation techniques can be employed to accurately map larger areas with a number of uniquely identified (e.g. numbered) laser targets. Electromagnetic dipole beacons are not needed if the locator does not need to move during the mapping process (as would normally be needed when locating a buried utility). A utility can be located by moving the locator and then the locator can be placed on the ground in a self-standing state and its position mapped by the following process. Two or more laser reflective targets (three to remove all positional crossing the baseline ambiguities) are placed in the area to be worked. These may be visibly marked with 1, 2, 3 or A, B, C, for example. Using a sighting scope filtered to enhance laser beam visibility, the operator is prompted to "shoot" all three targets in sequence each time the locator is moved to a new location. A trigger action with sound or optical feedback may be used to facilitate shooting each of these targets. As additional positions are "shot" an iterative procedure can be used to generate a best fit position for all of the laser targets. The laser range meter should be relatively stable in position and orientation when it is being pointed at a target, so an accurate position and orientation can be measured using the attached or integrated sonde signal. A single dipole beacon may be placed at each laser range fixed position to allow fine scale mapping around that location.

The basic problem of iteratively determining the unknown target positions from a series of range data sets is essentially identical to the problem of establishing the positions of an acoustic transponder network placed in the ocean. These techniques were refined by the Deep Tow group at the Scripps Institution of Oceanography in the 1960's and 1970's. Multiple self-standing locators can be used to simultaneously survey and map a region. The data can be exchanged in real time between units in the field via wireless means or the data can be time stamped with local synchronized or GPS clocks and later processed into a single mapped data set.

A low cost medium precision (1-10 cm) fast convenient surveying technique is proposed using the self-standing locator and a tracked dipole transmitter attached to a hand-pointable laser range meter. In a preferred embodiment, the locator also includes a three axis electronic compass and a three axis tilt-meter (3 axis accelerometer) so that its orientation with respect to the earth's surface is known. A method of using "beach ball" or "lampshade" laser range meter reflectors to triangulate the position of the self-standing locator is described. A laser target is constructed using a spherical shape of known radius with a reflective coating such as 3M Scotchlite (brand) Reflective Sheeting Material, preferably red if a red laser is used. Using a square foot of this material, a HILTI PD 30 was able to give a range at 180 meters on an overcast day in San Diego. At ranges of less than 10 meters the reflected beam was too bright and a diffuse white band can serve to reflect the beam at closer ranges. A spherical reflector can be used where the beam is aimed at the center of the target and moved for a short period of time and the closest range is taken as the target distance. The known radius of the target is added to the measured distance to get the distance to the centroid of the target. If ranging is mostly horizontal then "lampshade" targets are more suitable. These lampshade targets are lower cost to produce than spherical targets and only introduce small errors if the horizontal range is much greater than any vertical offsets and if they are placed approximately at the height of the laser range meter during measurement, such that the laser beam is nominally normal to the surface at the point where the cylindrical surface is closest to the range meter. Each of these targets has some identification means that the operator can use to indicate to the system which target is being ranged at the time of range measurement.

A physically large target makes it easier to shoot the target with the laser beam. A horizontally-oriented cylindrical strip can be searched for by the operator when sighting with vertical scanning movements and then when the strip is found (laser return reflection visible), then the target can be scanned horizontally so that the minimum point can be measured and determined. The laser operates in a streaming mode, with a spring loaded trigger and sighting scope. Optionally a GPS receiver may be placed in association with each laser target. While the trigger is depressed the range meter streams measurements. The system has an interface to allow the operator to indicate which fixed laser target is being ranged.

At shorter distances the vertical precision of the dipole tracked tilt measured during ranging provides an accurate elevation measurement. At longer ranges the triangulation of distance provides the desired accuracy.

Each set of range measurements (made with the locator at a fixed position) to a target set is stored and referenced back to the coordinate system of the locator (not the laser range meter at the time of measurement). Measurements at subsequent locations allow the relative positions of the targets to be determined by simple geometry and then the true relative position of the locator with respect to the array of targets to be accurately determined. The basic geometric principle is that the locator must lie on some circle equal in radius to the measured distance to each target ranged. It is straightforward to start with the targets in unknown locations and to determine the spacing and position of the targets after the locator is moved to a small number of spaced apart locations within the area of the array of targets.

Several in use examples are herein described.

Example #1

Locating Utilities in a Road Intersection

A fixed positional reference dipole beacon is placed at each of four corners of an intersection, each transmitting a separately distinguishable signal that can be located by the self-standing multi-channel locator. These positional reference dipole beacons can themselves consist of one or more transmitting dipoles. Signals are placed by known means (direct connection or inductive coupling) on all known utilities within the region of the intersection to be mapped either using separately distinguishable signals or by attaching signal transmitting means to one utility at a time. Using both active (signals placed by the transmitting means) or passive (signals of opportunity already present) locating techniques elsewhere described, the positions of all detectable utilities are determined relative to the position of the locator at the time of measurement. The position of the locator is determined at the same time relative to one or more of the positional reference dipoles. The locator collects and processes the signals detected from the various buried or otherwise hidden utilities and determines their positions relative to the intersection, and presents a map of these utilities on a display.

Additionally a high Q electronically spinning dipole can be employed as an omnidirectional inducer to couple signals onto unknown utilities in the area. If the position of the dipole is accurately determined and the locator's position relative to the inducing, spinning dipole source is continuously determined, then the measured signal can be subtracted from the computed value of the known signal and any residual is the induced component from some unknown utilities.

At any time during this locating and mapping process the operator can use the "handpointable" laser range meter to add objects or any desired reference points to the acquired map. Any objects present in the area of the intersection can be mapped to provide context for future excavation or construction activities and can help affirm the accuracy and utility of a construction map that may be produced either immediately onsite or by later post processing. The laser range meter can be used to trace objects such as poles, signs, curb edges, manhole covers, trees, buildings, fire hydrants etc. Objects can have height as well as position that make the information more intuitive and allows a three dimensional map to be created.

Laser Range data accuracy will be improved if the portable locator is placed unmoving on the ground in a self-standing state while the laser range meter data is collected. For best accuracy, it is desirable to keep the positional reference dipole transmitter attached to the laser range meter close to the antenna array on the self-standing locator. The operator carries the locator from place to place within the intersection, sets the locator on the ground and then maps nearby objects and then repeats this procedure until all desired objects within the intersection area are mapped. The position of the locator is determined relative to the four beacons set at the intersection corners and the position and orientation of the hand-pointable laser range meter is determined relative to the locator. Many communities prohibit non-removable utility markings on the ground, so there is a need for recording the position of all paint or flag markers that are placed. The range meter can be used to trace all paint marks and record the precise positions of any flag markers placed relative to any other known fixed objects. Excavators have been known for example to remove flag marks before digging or to deliberately replace these in another position to place blame on the locators if damage occurs during excavation. The object mapping capability as described herein provides means for auditing both the positional placement of located utilities and any placed markers.

A paint-less, electronically mapped method of marking utilities can be envisioned whereby a detailed printed map of the intersection is provided to the excavating contractor in lieu of painted marks on the roadway. In such case the relative position of buried utilities relative to known, clearly distinguishable local landmarks and reference points is of critical importance. Alternatively, the amount of marking paint placed onto the roadway may be greatly reduced and only a few reference marks may need be employed to unambiguously tie the electronic map or a printed facsimile thereof to known reference objects. If a self-standing mapping locator with a copy of the mapped information was present, then excavation and construction may use this electronic map in the field.

A key advantage to this process is that the construction activities such as the position and depth of trenches, as well as any unmarked objects encountered during construction can be easily added to the site map and even transmitted in real time to some monitoring site or supervisor. It is very fast and easy to place the self-standing locator next to a partially dug or completed trench and use the hand-pointable, laser range meter to map all aspects of the trench and the position of any new or existing exposed utilities therein. Any information gathered by other techniques disclosed elsewhere such as by GPR, and acoustic techniques can of course be merged into any data set of mapping information.

Example #2

Mapping an Existing Structure and Site for Remodel Construction

A number of high powered very low frequency beacons are placed external to a structure. These beacons incorporate GPS receivers and use some combination of DGPS, WAAS and RTK techniques to improve accuracy. The fact that these are not moving during the course of the structure mapping process aids in improving the positional accuracy of these devices. The positional data from each of these beacons can be transmitted continuously or downloaded later to the self-standing locator or some other data logging station. Some number of optionally lower power beacons, are placed temporarily through out the structure as needed. The self-standing locator is moved from room to room or from area to area, and the hand-pointable laser range meter is then used to map each area. The laser range meter may have controls that designates such measured values as floor, wall, and ceiling to aid automated or manually directed means of assembling a map or CAD model or the structure by known means. Other building components such as electrical, fire sprinkler, light switch, furniture etc. provide an additional level of detail. These models typically consist of surfaces that can be connected edge to edge. IGES or STL are file structures that may be employed for this purpose.

These data may then be used to create CAD model of the structure that allows new construction plans to be readily incorporated therein.

The width of access points can be readily determined so it can be determined to certain sizes of machinery (a Bobcat excavator for example) can reach certain areas. Crane reach and access can be determined from such a model. The cubic feet of earth one needs to move (or remove) may be more accurately determined.

Example #3

Mapping Square Footage of a House for Resale Listing

Often the square footage of a house is not well known and may change due to new construction. Such measurements are often not accurate and may be biased from the seller's perspective. Either prior to listing or during a home inspection period prior to close of escrow it may be desirable to accurately verify the useable floor area of a structure. If an absolute map is not needed this can be done with a single beacon or even no reference beacon or by using the beacon in the laser range meter itself to determine the positional offset of the self-standing locator when it is moved from room to room.

Similar to the techniques described in example 2 above, the locator is moved and placed, perhaps on a stand (to reduce distorting magnetic coupling to any nearby objects) in the middle of each room. The hand-pointable, dipole tracked laser range meter is then used to map the room, perhaps only the floor area. Often floor areas are cluttered with furniture however so mapping the ceiling instead may be more desirable. Any ceiling tile is easily projected onto a floor surface that may be tagged with a single point or alternately partly traced where not occupied by furniture. Then the laser range meter may be placed at a point intermediate between the current locator location and the next point to which this it is going to be placed. A "move" action can be signaled by the operator or alternately accelerometers in the locator and or the range meter can be used to automate the move of the locator. During the move the range meter is assumed to be fixed and the locator is moving. This process is repeated until the floor area of the house is measured.

Example #4

Mapping for Carpet Installation within a Building

This activity is very similar to that described in example #3 above. However when laying carpet it is important to know maximum widths and shapes to be able to determine the width, length and numbers of rolls of carpet needed to complete the job. Software can be developed to provide an exact optimal description of how the carpet should be installed, largely automating job quoting and the design of each installation.

Example #5

Tree Trimming Mapping

All of the (not occluded by foliage) major branches of a tree can be traced from one or more positions beneath the tree. A trimming plan may be developed and presented to a landscape artist or a prospective customer. Models for developing a lighting plan for landscaping may be developed.

Example #6

Using a Large Number of Small Lower Powered Simple Dipole Beacons

A small "swarm" of dipole beacons may be used to map an area. If the locator is close to several beacons at the same time accuracy is improved and then either a beacon or the locator can be moved and the relative positions of the various system components (beacons and locators).

If the information recorded in each locator is time stamped than several locators can be used simultaneously to map an area.

Dipole beacons may all run at a single frequency and be phase coded by suspending an LC tank by some fractional cycle in a time coded manner.

Example #7

Horizontal Directional Drilling (HDD) Site Survey and Monitoring During the Drilling Operation An array of laser target reflectors is used to map the position of the self-standing locator as it is moved from point to point approximately along the propose and or actual drill path. The absolute position of the drill head is dipole tracked.

Figure 25A:
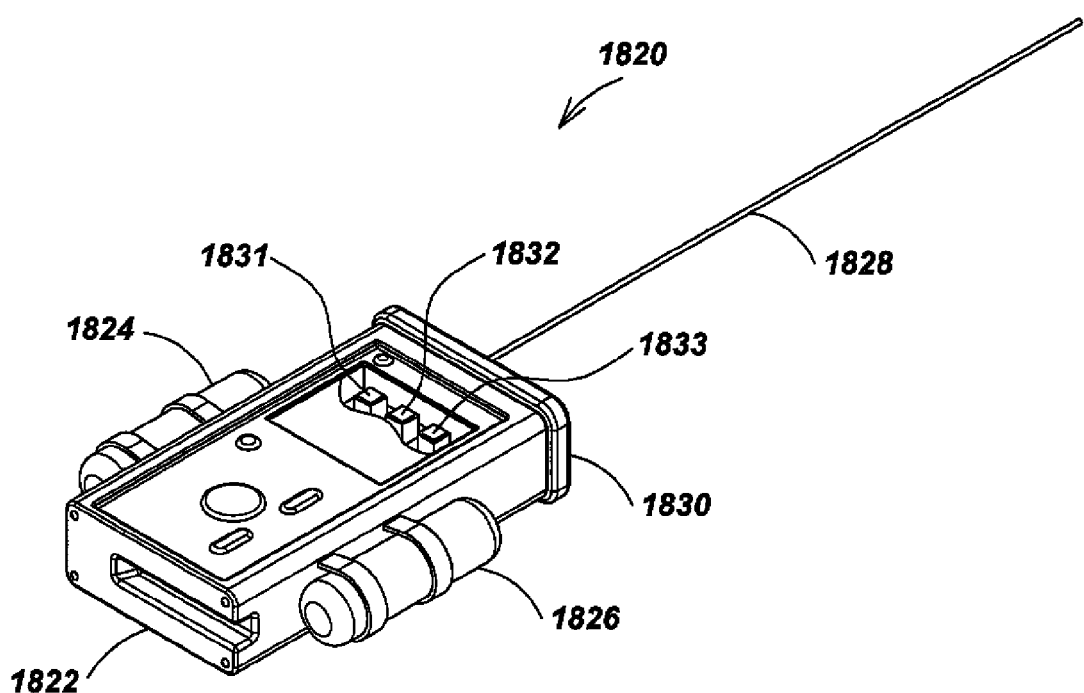
FIG. 25A is a perspective view of an exemplary hand-held laser range finding accessory embodiment.

Returning now to FIG. 25A a perspective view is shown of a man-portable laser range finding device 1820 showing a first dipole beacon 1824, a second dipole beacon 1826, a wireless communication means 1832, and the laser beam 1828. Also shown is a cutaway in FIG. 25A are an embedded compass 1831 and tilt sensor 1833. The particular locations of these components is exemplary only. As shown in FIG. 25A, the device may be operated independent of the locator, for laser-ranging by hand or from a fixed location separate from the locator 102. It may also be used while attached to the accessory mounting interface by lifting the locator until the range finder is level with the ground, for example, or attached to the upper shaft of a self-standing locator for taking bearing and range measurements.

The two distinguishable dipole coils 1824 and 1826, enable the locator 102 to fix the relative position of the laser range finder. Optionally, a third coil 1830, built into the laser range finder such that its field is coaxial with the laser beam itself, facilitates an orientation calculation in any mapping process including the laser range finder's information. If the signal from the coaxial-coil field is subjected to cycle-skipping techniques as described above, it serves to provide orientation information for the hand-held laser range finder itself. The side-coils and the co-axial coil can be attached in combination or separately to an embodiment of the laser range finder device, for example.

Figure 25B:
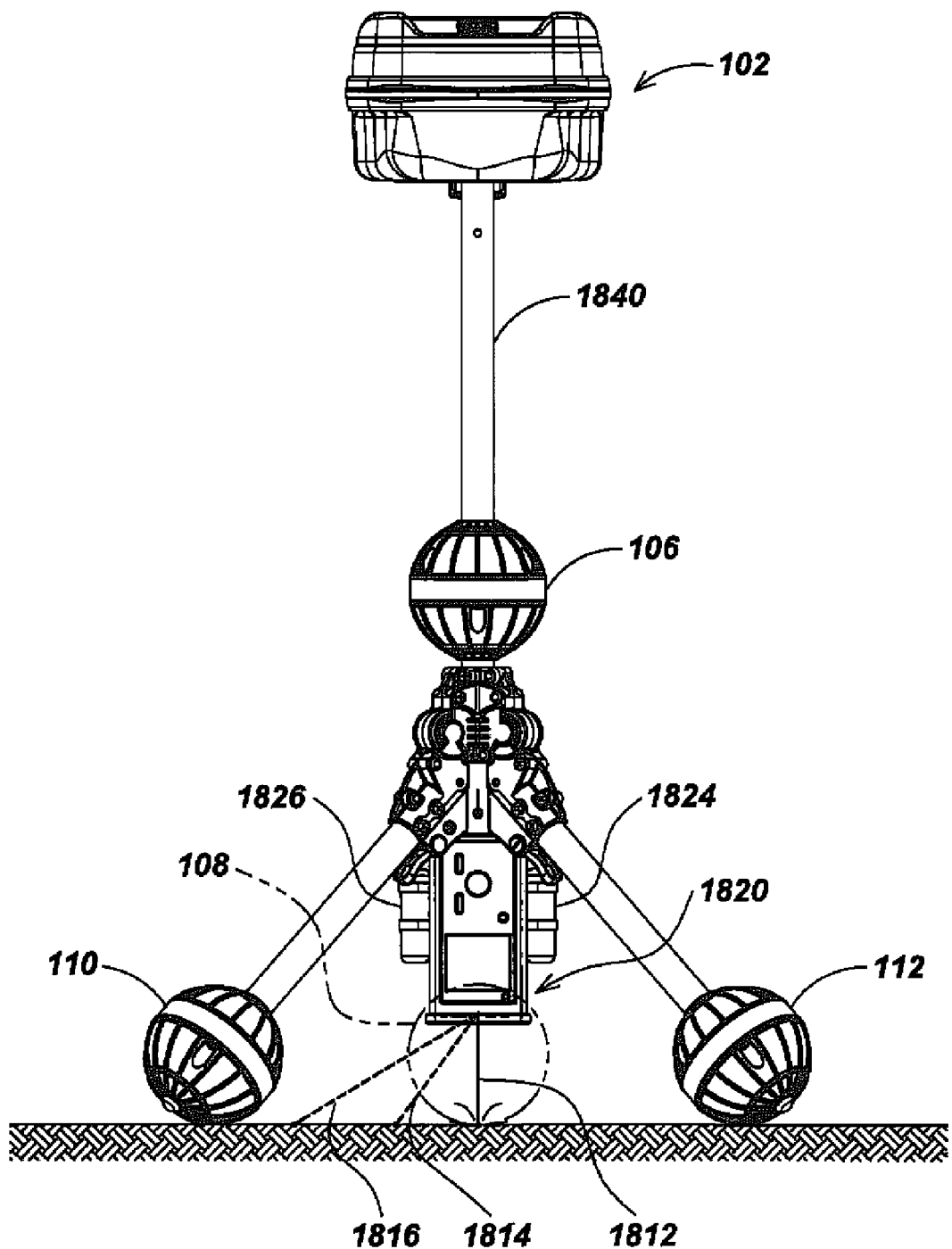
FIG. 25B is a side view of the locator of FIG. 3 in an open disposition for operation with the accessory mounting interface coupled to an exemplary hand-held laser range finder embodiment alternatively deployed as an attachment.

Turning now to FIG. 25B, a front view is given of the locator 102 from FIG. 3 in an open disposition for operation with the accessory mounting interface (104, not shown) coupled to an exemplary laser range finding accessory embodiment. In FIG. 25B the laser range finding device is attached to the locator by means of the accessory mounting interface. It may measure distance to ground directly beneath it, or scan to either side, as indicated by lines 1812, 1814, 1816, as examples. In FIG. 25B the antenna node 108 behind the laser range finder attachment is shown ghosted (in dashed lines) for clarity of illustration. Two dipole beacon units 1824, 1826 can be seen attached to either side of the man-portable laser range finder 1820.

A wireless communication link, such as Bluetooth, 802.11 or Zigbee for example, or a coil-cord extension cable may similarly be built into the range finder attachment enabling it to exchange data with the locator 102 or any other similarly equipped peripheral of the system. In a hand-held laser device so configured, such as with two pill sondes surrounding a laser pointer, linked via Bluetooth, for example, to the locator, three-dimensional mapping of any environment may be done merely by pointing and activating a logger for points of interest, including, for example, curbs, manhole covers, hydrants, lampposts and similar artifacts, survey medallions, past or present paint marks on pavement, enabling the locator to map with precision where each target point is in three-dimensional space. A GPS unit may be incorporated into such a laser-pointing device to augment its objective location information. A Zigbee interface, for example, enables the device to permit voice-logging of information for targeted points in the mapped environment. Reference points during a line trace operation may similarly be logged. Note that with two sondes of different frequencies (or otherwise distinguishable by the locator) being detected by the mapping locator, the relative location and orientation of the laser pointer is constantly known to the locator. This assumes that the range finder is not held in an inverted position. An integrated AMI-601 chip (as discussed with the accessory mounting interface disclosure) in the laser range finder would equip it as well to provide compass and accelerometer information in the locating process.

Figure 25C:
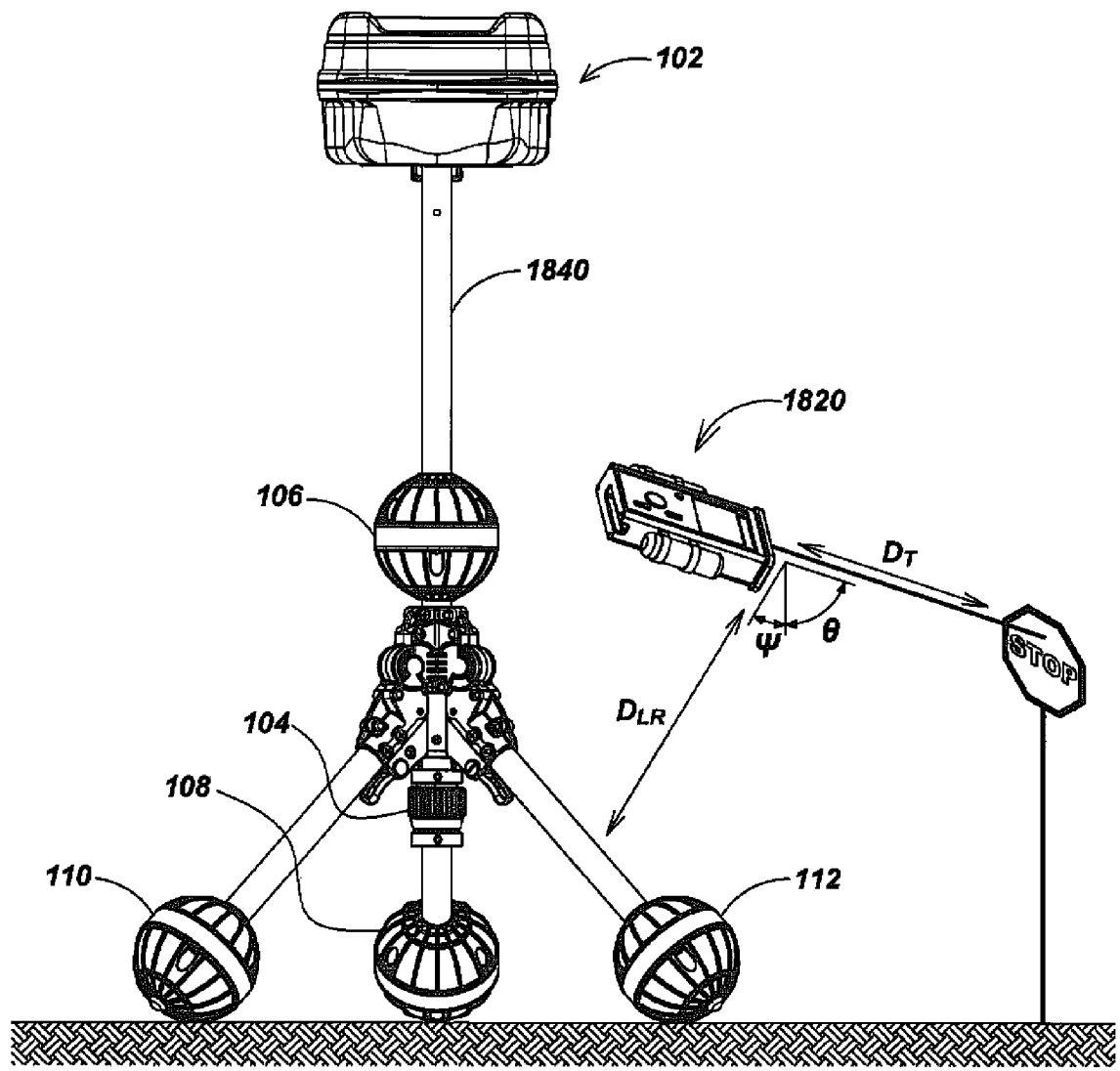
FIG. 25C is an overview of an exemplary application of the hand-held laser range finder for an example including the locator of FIG. 3 and a target such as a traffic sign.

Turning now to FIG. 25C a scenario is depicted in which a target for mapping purposes is selected, in this case a traffic sign, and the laser range finder is employed as a hand-held device to determine a range to the target. Communication with the locator 102 is maintained by wireless link, and the relative location of the hand-held laser range finder is monitored by the locator 104, which senses and measures the field strength of the dipole beacons attached to the range finder. In an alternative configuration the laser range finder may be mounted by a clip to the shaft 1840 of the locator for ranging on targets with the locator in a fixed location, for example. As discussed earlier, the locator maintains information concerning the relative position of the laser range finder, which in turn detects the relative position of the target. Given relative distances $D_T$ and $D_{LR}$, and the angles indicated as $\theta$ and $\psi$, the precise location of the target traffic sign can be computed.

Figure 25D:
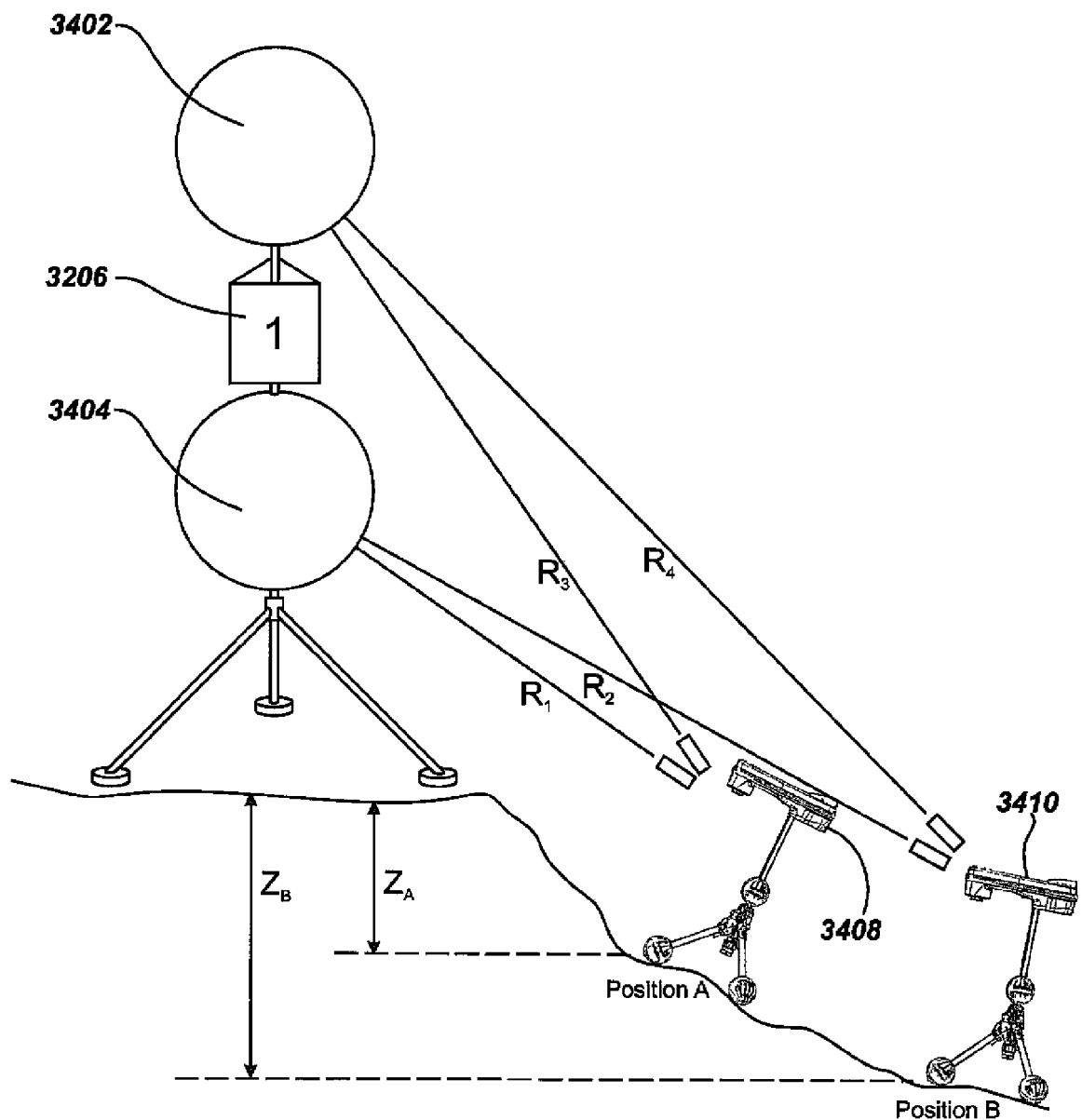
FIG. 25D illustrates an alternative laser target embodiment employed in an example using the locator and hand-held laser range finder to measure terrain dimensions.
Figure 25E:
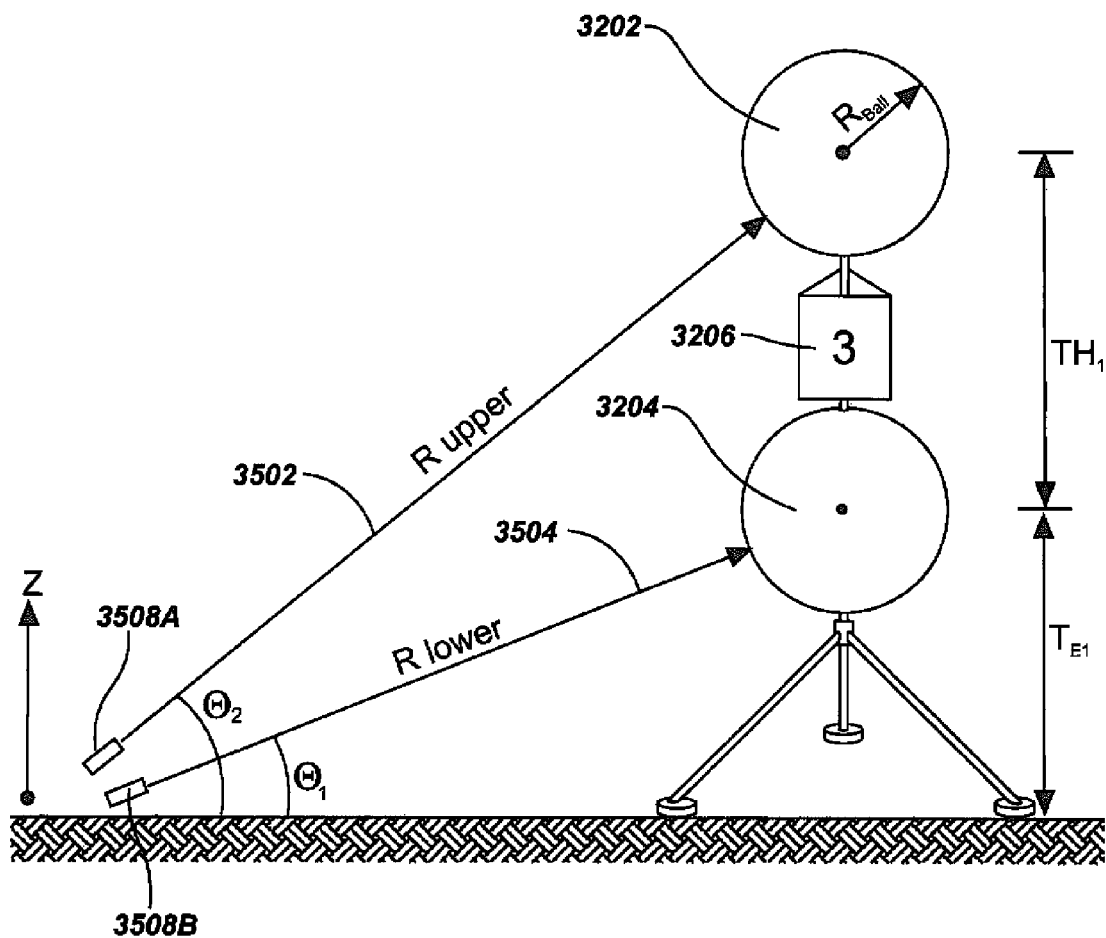
FIG. 25E is a graphical illustration of a method using two vertically disposed ball-type laser targets to resolve height measurement. using the hand-held laser range finder in FIG. 25A.
Figure 25F:
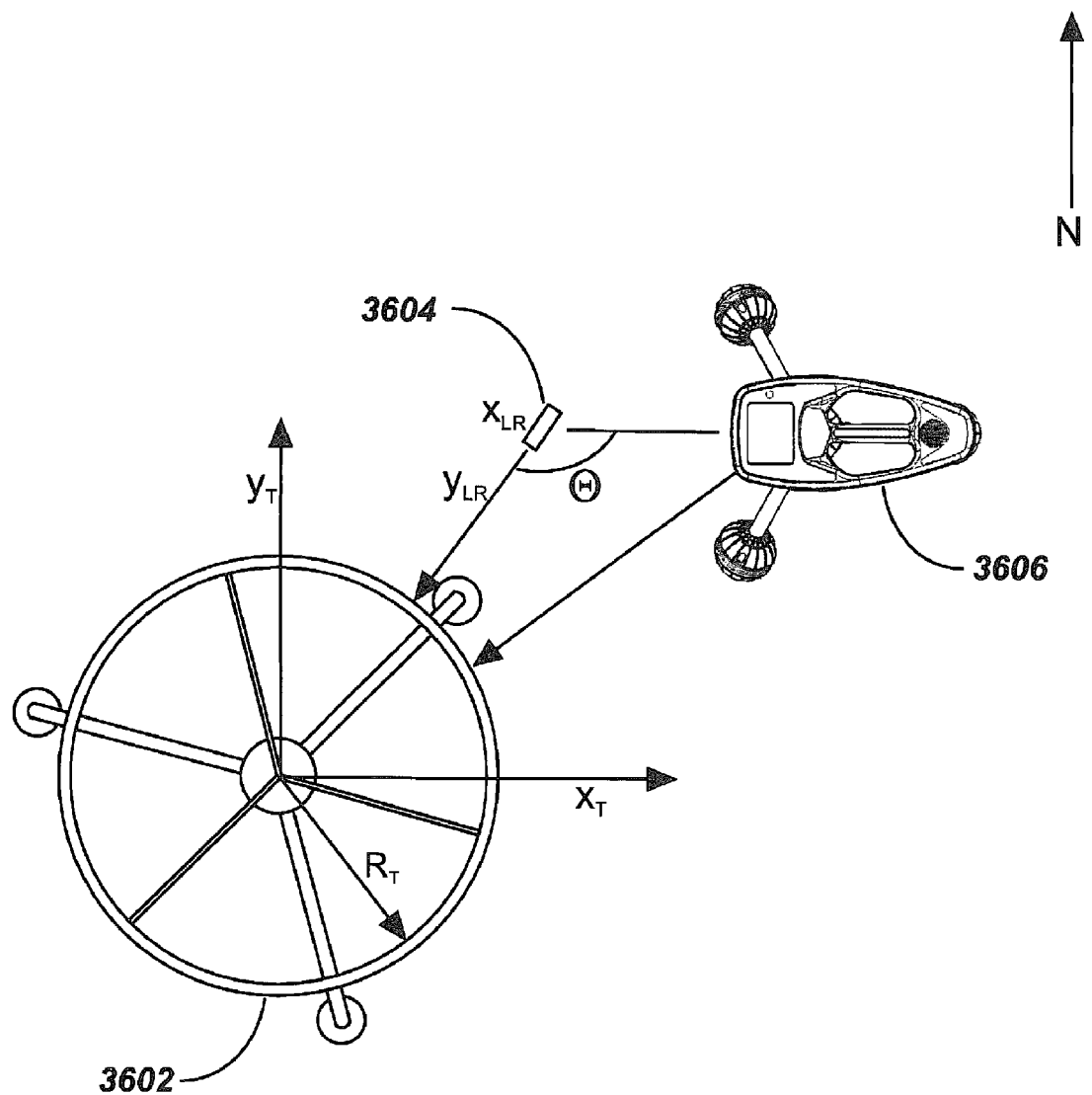
FIG. 25F is a graphical bird's eye view of a method to resolve the location of a locator in terms of a laser targets coordinate system using the locator in FIG. 25B and a laser target.
Figure 25G:
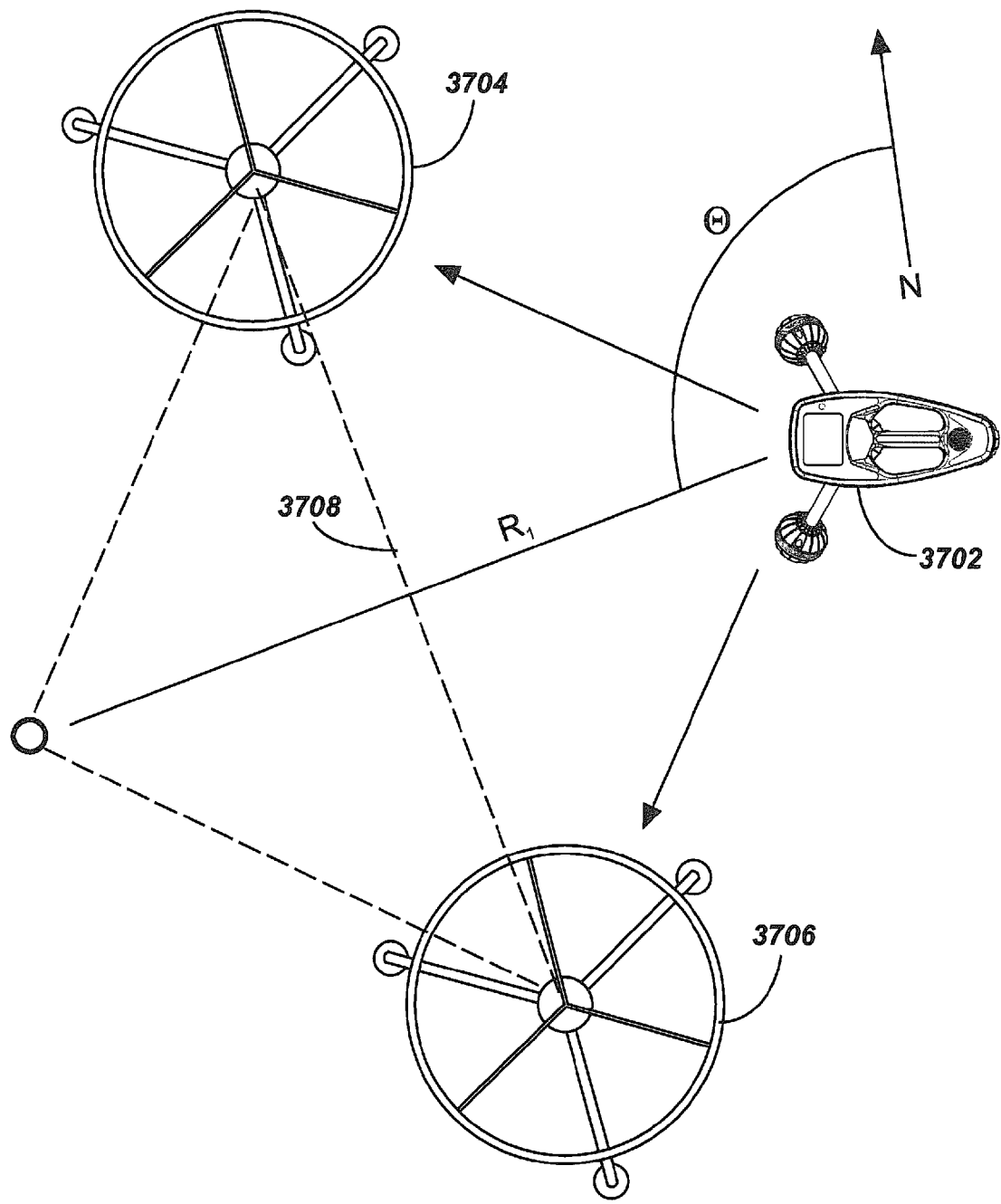
FIG. 25G is a graphical illustration of a method to use two laser targets and data from an optional embedded compass to resolve ambiguity in measuring position relative to a baseline.
Figure 25H:
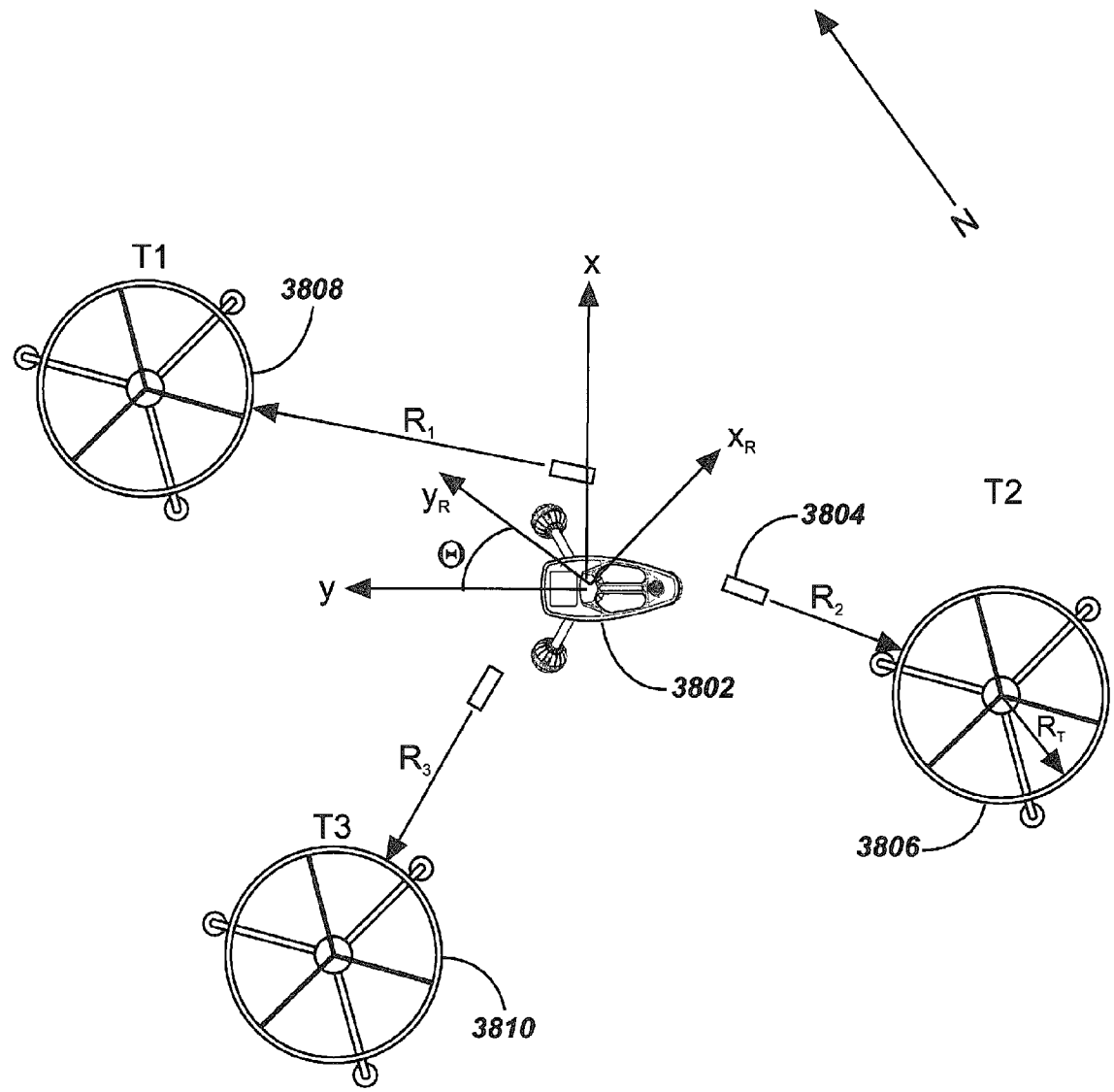
FIG. 25H is a graphical illustration of a method employing the laser range device in FIG. 18B and ranging on three laser targets to determine the position of the locator in a global coordinate system.
Figure 25I:
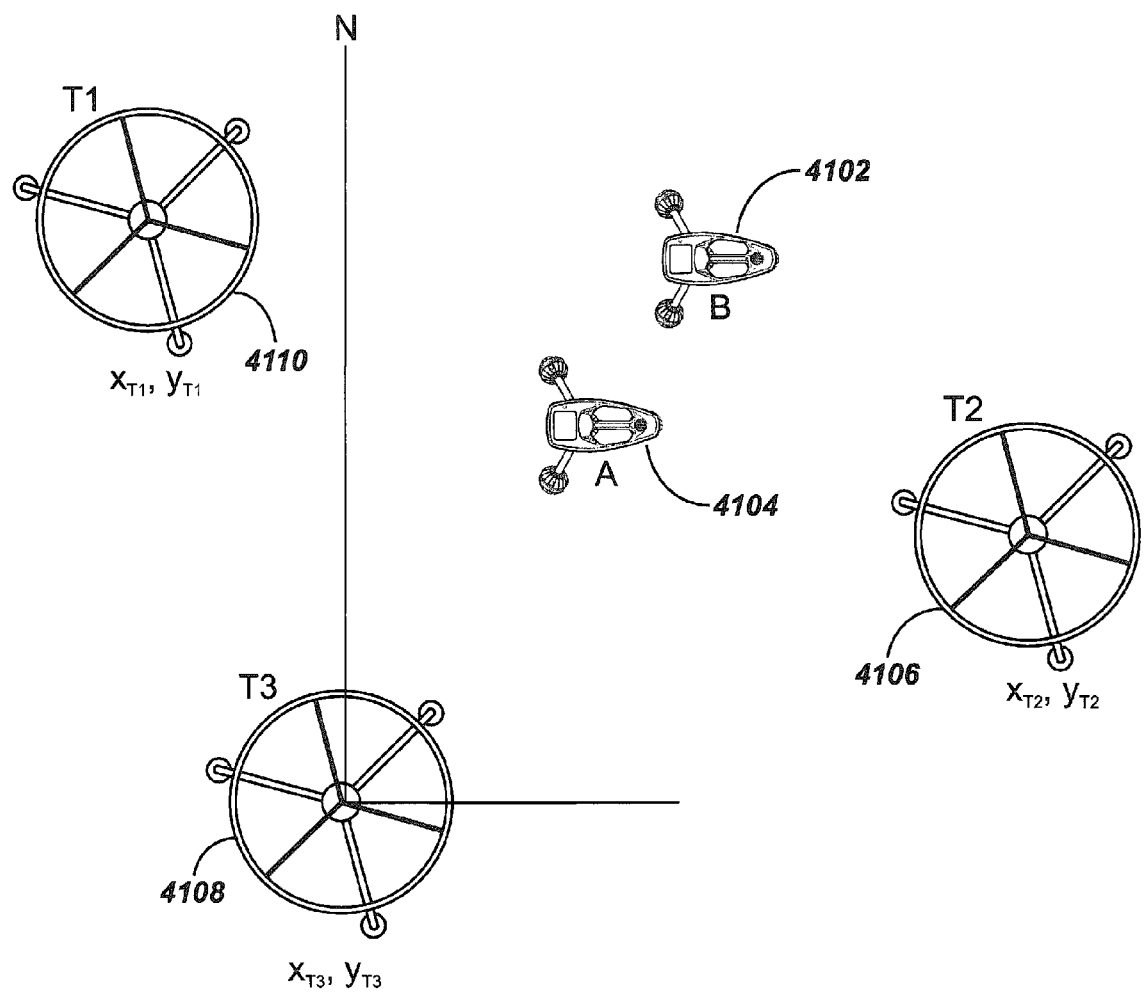
FIG. 25I is a graphical illustration of a method using three laser targets and two locators of the type shown in FIG. 25B to determine the relative locations of the three targets.
Figure 25J:
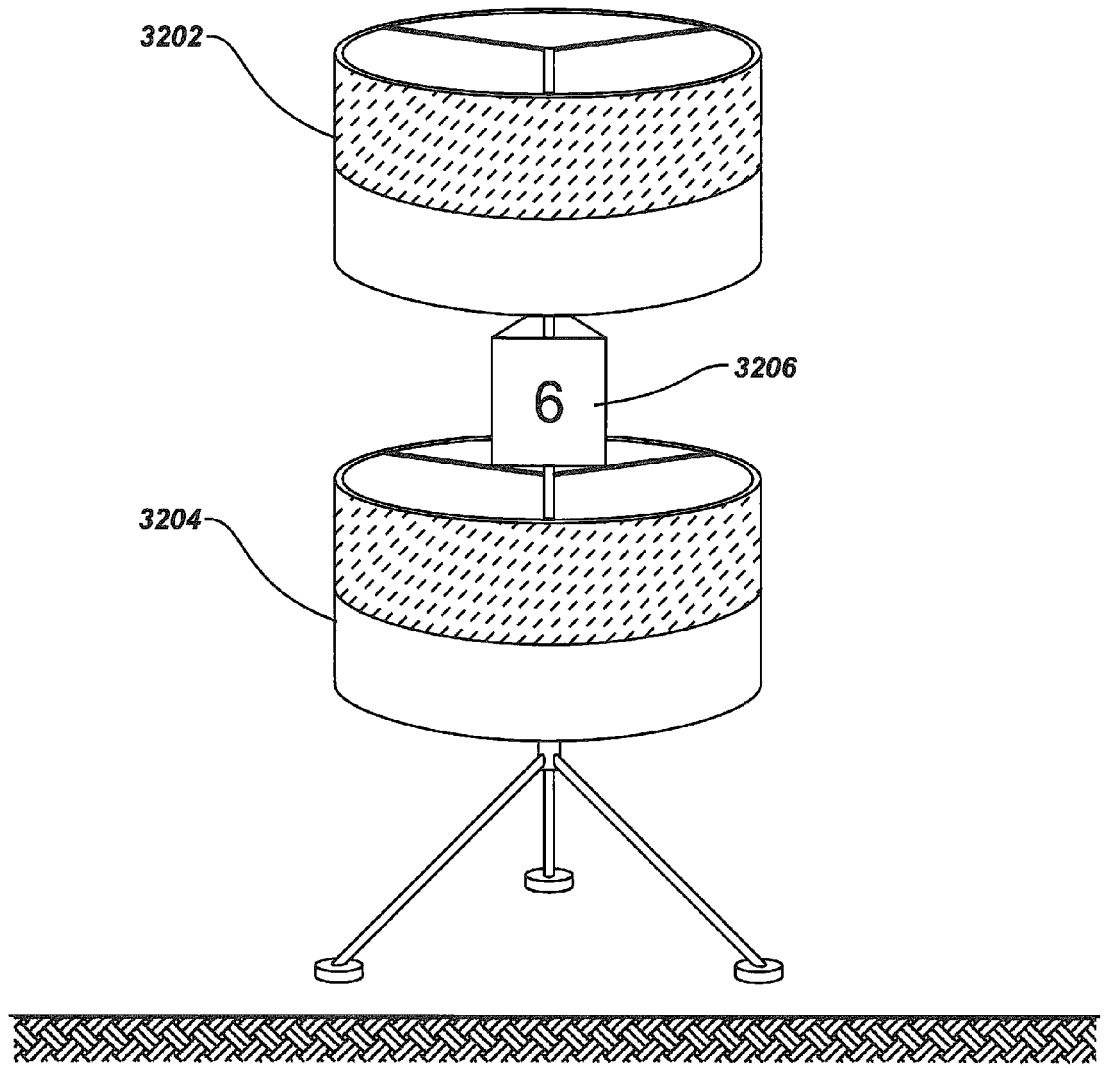
FIG. 25J is an exemplary illustration of a laser target for use in conjunction with the locator in FIG. 25B.
Figure 25K:
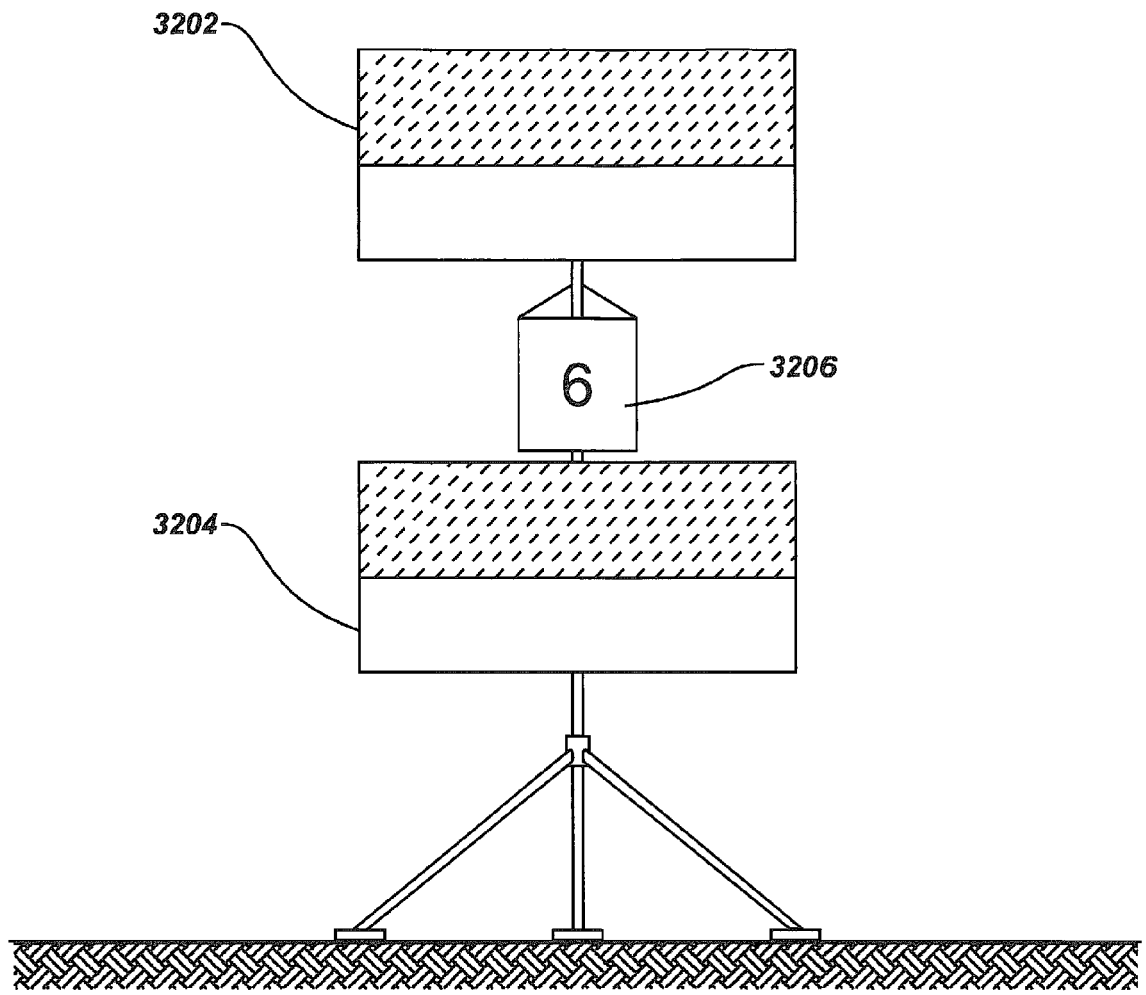
FIG. 25K is an illustration of a side view for the laser target shown in FIG. 25J.

In a further adaptation of this accessory, attention is now directed to FIGS. 25J and 25K, each of which depicts a moveable target for use in laser range finding. The basic configuration of the target consists of an upper target 3202, a visual identification number in large lettering 3206, an optional lower target 3204, and a stand, here shown as an adjustable tripod. As shown in FIG. 25K, one configuration of the target may be in the illustrated "lamp shade" form in which the targets are one or more cylindrical sections disposed vertically. In the lamp shade form, a section of each cylinder has a reflective surface, such as may be provided by red Scotchlite tape or some equivalent surfacing. The other portion of each cylinder is surfaced in some reflective white surface more suited for close-range laser ranging. In an alternative embodiment, the target segments may be reflective spheres, here referred to as the "beach ball" form. When more than one cylinder or ball is used, the distance between the segments is a known measured distance. It should be emphasized that only one reflective cylinder or ball is required, but that with two targets of a known separation, improved accuracy in determining relative height can be achieved. In practice, the device being used, such as the locator or range finder, needs to be informed of which target is being selected. This can be achieved through a key pad on the range finder, through a microphone with voice I/O, or through incorporating a dipole beacon or other embedded identifier into the target that may be recognized by the locator used in conjunction with the range finder. In use, the beam from the range finder is swept across the target and the minimum distance value to the target is recorded. If a single reflective cylinder or sphere configuration is used, a compensation for any tilt in the laser range finder should also be incorporated in the calculation of distance. This may be achieved, for example, by comparing the location characteristics of the two dipole beacons attached to the range finder, by the use of an embedded tilt-meter or multi-axis accelerometer, or by other means.

An example of the "beach ball" form of reflective target is shown in FIG. 25D, to which attention is now directed. In FIG. 25D a "beach ball" target consisting of two reflective spheres, 3402 and 3404, vertically disposed, with a visual identification marker 3206, are deployed. Further in FIG. 25D, two laser range measurements $R_1$ and $R_2$ are shown in one exemplary application as being taken from the location of a locator 3408 (Position A). Two more readings by laser range finder from FIG. 25A measuring $R_3$ and $R_4$ are shown being taken in connection with a locator 3410 at Position B. The locators may be separate devices or the same locator may be moved from A to B for readings. The range finder may be wired, hard-coupled, or linked by wireless to the locator. Multiple range finders may be used, or a single device may be moved for a series of readings. As shown in FIG. 25D, from the measurements provided by the range finder readings, the relative vertical measurements $Z_A$ and $Z_B$, corresponding to the two down-slope locations A and B, may be calculated. When a pair of vertically disposed or stacked targets is used, the accuracy of the vertical component of measurement increases as the known distance between the two targets. This known distance provides the basis for independently measuring or calculating the relative height of the laser, reducing any variability caused by tilt in the range finder. The locator 3408, 3410 used in conjunction with the range finder, or other computational device used, must know which measurement is associated with the upper target 3402, and which with the lower target 3404.

Turning now to FIG. 25E, another application of the laser range finder is shown. In FIG. 25E, a "beach ball" target form is shown and a laser range finder from FIG. 25A is shown in two instantiations, 3508A and 3508B measuring polar angles $\theta_1$ and $\theta_2$ for the elevation of the two balls 3202, 3204, and distances 3502 and 3504. From the measurement of angle $\theta_1$ and $\theta_2$ and ranges 3502 ($R_{upper}$) and 3504 ($R_{lower}$) it is possible to calculate the elevation $T_{E1}$, given a known distance between the two balls $T_{H1}$.

Attention now being directed to FIG. 25F, an extension of the foregoing principles can be shown, illustrated in a view from above, of a locator 3606 that is determining a bearing on a target 3602. The target in this instance may be equipped with a dipole beacon built into it enabling the locator 3606 to measure its distance and bearing by means of its omnidirectional antennas. At the same time a man-portable laser range finder 3604 as shown in FIG. 25A, may take a bearing on the same target 3602 from a distance from the locator and communicate its measurements by a wireless data link, including data from an embedded compass and tilt sensor in this embodiment. By correlating the data from the laser range finder 3604 with its own measurements, the locator may translate its local coordinate measurements into the target's real-world coordinate system ($X_t, Y_t$) and report its own location and that of the target 3602. The radius of the target R(t) is known and is taken into account in position calculation. If the coordinates ($X_{LR}, Y_{LR}$) and orientation ($\Theta$) of the range finder relative to the locator is established by use of a dipole beacon in the range finder, then a single compass in either the locator or the range finder provides enough information to translate to a real-world coordinate system. Alternatively, both devices can include a compass. The use of at least one compass facilitates coordinate solutions over distances too great for locator detection of the dipole beacons.

Turning now to FIG. 25G, a similar application is illustrated in resolving baseline ambiguity between two targets, here illustrated as 3704 and 3706. Because locator 3702 is equipped with an electronic compass it can determine angle $\Theta$ by comparing the compass bearing information with bearing information based on the dipole antenna location of the beacon in Target 3704 and Target 3706. In this scenario both targets are equipped with a dipole beacon, and the laser range finder is coupled to the locator 3702 through the accessory mounting interface, or alternatively mounted on the shaft of the locator. The combination of local coordinates and compass bearing information enables locator 3702 to calculate real-world bearing and distance values for the baseline between the targets. In an alternative embodiment, one or both targets may be equipped with a GPS receiver as well as a dipole beacon, allowing complete real-world coordinates to be determined for both targets and locator. In using dipole beacons, the local signal strength of each dipole beacon can be measured at its source and transmitted over a wireless link to the locator for comparison. Either the comparison of dipole beacon signal strength readings, or the laser ranging data, or both, can be used in determining distances to targets.

As shown in FIG. 25G, the use of compass data in conjunction with distance information can resolve, by triangulation using the compass angle $\Theta$, the ambiguity as to which side of the baseline the locator is on at the time of measurement. Such a system is also useful with a single-node antenna locator. If a multi-node antenna locator is used, the signal differences between the antenna nodes can be used in a similar way to resolve the ambiguity. In the absence of compass azimuthal data associated with range measurements made, the system must know the distances between the targets (i.e., the length of the baseline). This distance can be measured directly, or may be extrapolated in post-processing given sufficient data.

Similarly, turning now to FIG. 25H, a locator 3802 can determine local coordinates by use of the laser range finder determining range and bearing to three targets ($T_1, T_2$, and $T_3$) 3808, 3806, and 3810, thus defining three corresponding radii ($R_1, R_2$, and $R_3$). By rotating these values based on compass and tilt corrections provided by the on-board compass and accelerometer, the locator 3802 is able to determine local global coordinates and translated radii $X_r, Y_r$, relative to compass North. Provided with three ranges to three targets, the ambiguity of the baseline can be resolved—that is, the location of the locator relative to the targets can be determined unambiguously. The radius of the target structure R(t) is known and is taken into account in position calculation. In this scenario, each target can also contain a low- to medium-powered dipole beacon or sonde, which should enable the distance from any target to the other two to be known by comparison of signal strengths at the locator.

Figure 25L:
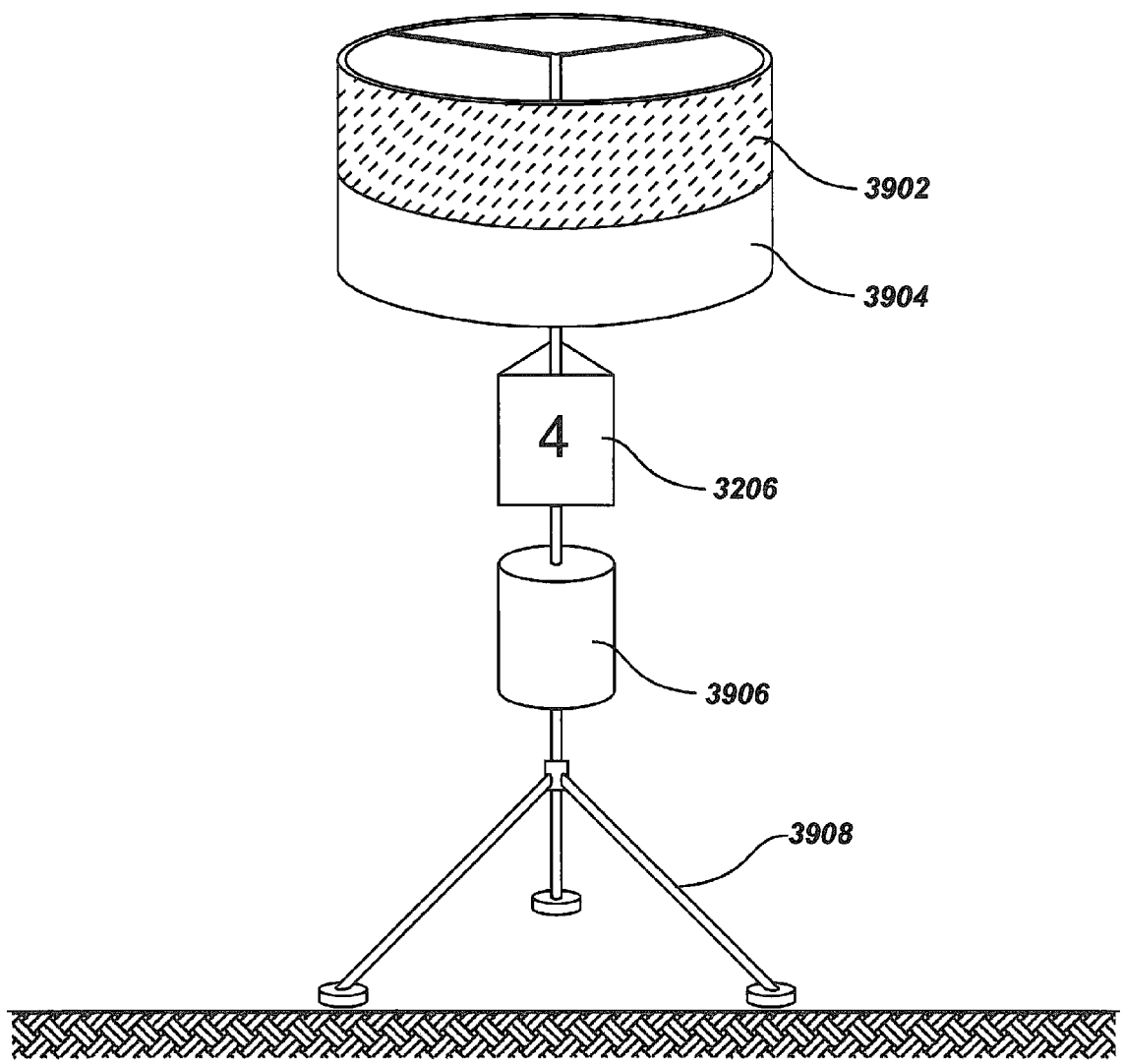
FIG. 25L shows an alternative embodiment of a "lampshade" type laser target device equipped with an optional GPS device and an optional dipole beacon for use with a locator such as that shown in FIG. 25B.

FIG. 25I is a graphical illustration of a method using three laser targets such as shown in FIG. 25L below, and two locators of the type shown in FIG. 25B to determine the relative locations of three targets. One locator, alternatively, can acquire the data serially from two locations. In FIG. 25I, three targets 4110, 4106, and 4108 ($T_1$, $T_2$, and $T_3$) are shown with a locator at two locations (A, B) 4104 and 4102. Ranging information may be taken at location A using the laser range finder attachment measuring to each target. Moving the locator to Location B, a second set of range values to each target may be determined. By comparing these range sets to the compass bearing, the locator is able to calculate $X_{T1}$, $Y_{T1}$, $X_{T2}$, $Y_{T2}$, $X_{T3}$ and $Y_{T3}$ in local world coordinates relative to A and B. Given a GPS reading from one or more targets, the complete real-world coordinates may be established. If compass information is included, only one target needs to be visible from any one location.

FIG. 25L illustrates an alternative embodiment of the "lamp shade" laser target equipped with a dipole beacon 3906 in which the red reflective segment 3902 and the white reflective segment 3904 of a single cylindrical "lampshade" target are identified. A "beach ball" type reflector can be used equally well.

Figure 25M:
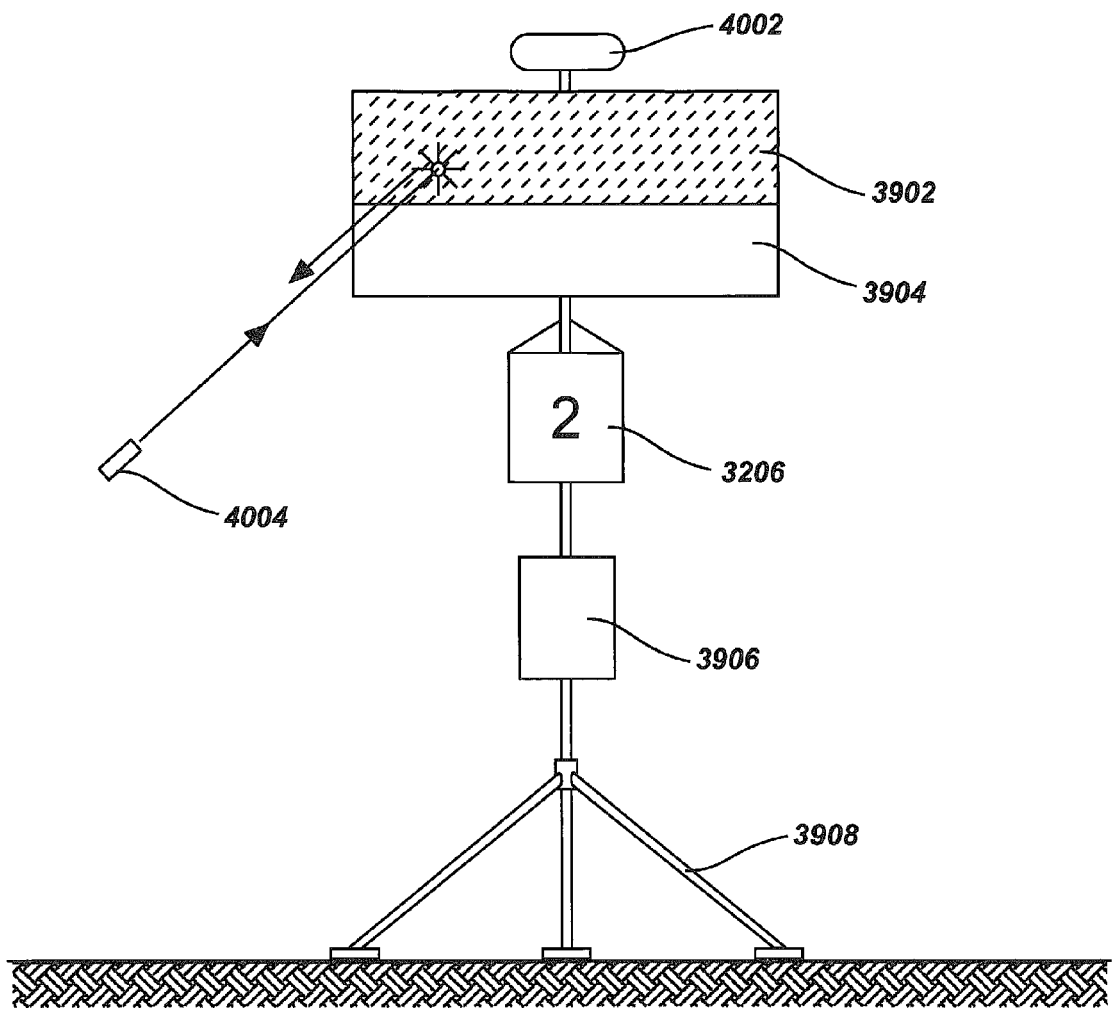
FIG. 25M is a graphical illustration showing the relationship in use of the laser target in FIG. 25L and the laser ranging device.

FIG. 25M illustrates an alternative embodiment of the same device, in which part of the target area is surfaced with a red reflective surface 3902 such as Scotchlite, while the remainder 3904 is surfaced with a reflective white surface for closer-range work. In FIG. 25M, a Target ID 3206 consists of a large-print number, readable from a distance, is mounted below the actual target area on a vertical shaft that optionally may be of a telescoping design. The shaft supports as well a shell 4002 that contains an optional GPS sensor and antenna, an optional dipole beacon, or both. Alternatively the dipole beacon may be separately placed such as 3906. The shaft is mounted on a tripod formation 3908, which is hinged so that it may be collapsed for portability. In use, the laser beam from a laser range finder 4004 is reflected from a portion of the target and the nearest distance to the target is computed.

The identification of a specific target can be automated by equipping each target with an optical sensing means such that when the laser beam hits some predetermined part of the target the laser beam is sensed and a "hit" signal is sent by the wireless means to either locator 3606 or laser range finder 3604 (FIG. 25F) so that a specific target can be identified as the one the laser is pointing at. Any portion of the target can be made with an optically translucent and diffuse material and a modulation of the laser beam may be easily detected by known means by a light sensor mounted therein.

The Integrated Layer Display Device

Figure 26:
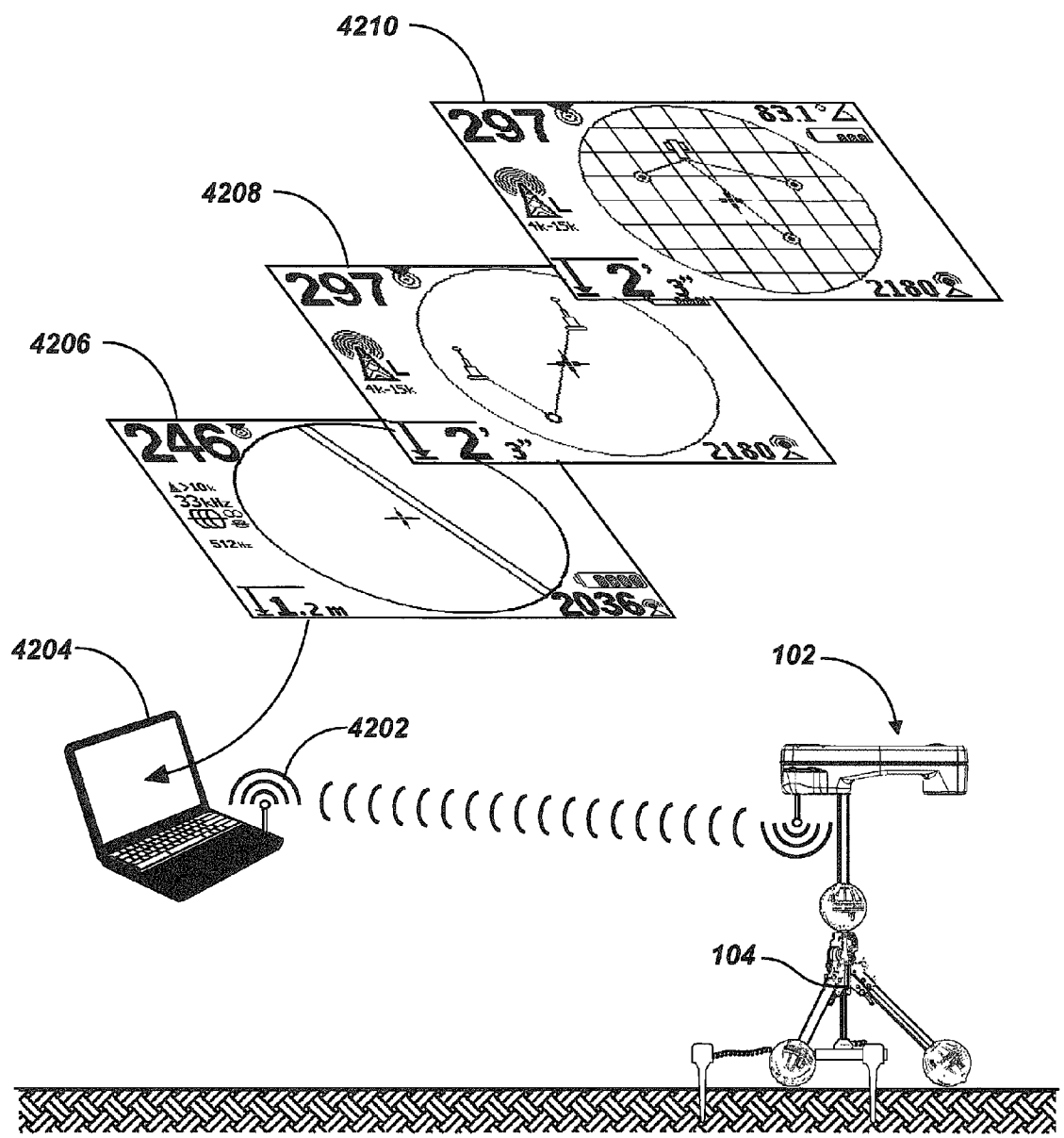
FIG. 26 is a graphic illustration of one embodiment of a separate display device portraying detection information in user-selectable layers as described above.

FIG. 26 is a graphic illustration of one embodiment of the remote display device in which geo-coordinated information from different devices may be assembled into layers for the enhancement of operator information, later analysis or other requirements of operation. By way of example, in FIG. 26, the display device is a laptop computer 4204 coupled by wireless data link to locator 102. Data from one or more locators and peripherals is integrated on the display 4204. The display in FIG. 26, as an example, is integrating a layer 4208 of sonic detections from the Leak Detection attachment, a layer 4210 of laser ranging information, and a layer 4206 of EMF field detection information based on the omnidirectional antenna sensors. The layers are geo-coordinated based on real-world coordinates that are calculated or directly measured from GPS capabilities built in to the several attachments. The display device may be coupled to the locator by wireless link 4202 or by a wired connector. Layers may be selectively displayed or hidden by the operator, and may be transmitted by the display device to an office computer for further analysis and synchronization with other maps or GIS databases.

FIG. 27 is a schematic block diagram illustrating the relationships between the functional electronic elements of the locator system 102 (FIGS. 1-3). Portions of the following description may be better appreciated with reference to the commonly-assigned patent references cited above and fully incorporated herein. A plurality of EM sensor arrays 2704 provide analog signals 2706 to the analog-to-digital converters 2708, which produce digital signals 2710 representing the B-fields at sensors 2704. A signal processor 2712 accepts B-field signals 2710 and produces a filtered B-field gradient signal 2714 representing a specific B-field component of interest at sensors 2704. In the example shown, B-field filtered signal 2714 is transferred through memory 2716 to the locator processor 2718 for use in developing signals representing target locations that may be combined with other signals internally by locator processor 2718 to produce and transfer target location signals on the bus 2720 to the user interface (UI) processor 2722, which generates the appropriate visual and aural user interface signals for display on the GUI 2724 and for reproduction at the audio user interface 2726. An optional keyboard 2728 is disposed to accept commands from the user for transfer to locator processor 2718 by way of user interface processor 2722 in the example shown. Alternatively, keyboard 2728 may be embodied as a touch-sensitive screen overlying GUI 2724, for example. Finally, a wireless port 2729 is coupled to the user interface processor to permit the locator system 102 to exchange commands and data with any other similarly equipped locator system or any remote host computer equipped to communicate through the wireless port 2729. Alternatively, wireless port 2729 may be embodied as any other useful network or data port adapted for such purposes. As used herein, the term "processor" can refer to a hardware device or simply a software component.

An important feature of the locator system embodiment 102 is the additional capability for integrating and processing signals from any of a predetermined group of accessory sensor systems by means of the accessory mounting interface 2730. The selected accessory 2732 is coupled to accessory mounting interface 2730 by means of a temporary electromechanical coupler 2734 having a mechanical accessory mounting interface coupler and an electrical accessory mounting interface connector adapted to transfer electronic signals and electrical power on the bus 2736 between accessory system 2732 and, in the example shown, an accessory signal processor 2738. Accessory processor 2738 includes a plurality of program elements, exemplified by the GPR program element 2740, adapted to control and process data from a particular one of the predetermined accessory sensor system group, exemplified by the GPR sensor system described above. Alternatively, some or all of the GPR program element 2740 may cooperate with (over the data bus 2742) or be embodied as a program element 2744 within the locator processor 2718, for example. Finally, in addition to the accessory sensor systems adapted for temporary coupling at accessory mounting interface 2730, the inertial and GPS sensing circuit 2746 is preferably fixed within one of the EM sensor arrays (e.g., sensor array 106 in FIGS. 1-3). In the example shown, on the data bus 2748 to locator processor 2718, sensing circuit 2746 provides an electronic signal corresponding to the horizontal orientation of the locator system from a compass circuit (C), an electronic signal corresponding to the vertical orientation of the locator system from a tilt-meter circuit (T), an electronic signal corresponding to changes in the locator system orientation from an accelerometer circuit (A); and an electronic signal corresponding to the GPS coordinates from a Global Positioning System (GPS) receiver circuit (G). Of course, these four signals on bus 2748 may be provided by any useful arrangement of discrete elements or other combinations of elements, and one or more signals may be omitted for convenience.

Clearly, other embodiments and modifications of this invention may occur readily to those of ordinary skill in the art in view of these teachings. Therefore, this invention is to be limited only by the following claims, which include all such embodiments and modifications when viewed in conjunction with the above specification and accompanying drawings.

I claim:

1. A human-portable locator system for locating a buried object characterized by an electromagnetic (EM) field emission having a frequency range centered at $f_0$ that also includes a jamming frequency $f_J$ wherein $|f_J-f_0|=\Delta f \neq 0$, the system comprising:

an EM sensor array;

a gradient processing circuit coupled to the EM sensor array for producing a target signal representing the B-field gradient at the EM sensor array as a function of time within a frequency range centered at $f_0$; and means for shifting the frequency passband of the gradient processing circuit away from jamming frequency $f_J$ by an increment $f_S < \Delta f$, thereby increasing the ratio of the target signal to the jamming signal.

2. The system of claim 1 further comprising:

a locator processor coupled to the gradient processing circuit for producing signals representing target locations responsive to signals accepted from the gradient processing circuit.

3. The system of claim 1 further comprising:

a user interface coupled to the locator processor for accepting user commands and for indicating the buried object location relative to the locator system.

4. The system of claim 1 further comprising:

an accessory mounting interface coupled to the locator processor and disposed to accept temporary attachment of an accessory sensor system.

* * * * *